(12) United States Patent
Kimura et al.

(10) Patent No.: US 7,196,368 B2
(45) Date of Patent: Mar. 27, 2007

(54) SEMICONDUCTOR MEMORY ARRANGEMENTS WITH CROWN SHAPED CAPACITOR ARRANGEMENTS TRENCHED IN INTERLAYER DIELECTRIC FILM

(75) Inventors: Shinichiro Kimura, Kunitachi (JP); Toshiaki Yamanaka, Iruma (JP); Kiyoo Itoh, Higashi-Kurume (JP); Takeshi Sakata, Kodaira (JP); Tomonori Sekiguchi, Kokubunji (JP); Hideyuki Matsuoka, Hoya (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/914,223

(22) Filed: Aug. 10, 2004

(65) Prior Publication Data

US 2005/0045933 A1  Mar. 3, 2005

Related U.S. Application Data

(63) Continuation of application No. 10/206,215, filed on Jul. 29, 2002, now Pat. No. 6,798,005, which is a continuation of application No. 09/077,100, filed on May 20, 1998, now Pat. No. 6,617,205.

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/296; 257/301; 257/306; 257/E27.084

(58) Field of Classification Search ........ 257/296–309, 257/E27.084–E27.097, 68–71, 905–908
See application file for complete search history.

(56) References Cited

U.S. PATENT DOCUMENTS

| 4,665,608 | A | 5/1987 | Okamoto et al. |
| 5,218,219 | A | 6/1993 | Ajika et al. |
| 5,278,091 | A | 1/1994 | Fazan et al. |
| 5,279,983 | A | 1/1994 | Ahn |
| 5,426,399 | A | 6/1995 | Matsubayashi et al. |
| 5,578,847 | A | 11/1996 | Aoki et al. |

(Continued)

FOREIGN PATENT DOCUMENTS

EP  0862203  9/1998

(Continued)

*Primary Examiner*—Monica Lewis
(74) *Attorney, Agent, or Firm*—Antonelli, Terry, Stout and Kraus, LLP.

(57) ABSTRACT

A capacitor consisting of a storage electrode (19), a capacitor dielectric film (20) and a plate electrode (21) is formed in a trench formed through dielectric films (6, 8, 10 and 12) stacked on a semiconductor substrate (1) and buried wiring layers (9 and 11) are formed under the capacitor. As the capacitor is formed not in the semiconductor substrate but over it, there is room in area in which the capacitor can be formed and the difficultly of forming wiring is reduced by using the wiring layers (9 and 11) for a global word line and a selector line. As the upper face of an dielectric film (32) which is in contact with the lower face of wiring (34) in a peripheral circuit area is extended into a memory cell area and is in contact with the side of the capacitor (33), step height between the peripheral circuit area and the memory cell area is remarkably reduced.

11 Claims, 46 Drawing Sheets

U.S. PATENT DOCUMENTS

| | | |
|---|---|---|
| 5,623,164 A | 4/1997 | Auer et al. |
| 5,629,539 A | 5/1997 | Aoki et al. |
| 5,714,779 A | 2/1998 | Auer et al. |
| 5,804,479 A | 9/1998 | Aoki et al. |
| 5,834,357 A | 11/1998 | Kang |
| 5,895,239 A | 4/1999 | Jeng et al. |
| 5,939,789 A | 8/1999 | Kawai et al. |
| 5,952,688 A | 9/1999 | Madan |
| 5,981,369 A | 11/1999 | Yoshida et al. |
| 6,051,466 A | 4/2000 | Iwasa |
| 6,130,449 A | 10/2000 | Matsuoka et al. |
| 6,798,005 B2 * | 9/2004 | Kimura et al. ............. 257/296 |
| 2002/0192901 A1 | 12/2002 | Kimura et al. |

FOREIGN PATENT DOCUMENTS

| | | |
|---|---|---|
| JP | 55-178894 | 6/1979 |
| JP | 56-58253 | 5/1981 |
| JP | 56-58254 | 5/1981 |
| JP | 56-58255 | 5/1981 |
| JP | 57-112066 | 7/1982 |
| JP | 59-82761 | 5/1984 |
| JP | 57-192478 | 10/1984 |
| JP | 59-231351 | 12/1984 |
| JP | 59-231851 | 12/1984 |
| JP | 62-128168 | 6/1987 |
| JP | 62-213273 | 9/1987 |
| JP | 63-293967 | 11/1988 |
| JP | 1-137666 | 5/1989 |
| JP | 1-179449 | 7/1989 |
| JP | 3-167874 | 7/1991 |
| JP | 3-214670 | 9/1991 |
| JP | 4-10651 | 1/1992 |
| JP | 404357861 | 12/1992 |
| JP | 5-291526 | 11/1993 |
| JP | 6-302764 | 10/1994 |
| JP | 7-7084 | 1/1995 |
| JP | 5-167031 | 6/1995 |

\* cited by examiner

○ Bit Line Contact
● Storage Node Contact

Global Word Line

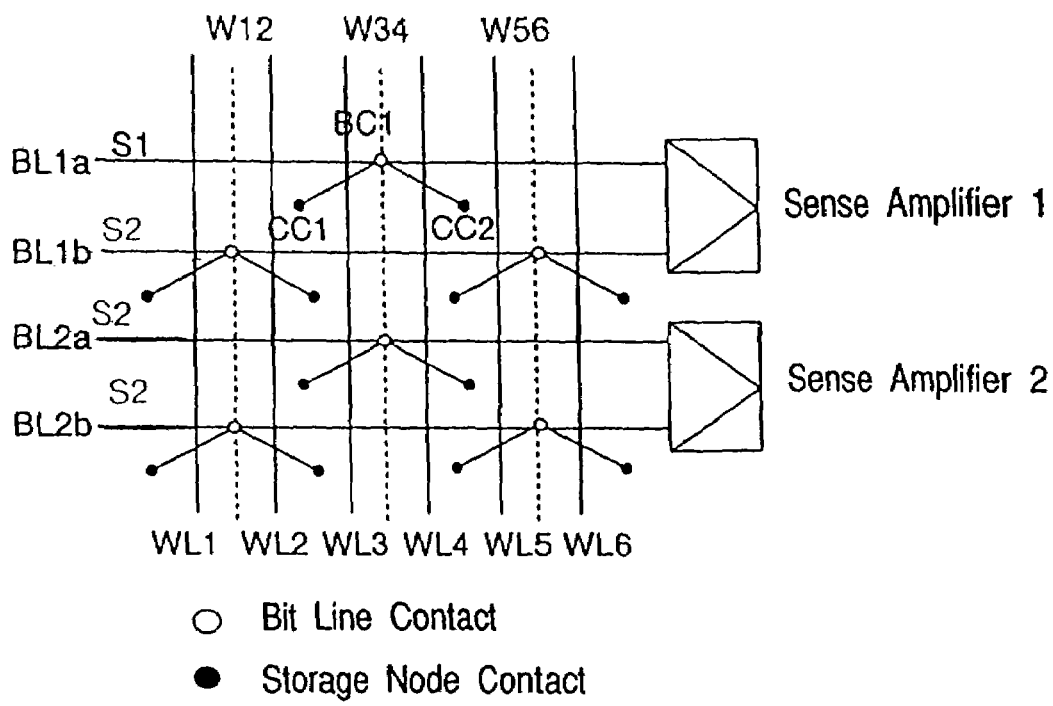
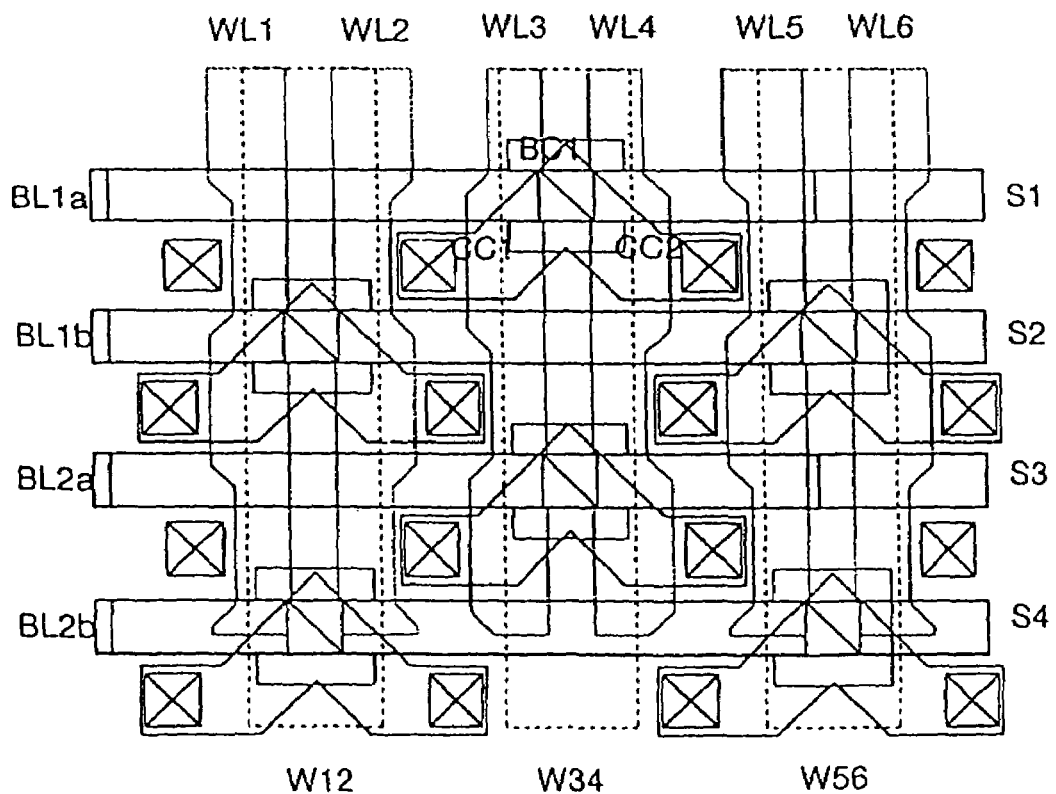

○ Bit Line Contact
● Storage Node Contact

Global Word Line

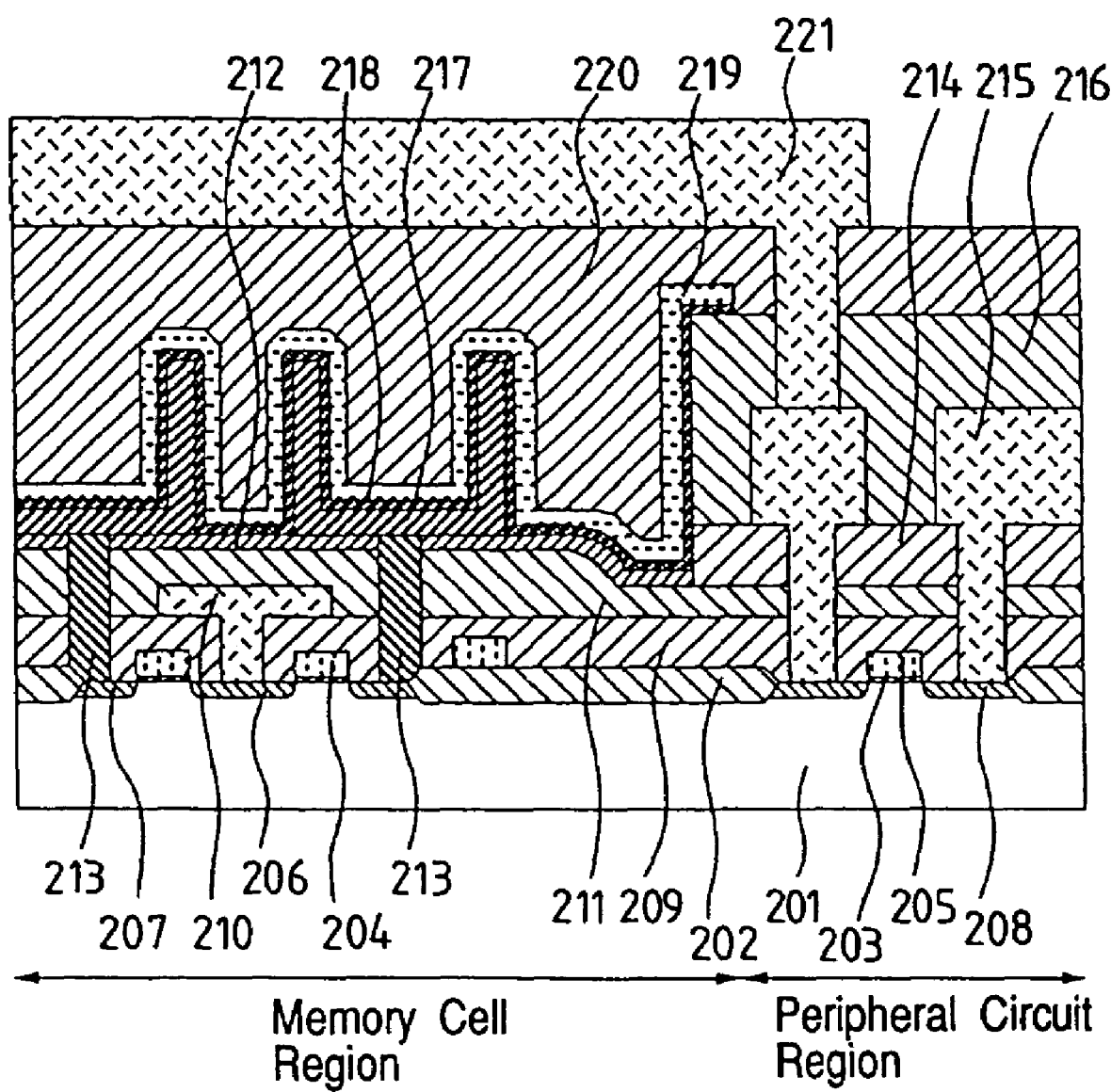

SEMICONDUCTOR MEMORY ARRANGEMENTS WITH CROWN SHAPED CAPACITOR ARRANGEMENTS TRENCHED IN INTERLAYER DIELECTRIC FILM

CROSS-REFERENCE TO RELATED APPLICATIONS

This application is a continuation of application Ser. No. 10/206,215 filed on Jul. 29, 2002 now U.S. Pat. No. 6,798,005, which is a continuation of application Ser. No. 09/077,100 filed on May 20, 1998, now U.S. Pat. No. 6,617,205. The contents of application Ser. Nos. 10/206,215 and 09/077,100 are hereby incorporated herein by reference in their entirety.

This application is related to application Ser. No. 10/205,421 filed on Jul. 26, 2002, which is a continuation of application Ser. No. 09/077,100 filed on May 20, 1998, now issued as U.S. Pat. No. 6,617,205.

TECHNICAL FIELD

The present invention relates to a semiconductor memory device and a manufacturing method thereof, in detail relates to a semiconductor memory device which can be miniaturized and its manufacturing method in which such a semiconductor memory device can be manufactured readily and precisely.

BACKGROUND ART

A semiconductor memory device used in great volume for a personal computer, a workstation, a main frame computer and others is a dynamic random access memory (hereinafter called DRAM) consisting of one transistor which functions as a switch and one capacitor as the smallest unit. This DRAM has been heretofore enhanced in the ratio of four times in three years in the degree of integration and at present, then mass production of a 64-megabit DRAM which is to be manufactured using micro-fabrication technology in the next generation and the minimum feature size of which is 0.35 µm is being developed.

Heretofore, the high integration of a semiconductor memory device has been achieved by reducing the device size, however, the amount of charge which can be stored in a capacitor as information is reduced because the area of the capacitor is reduced for miniaturization. As a result, as signal to noise ratio is deteriorated and reliability is deteriorated because a problem such as the signal reversal caused by the incidence of alpha rays occurs, it is indispensable and the greatest task of a semiconductor memory device to secure the sufficient stored charge so as to keep reliability.

The amount of charge stored in a capacitor is determined by the product of the capacity of the capacitor and applied voltage, the capacity of the capacitor is proportional to the area of the capacitor and the dielectric constant of the dielectric film of the capacitor and is inversely proportional to the thickness of the capacitor dielectric film. Therefore, a stacked-type capacitor wherein a part of a capacitor is formed on the switching transistor and an oxide film for device isolation and a trench-type capacitor wherein a deep trench is formed on a semiconductor substrate and the side wall of the trench is utilized as a capacitor are used in a memory device (hereinafter called a memory cell) of a 4- or more-megabit DRAM so as to prevent storage capacity from being reduced by the reduction of the area of a capacitor caused by microminiaturization. A 64-megabit DRAM can be realized by using a capacitor with such structure.

However, when the area of a memory cell is reduced in the ratio of 1/3 of the previous generation according to a trend, even a memory cell using a stereoscopic capacitor such as the stacked-type capacitor and trench-type capacitor cannot compensate the reduction of the area of the capacitor completely and it is difficult to secure required capacity.

To solve such a problem, a charge storage capacitor called a crown type is proposed. This crown-type capacitor is a stereoscopic one utilizing the inner and outer walls of a concave (crown-type) electrode 19 shown in FIG. 2 as the electrode of the capacitor. Referring to FIG. 2, a reference number 1 denotes a semiconductor substrate, 2 denotes an oxide film for device isolation, 3 denotes the gate oxide film of a transistor, 4 denotes the gate electrode of the switching transistor, 5 and 5' denote a diffused region different from the substrate in a conductivity type, 6 denotes an interlayer dielectric film, 7 denotes a bit line connected to the diffused region 5', 8 denotes an interlayer dielectric film, 13 denotes metal for connecting the diffused region 5 and the lower electrode of a capacitor, 19 denotes the lower electrode of the capacitor, 20 denotes a capacitor dielectric film, 21 denotes a plate electrode of the capacitor, 22 denotes an interlayer dielectric film, 23 denotes wiring connected to the diffused region of the substrate, 24 denotes an interlayer dielectric film and 25 denotes the uppermost wiring.

Storage capacity can be increased by adopting structure using such a crown-type capacitor electrode 19 for the capacitor of a DRAM, however, not only an extremely complicated process is required to realize such structure, but there exists a problem that there is great step height.

That is, as shown in FIG. 2, great step height is caused by the crown-type electrode 19 between a memory cell (a left section in FIG. 2) and a transistor (a right section in FIG. 2) in the vicinity and as a result, it is difficult to form wiring 23 on this step height. As the depth of the focus of a used reduction projection aligner is shallow and the tolerance of the focus (depth of focus) is small in optical lithography used for forming wiring 23 with a predetermined pattern, this is because it is difficult to focus on both the upper and lower portions of the step height suitably. In addition, this is because the smaller the dimension of a pattern is, the smaller depth of focus is and a range in which a focus is suitably adjusted is further smaller.

To solve such a problem in forming a wiring pattern caused by step height, a method of planarizing the surface of a substrate by a chemical mechanical polishing (CMP) method is proposed and is already applied to planarizing the interlayer dielectric film of the multilayer interconnection of a logic large scale integrated circuit (LSI).

However, it is difficult to apply this CMP method to a substrate wherein the crown-type electrode 19 approximately 1 µm in height is already formed for a variety of reasons. First of all, when mechanical polishing by applying mechanical force is applied to a capacitor wherein a very thin capacitor dielectric film is formed, possibility that a pinhole or a crack is made on the capacitor dielectric film and as a result, failure of electric isolation occurrence is high. Secondly, the internal stress of a thick oxide film is caused because an oxide film with at least a double thickness of step height is required so as to bury a capacitor with large step height in the oxide film and thus failure of electric insulation of the capacitor dielectric film is caused by this large internal stress as described.

A method of lowering the surface of a silicon substrate in a memory cell array in an initial process is proposed in Japanese published unexamined patent application No. Sho 63-266866. However, if step height is large, the method is difficult to apply.

A memory cell provided with the crown-type capacitor is described in Japanese published unexamined patent applications No. Sho62-48062 and No. Sho62-1281268. FIG. 73 shows the plane arrangement of this memory cell and FIG. 74 shows the section viewed along a line X-X' in FIG. 73 and the section of the main part of peripheral circuits. The structure of the section shown in FIG. 75 is a prior embodiment utilizing the internal face of a storage electrode in a trench as a capacitor. This structure has an advantage that it is easier in manufacturing than a crown-type capacitor.

Referring to FIGS. 73, 74 and 75, a reference number 101 denotes a silicon substrate, 102 denotes a field oxide film, 103, 104 and 105 denote highly concentrated impurity regions which are a source or a drain, 106 and 107 denote gate electrodes, 109 denotes wring, and 108, 110 denotes a layer 111 denotes a storage electrode, 112 denotes the dielectric film of a capacitor, 113 denotes a plate electrode, 114 denotes a silicon oxide film, 115 denotes wiring, 117 denotes a layer, 127 denotes an actve area, 128 denotes a word line, 130 denotes a data line, 129 denotes a contact hole and 131 denotes a connecting hole. As shown in FIGS. 74 and 75, these conventional semiconductor memories wherein a capacitor is formed on a silicon substrate have large step height between a memory cell and its peripheral circuits.

In a trench capacitor cell wherein a capacitor is formed inside a substrate, large step height is not formed on the substrate. Since the storage capacity can be increased by deepening a trench formed on a substrate, the capacity of the storage capacitor can be prevented from being reduced by reducing the area of a cell.

However, as the size of an area in which a trench can be formed is limited, an aspect ratio of which is approximately 40 and a trench which is extremely deep and narrow in width is required to be formed. Further, there are many problems in a process such as an electrode of a capacitor buried in a substrate and the diffused region of a switching transistor are required to be connected in the substrate and practical use is difficult.

If material with a large dielectric constant, for example, lead zirconate titanate (PZT) which is a ferroelectric substance and others are used for a capacitor dielectric film, large storage capacity can be realized without the complicated shape of a capacitor.

However, a film consisting of noble metal such as platinum is required to be used for the electrode of a capacitor so as to use PZT with a large dielectric constant for a capacitor dielectric film. Noble metal such as platinum is a source of contamination for silicon which not only deteriorates the characteristics of an element but is also difficult to process by conventional photo-etching in a predetermined shape.

Further, there are many problems in that a dielectric film consisting of the PZT or others cannot be protected against heat treatment of approximately 400° C. or more and that long-term reliability is unclear and there is no prospect of practical use.

FIG. 91 shows a conventional memory cell provided with a crown-type capacitor on a data line and a metal oxide silicon field-effect transistor (MOSFET) in its adjacent peripheral circuits area. As shown in FIG. 91, a MOSFET in a memory cell area is constituted by a gate dielectric film 303, a gate electrode 304 and high-density N-type impurity areas 306 and 307, and the storage electrode 317 of a crown-type capacitor consisting of polycrystalline silicon is connected to this MOSFET via an opening formed on the high-density N-type impurity area 307 in clearance between a word line (the gate electrode 304) and a data line (a wiring electrode 310). Further, a capacitor dielectric film 318 is formed on this storage electrode 317 and a plate electrode 319 is provided on it.

The storage electrode 317 is cylindrical and the effective area of the capacitor is increased utilizing not only a flat portion but the inner face and the outer wall of a vertical portion. The effective area of the capacitor can be maximized by providing the storage electrode on the data line and further, the static capacitance of the capacitor can be readily increased by extending the height of the vertical region, that is, arranging the cylindrical storage electrode in a higher position.

A method of manufacturing a semiconductor memory device provided with such a crown-type or a cylinder-type capacitor will be briefly described below. First, a field oxide film 302 for insulating between elements is grown on a single crystalline silicon substrate 301 and the gate oxide film 303 of a MOSFET is formed. Next, a polycrystalline silicon film containing impurities in high density is formed as the gate electrode 304 and after patterning in a predetermined shape, high-density N-type impurity regions 305, 306 307 and 308 which are to function as the source and the drain regions of the MOSFET are formed on the single crystalline silicon substrate 301 by ion implantation in self-alignment. Next, after a silicon oxide film 309 is formed, an opening not shown is formed on the high-density N- type impurity region 306 of the MOSFET in a memory cell area, a polycrystalline silicon film including impurities in high density and a tungsten silicide film are formed in order as the data line 310 and are patterned in a predetermined shape. Next, after the silicon oxide film 311 is formed, an opening is formed on the high-density N-type impurity region 307 which is the source or the drain of the MOSFET in the memory cell area, a polycrystalline silicon film and a silicon oxide film are formed in order, after they are patterned in a predetermined shape, a polycrystalline silicon film is further formed, and the polycrystalline silicon film is left on the side wall of the silicon oxide film by removing the polycrystalline silicon film exposed in the flat portion by applying anisotropic dry etching to be the crown-type storage electrode 317. Next, after the capacitor dielectric film 318 is formed, a polycrystalline silicon film which is to function as the plate electrode 319 is further formed and is patterned so that it is in a predetermined shape. At last, a silicon oxide film 316 which is an interlayer dielectric film and aluminum wiring which is metal wiring 315 are formed, and the MOSFET and the memory cell of peripheral circuits are manufactured.

As described above, to further enhance the degree of integration of a DRAM, it is difficult to enhance the degree of integration of a DRAM consisting of the conventional stereoscopic cell and a semiconductor memory device which can solve the problem is strongly desired.

The conventional DRAM is described in, for example Japanese published unexamined utility model application No. Sho55-178894 and Japanese published unexamined patent applications No. Sho56-58253, No. Sho56-58254, No. Sho56-58255, No. Sho57-112066, No. Sho59-231351, No. Sho62-128168, No. Sho63-293967, No. Sho59-231851, No. H1-137666, No. H1-179449, No. H3-214670, No. H5-291526, No. Sho59-82761 and No. Sho62-213273.

In this specification, as shown in, for example FIG. 91, a capacitor wherein the section of a storage electrode is concave upward, and a capacitor dielectric film and a plate electrode are formed on the inner and outer faces of such a storage electrode is called a crown-type capacitor and a capacitor wherein a storage electrode, a capacitor dielectric film and a plate electrode are formed on the inner face of a trench is called a trench capacitor.

DISCLOSURE OF THE INVENTION

The object of the present invention is to solve the problems of the conventional stereoscopic memory cell and to provide a further minuter semiconductor memory device and its manufacturing method.

Another object of the present invention is to provide a semiconductor memory device provided with a capacitor which can secure sufficiently large storage capacity and its manufacturing method.

Further another object of the present invention is to provide a semiconductor memory device which can obtain sufficiently large storage capacity with forming a trench on a substrate and its manufacturing method.

The other object of the present invention is to provide a semiconductor memory device provided with large storage capacity wherein no large step height exists between a memory cell and its peripheral circuits and its manufacturing method.

To achieve the objects, according to the present invention, a trench which passes through a plurality of dielectric films laminated on a substrate is formed and a capacitor is formed using this trench.

Further another plural dielectric films are provided under the plural dielectric films and plural wiring layers are formed on these another plural dielectric films. Further another dielectric film is formed on the capacitor and another wiring layer is formed on it. Wiring which is not required to be pulled out on the dielectric film of the uppermost layer is formed in the plural wiring layers formed under the capacitor and only required minimum wiring is pulled out from each wiring layer under the capacitor onto the dielectric film of the uppermost layer via a conductive plug for interconnection which passes through the plural dielectric films. Therefore, as wiring can be formed without minute processing and the density of wiring may be low, the formation of wiring is extremely easy.

Referring to FIG. 1, the present invention will be described further in detail below. As shown in FIG. 1, a metal oxide semiconductor field-effect transistor (MOSFET) which functions as the switching transistor of a memory cell is connected with a word line 4 (the gate electrode of the MOSFET) and a bit line 7 for supplying and taking out charge are formed on a semiconductor substrate 1, further plural dielectric films 6, 8, 10, 12, 14, 16 and 18 are laminated and the surfaces are flattened.

A trench is formed through the dielectric films 14, 16 and 18 and a capacitor constituted by a lower electrode 19, a capacitor dielectric film 20 and a plate electrode 21 is formed inside this trench.

If a thick dielectric film is formed on the word line 4 and the bit line 7, an electrical connection to the word line 4 and the bit line 7 is required to be made via a plug for interconnection which passes through this thick dielectric film. However, it is difficult to form a contact hole and to embed metal. Therefore, according to the present invention, plural layers of wiring 9 and 11 are provided among the lower electrode 19 of the trench capacitor, the word line 4 and the bit line 7, and are used for a global word line for selecting a word line and a selector line for selecting a bit line. Therefore, wiring which is not required to be connected to the uppermost layer may be left buried as described above and a plug for interconnection which passes through the thick dielectric film is not required.

As the capacitor is provided over the plural layers of wiring 9 and 11 and heat treatment at approximately 800° C. is performed, it is desirable that for the material of the wiring 9 and 11, tungsten and silicide which are proof against such heat treatment are used. Copper is desirable in that it has small resistance, however, the temperature of heat treatment against which it can be proof is 500° C. or less. If a dielectric film with a high dielectric constant such as BST and PZT is used for a capacitor dielectric film, copper can be used for wiring material because the temperature at which a capacitor itself is formed is 400° C. or less.

Referring to FIG. 1, the several wirings 9, 11 buried in an oxide are also used for a part of the wiring of a transistor in the peripheral circuits in addition to the word line 4 and the bit line 7 in the memory cell. Diffused regions 5 and 5' and wiring 9' are connected via wiring 7' in the same layer as the bit line 7. However, the wiring 9' may be directly connected to the diffused regions 5 and 5'. In that case, a part of the wiring 9' is required to be barrier metal so as to prevent reaction between the diffused regions 5 and 5' and the wiring 9' respectively.

The capacitor is substantially formed only in the trench. The reason is to simplify a process of forming a capacitor. The lower electrode 19 of the capacitor consists of a polycrystalline silicon film including impurities in high density and is connected to the diffused region 5 of the MOSFET via polycrystalline film 13 for interconnection.

For the capacitor dielectric film 20, well-known various dielectric films such as a laminated film consisting of a silicon oxide film and a silicon nitride film, a laminated film consisting of a silicon oxide film and a tantalum pentoxide film, a stacked film consisting of a silicon nitride film and a tantalum pentoxide film, a stacked film consisting of a silicon oxide film, a silicon nitride film and a tantalum pentoxide film and a ferroelectric film such as BST and PZT may be used. However, when BST and PZT are used, noble metal such as platinum is required to be used for the lower electrode 19 and the plate electrode 21. Irregularities may be formed on the surface of the lower electrode 19 to increase its surface area.

It is desirable that the depth of the trench is approximately =b 2 μm. However, when the trench is deep, the distance between the buried wiring 9 and 11 and wiring 23 in the uppermost layer respectively is long. As a result, it is difficult to form a plug for interconnection because a connecting hole with extremely large aspect ratio is required to be formed and such a connecting hole is required to be filled with metal.

However, according to the present invention, as shown in FIG. 1, the trench is formed not through a thick dielectric film, but through stacked plural dielectric films 14, 16 and 18. Therefore, when each dielectric film 14, 16 and 18 is formed, each connecting hole can be formed and can be filled with metal for connection. Hereby, metal 13 for connecting the lower electrode 19 and the diffused region 5 can be readily formed without forming the connecting hole with extremely large aspect ratio and filling it with metal especially. In addition, as described above, as the number of wiring which is required to be connected to the uppermost wiring layer is not many, high patterning accuracy is not required for the plug for interconnection used for pulling out wiring to the uppermost layer. This is one of the advantages of the present invention obtained by forming buried wiring.

Referring to FIG. 1, a reference number 1 denotes a semiconductor substrate, 2 denotes an element separating oxide film, 3 denotes the gate oxide film of a MOSFET, 4 denotes the gate electrode of the MOSFET which functions as a word line in a memory cell, 5 and 5' denote the diffused regions of the MOSFET, 6 denotes an interlayer dielectric film, 7 denotes a bit line, 7' denotes an interlayer for connecting the diffused region of a peripheral MOSFET and its wiring, 8, 10, 12,16, 18 and 22 denote an interlayer dielectric film, 9 and 11 denote buried wiring, 14 denotes an dielectric film, 15,17 and 23 denote a plug for interconnection and 24 denotes wiring in the uppermost layer.

The step height can be prevented from being made effectively by the following method. That is, as schematically shown in FIG. 23, a stereoscopic capacitor 33 formed in a memory cell area and a wiring layer 34 in a peripheral circuit area are respectively provided on an dielectric film 32 formed on a silicon substrate 31 on which a MOSFET is formed or so that the upper face of the dielectric film 32 is in contact with the side portion of the capacitor 33. These wiring layer 34 and capacitor 33 are covered by an dielectric film 35, and wiring 36 in a memory cell array and wiring 37 in peripheral circuit are provided on the dielectric film 35.

As the wiring layer 34 of the peripheral circuit is formed on the dielectric film 32 in which a lower portion of the high stereoscopic capacitor 33 is formed, step height made by a capacitor 33 in a memory cell is reduced by the wiring layer 34. Therefore, even if the flat surface of the dielectric film 35 is formed and covers the capacitor 33 and the wiring layer 34, a through hole and a contact hole are not deepened in the peripheral circuit and the minute wiring 36 and 37 can be readily formed on the dielectric film 35 without disconnecting the wiring in the through hole and the contact hole.

Further, according to the present invention, a wiring layer consisting of a first conductive film in the peripheral circuit area is provided on a first dielectric film and a second dielectric film can be further provided on it. A crown-type capacitor is formed in a concave portion formed by removing the predetermined portion of the first and second dielectric films. In this case, as shown in, for example FIG. 76, the upper face of a plate electrode 219 can be flattened and voltage can be applied to the plate electrode 219 from the top.

BRIEF DESCRIPTION OF THE DRAWINGS

FIG. 19 is a conceptual drawing for explaining a third embodiment according to the present invention;

FIG. 20 is a pattern layout drawing showing the third embodiment according to the present invention;

FIG. 92 is a sectional view showing a thirteenth embodiment according to the present invention.

BEST MODE FOR CARRYING OUT THE INVENTION

FIRST EMBODIMENT

Figure 1:
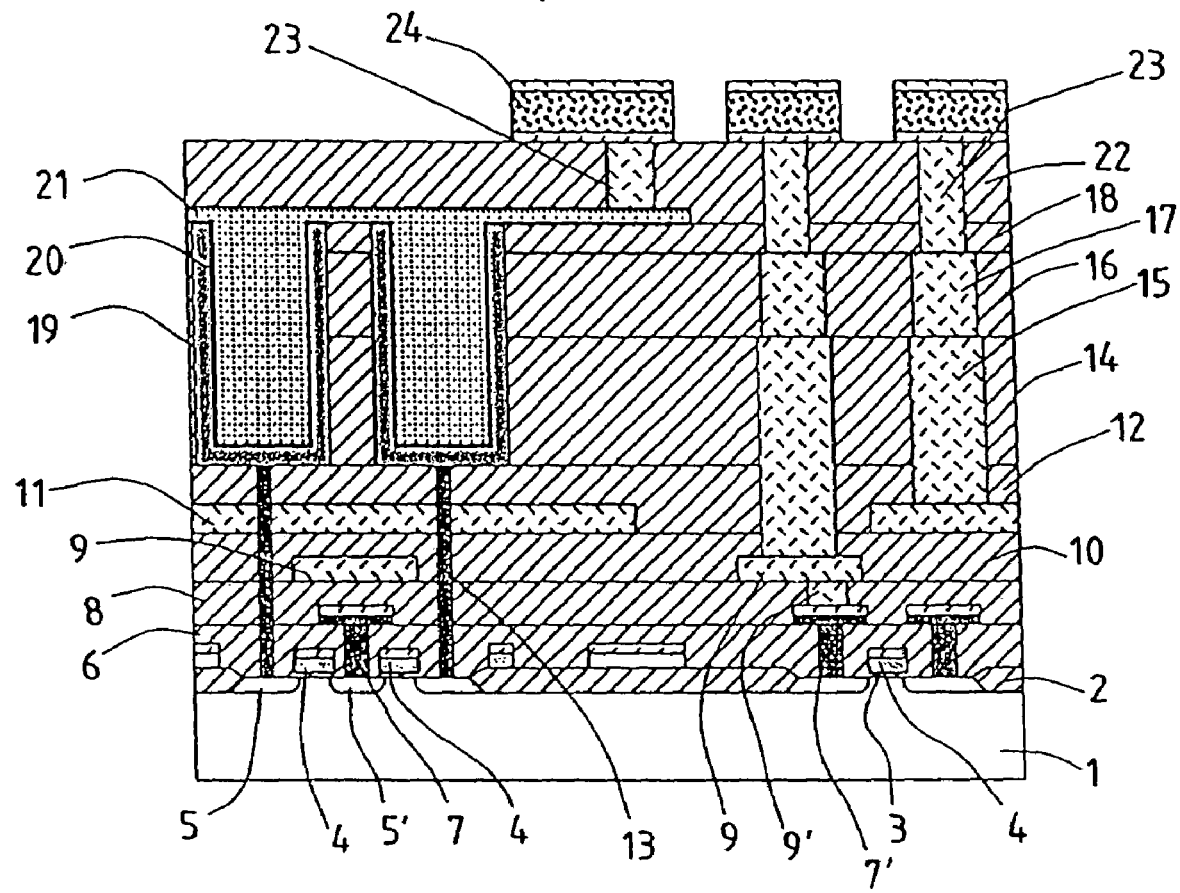
FIG. 1 is a sectional view showing a semiconductor memory device according to the present invention.
Figure 2:
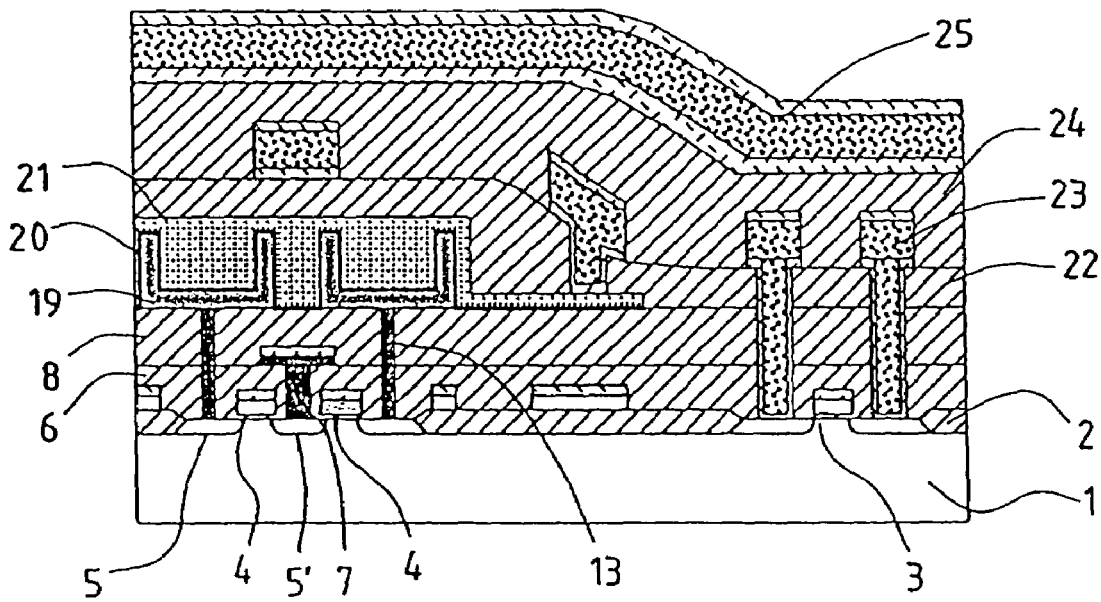
FIG. 2 is a sectional view showing a conventional semiconductor memory device.
Figure 3:
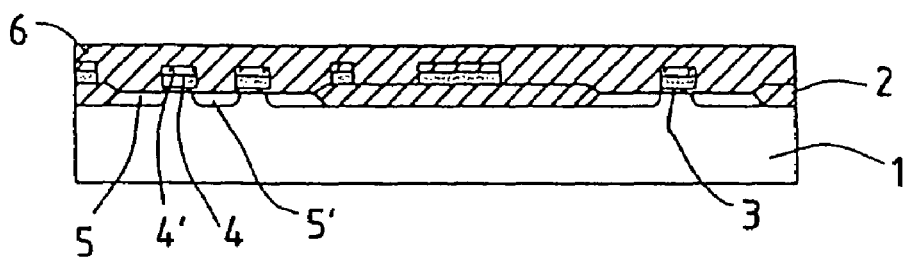
FIG. 3 shows a process of manufacturing a semiconductor memory device according to the present invention.

First, as shown in FIG. 3, an element isolating oxide film 2 for separating a MOSFET is formed on the surface of a semiconductor substrate 1 using a well-known device isolation technology.

Next, after the surface of the semiconductor substrate 1 is cleaned, a gate oxide film 3 with the thickness of 7 nm is formed at the temperature for oxidation of 800° C. by well-known thermal oxidation. A polycrystalline silicon film 4 with the thickness of 100 nm including high-density impurities is formed by well-known CVD. After a metal film 4' with the thickness of 100 nm consisting of a stacked film constituted by a tungsten film and a barrier metal film is formed on the polycrystalline silicon film 4 so as to reduce resistance, a word line and a gate electrode 4 are formed by well-known dry etching so that they are in a predetermined shape. Arsenic approximately $5 \times 10^{14}/cm^2$ is implanted as impurity ion with a conductive type reverse to the substrate 1 using this gate electrode 4 as a mask and, the implanted arsenic is activated by annealing at the temperature of 950° C. for 10 seconds to be diffused regions 5 and 5'. The quantity of ion implanted into a switching transistor in memory cell and an N-type MOSFET in peripheral circuit is equalized and the same quantity of boron is implanted into a P-type MOSFET in the peripheral circuit.

After a silicon oxide film 6 with the thickness of 0.5 μm is formed overall, the surface is flattened by well-known CMP technique so that the silicon oxide film 6 on the gate electrode 4 is approximately 0.15 μm thick.

Figure 4:
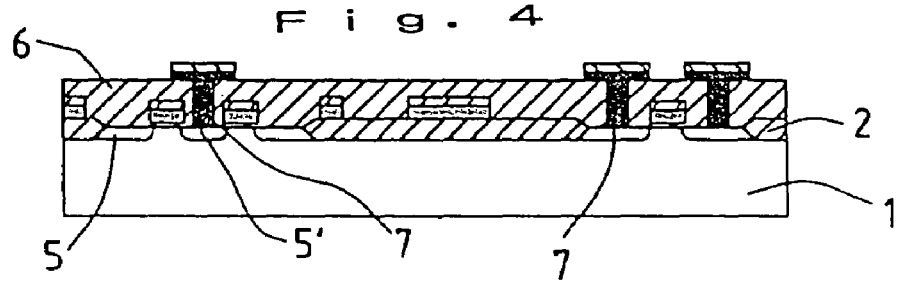
FIG. 4 shows a process of manufacturing a semiconductor memory device according to the present invention.

Next, as shown in FIG. 4, a contact hole is formed in a predetermined portion of the silicon oxide film 6 to form a bit line 7 connected to the diffused region 5'. For this bit line 7, a so-called polycide bit-line in which a tungsten silicide film 100 nm thick is stacked on the polycrystalline silicon film approximately 100 nm thick doped with high-density impurities.

In FIG. 4 showing a memory cell area, two bits are shown as a unit and therefore, one bit line contact is formed between two word lines.

As shown in FIG. 4, a film with the polycide structure is also used as an interlayer for electrically connecting the diffused region of an N-type MOSFET with wiring in the uppermost portion in the peripheral circuit. By this interlayer, the contact of the MOSFET is prevented from being deepened, however, a semiconductor memory device according to this embodiment can be realized without providing such an interlayer. Not only a polycide film used in this embodiment but another film such as a stacked film consisting of tungsten, barrier metal and polycrystalline silicon also can be used for the word line may be used for the bit line 7. Further, tungsten may be also directly in contact with the diffused region 5' via barrier metal without using polycrystalline silicon.

Figure 5:
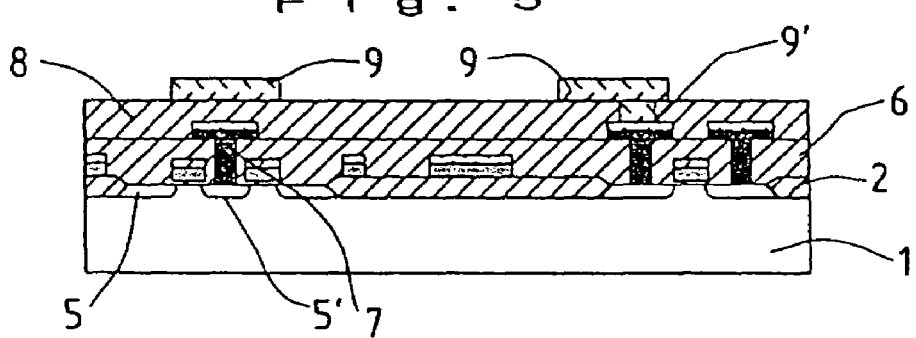
FIG. 5 shows a process of manufacturing a semiconductor memory device according to the present invention.

Next, as shown in FIG. 5, after a silicon oxide film 8 is formed overall, the surface is flattened by using CMP. After a contact hole reaching the bit line 7 is formed, an intermediate film 9' consisting of a titanium nitride film is formed by CVD and further, first buried wiring 9 consisting of a tungsten film 0.2 μm thick which is proof against heat treatment at the temperature of 800° C. or more is formed.

As shown in FIG. 5, the buried wiring 9 is connected to the diffused region of the MOSFET constituting the peripheral circuit via the interlayer 9'. However, the first buried wiring 9 consisting tungsten may be directly in contact with the diffused region via barrier metal. As a tungsten film can be formed by CVD, tungsten can be buried in a contact hole with relatively high aspect ratio in high step coverage. At that time, as tungsten is also deposited on the surface of the oxide film, the buried portion in the hole (a plug for interconnection) and wiring can be simultaneously formed. In this embodiment, a titanium nitride film formed by CVD is used for the barrier metal.

The buried wiring 9 formed in this process is used as a global word line for selecting a specific word line in a memory cell. In the peripheral circuit, the buried wiring is used not only for interlayer wiring in the upper layer but also for wiring MOSFETs with each other.

Figure 6:
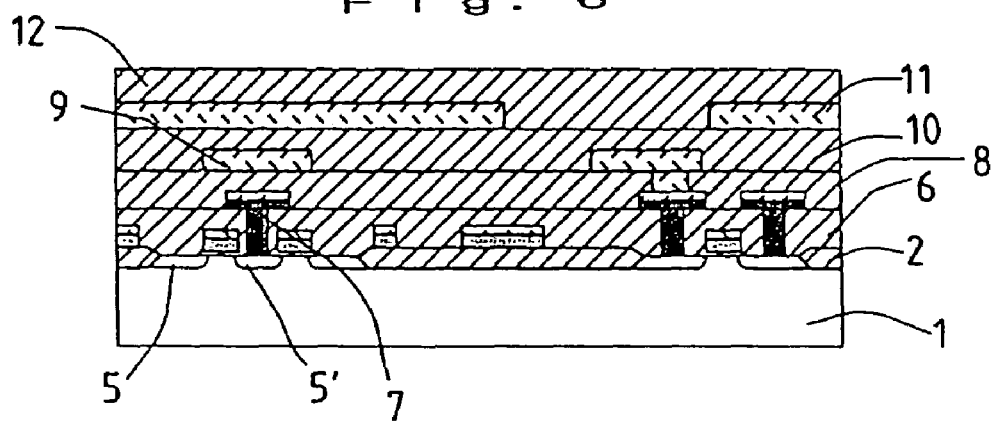
FIG. 6 shows a process of manufacturing a semiconductor memory device according to the present invention.

Next, as shown in FIG. 6, after an interlayer oxide film 10 is formed overall and the surface is flattened by CMP, a plug for interconnection (not shown) consisting of a tungsten film and second buried wiring 11 are formed as the first buried wiring 9. An interlayer oxide film 12 is formed and the surface is flattened as described above. The interlayer oxide films 10 and 12 are both formed by plasma-assisted chemical vapor deposition (PCVD) because buried metal is tungsten. This second buried wiring 11 is a selector line for selecting a specific bit line in a memory cell and is used not only as an interlayer wiring for connecting to wiring in the upper layer but as wiring for connecting MOSFETs with each other in the peripheral circuit. In this embodiment, the second buried wiring 11 is not directly in contact with the diffused region but is in contact with the diffused region of the MOSFET via the first buried wiring 9.

Figure 7:
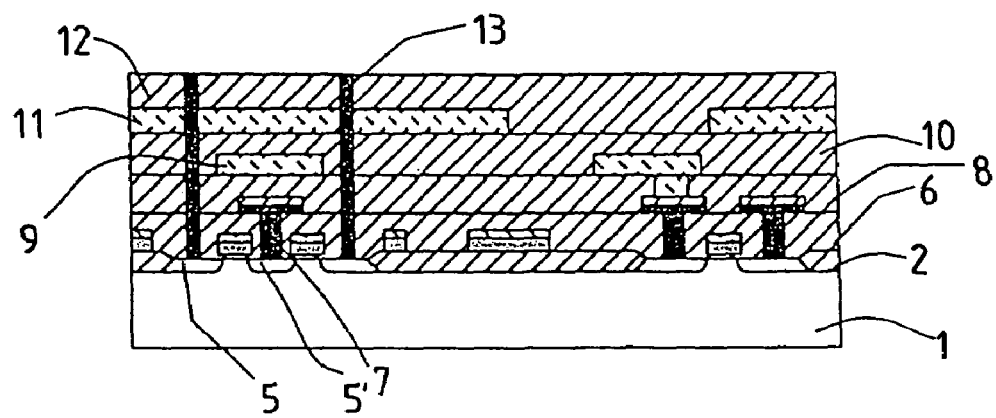
FIG. 7 shows a process of manufacturing a semiconductor memory device according to the present invention.

Next, as shown in FIG. 7, a contact hole approximately 1.5 μm deep which is not in contact with the word line 4, the bit line 7, the first and second buried wiring 9 and 11 is formed and this contact hole is filled with polycrystalline silicon 13. This polycrystalline silicon 13 is used for connecting the lower electrode of a capacitor with the diffused region 5.

As the diameter of the contact hole is approximately 0.2 μm in a memory in the gigabit range, its aspect ratio is approximately 7 and large. However, as this contact hole is formed only in a memory cell and the depth is equal, it can be formed by conventional anisotropic dry etching.

In forming the bit line 7, if polycrystalline silicon is beforehand buried in a portion at which the diffused region and the capacitor lower electrode are in contact, the aspect ratio of the contact hole can be reduced.

Figure 8:
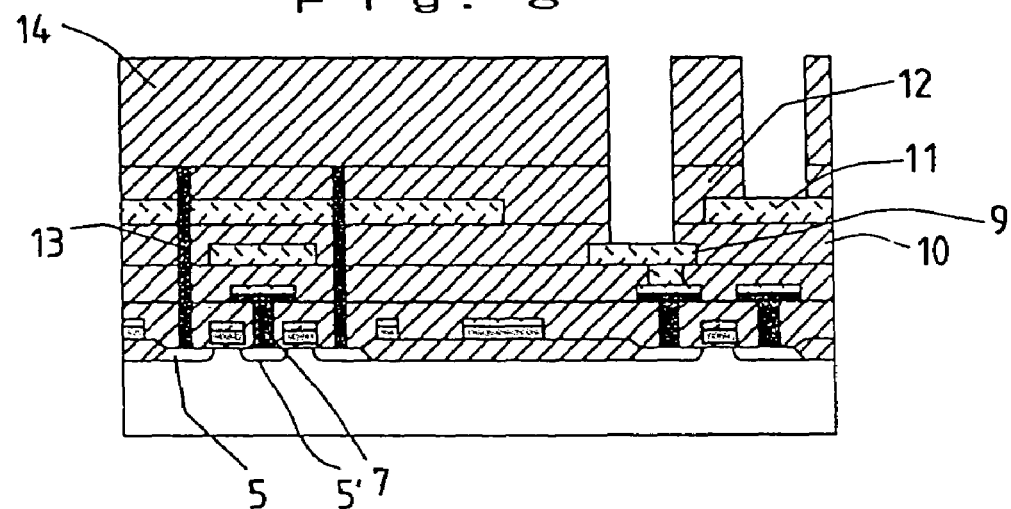
FIG. 8 shows a process of manufacturing a semiconductor memory device according to the present invention.

Next, as shown in FIG. 8, after an interlayer oxide film 14 is formed overall, contact holes respectively reaching the buried wiring 9 and 11 are formed. A trench is formed through this interlayer oxide film 14 and a trench capacitor is formed on the inner wall. However, the depth of this trench, that is, the total thickness of interlayer oxide films 10, 12 and 14 is required to be approximately 2 μm in the case of a memory in the gigabit range.

If the total thickness is thick as described above, it is not easy to form a contact with wiring in the uppermost layer. However, as the number of wiring connected to the buried wiring 9 and 11 is extremely small as described above in the present invention, the diameter of the contact hole may be considerably larger than the minimum processing dimension. For example, in this embodiment in which a memory in the gigabit range is formed, the minimum dimension is 0.2 μm or less. However, as the diameter of the contact hole in this process is 0.5 μm and large and the aspect ratio is not large so much, it is easy to form the contact hole.

Figure 9:
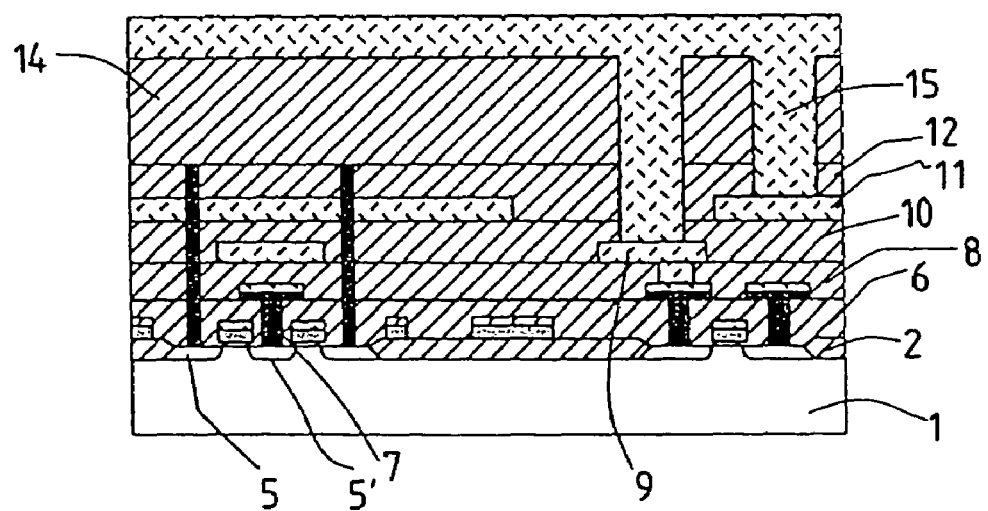
FIG. 9 shows a process of manufacturing a semiconductor memory device according to the present invention.

Next, as shown in FIG. 9, a tungsten film 15 with the thickness of approximately 0.3 μm is formed by CVD and the contact hole is filled with tungsten.

Figure 10:
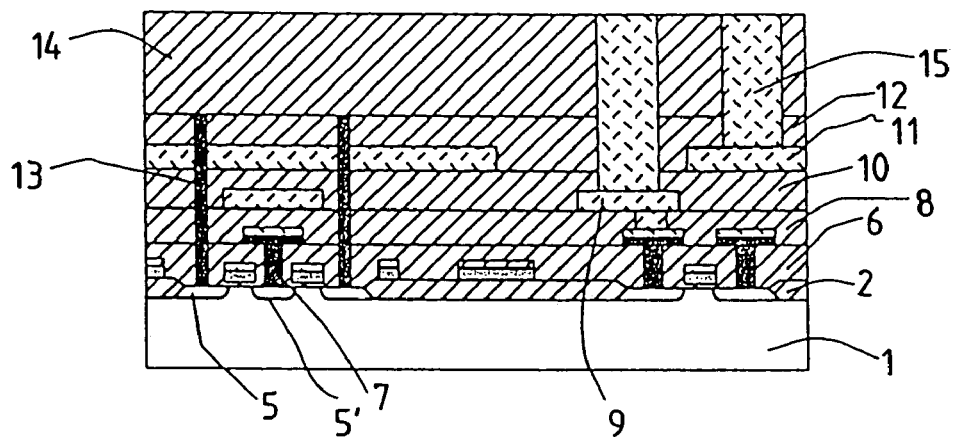
FIG. 10 shows a process of manufacturing a semiconductor memory device according to the present invention.

As shown in FIG. 10, the tungsten deposited on the interlayer oxide film 14 is removed by well-known CMP using slurry containing hydrogen peroxide as polishing slurry and the tungsten 15 is left only in the contact hole. As the CMP can remove tungsten at the selectivity of 50 times or more for the oxide film 14 under it, tungsten 15 can be polished without reducing the thickness of the oxide film 14 so much.

Figure 11:
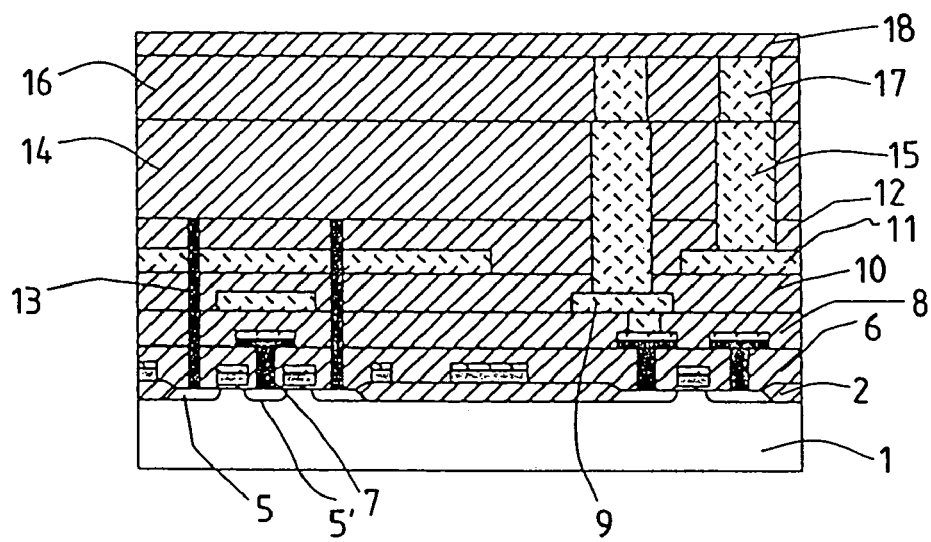
FIG. 11 shows a process of manufacturing a semiconductor memory device according to the present invention.

As shown in FIG. 11, after an interlayer oxide film 16 with the thickness of approximately 1 vm and a tungsten plug 17 with the diameter of 0.5 μm are formed similarly, silicon oxide film 18 is formed overall to cover the upper face of the tungsten plug 17.

As the total thickness of the interlayer oxide films 14 and 16 is approximately 2 μm and the diameter of the contact hole is approximately 0.5 μm, aspect ratio is approximately 4 and a plug can be formed by embedding tungsten once and the number of processes can be reduced.

Figure 12:
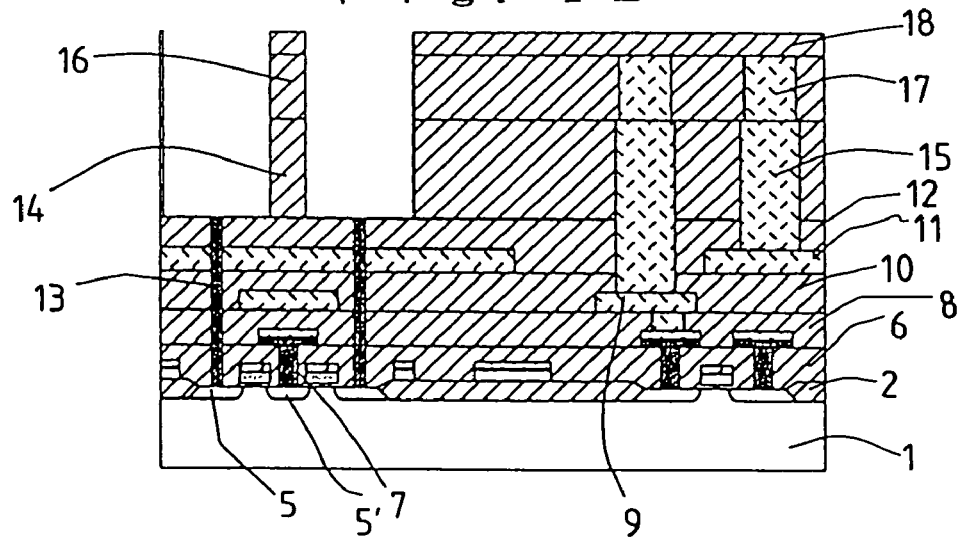
FIG. 12 shows a process of manufacturing a semiconductor memory device according to the present invention.

Next, as shown in FIG. 12, a trench which passes through the interlayer oxide films 14, 16 and 18 and exposes the upper end of the polycrystalline silicon 13 is formed. As this trench is formed only in a memory cell area and in addition, the diameter and depth of each trench are equal, the depth of etching can be readily controlled and the surface of the polycrystalline silicon 13 can be exposed only by controlling etching time.

As the aspect ratio of this trench is approximately 7, such a trench can be readily formed by conventional dry etching. If a nitride film is formed under the interlayer oxide film 14 as an etching stopper film, the controllability of forming a trench is enhanced.

Figure 13:
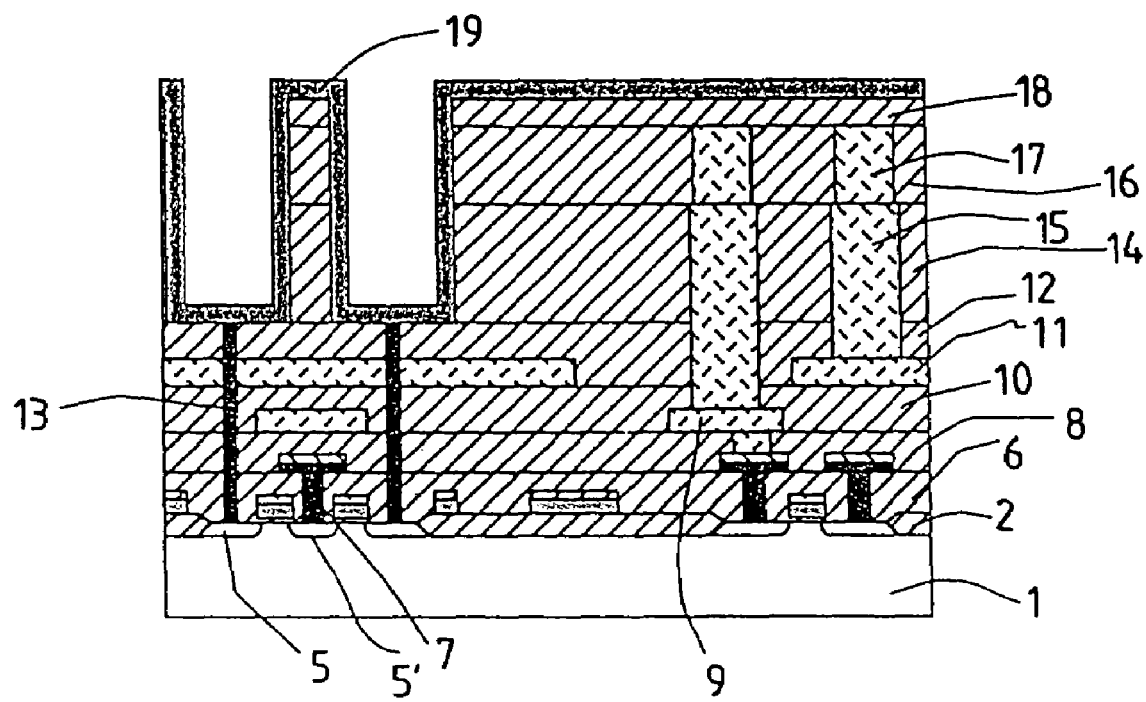
FIG. 13 shows a process of manufacturing a semiconductor memory device according to the present invention.

As shown in FIG. 13, a polycrystalline silicon film 19 with the thickness of 50 nm which functions as the lower electrode of a capacitor is formed overall. This polycrystalline silicon film 19 is electrically connected to the diffused region 5 of a MOSFET via the polycrystalline silicon 13.

Irregularities are formed on the surface of this polycrystalline silicon film 19. The surface area can be doubled or more by forming irregularities on the surface and storage capacity can be increased. For the lower electrode (storage electrode) 19 of a capacitor, tungsten, titanium nitride and others can be used in addition to polycrystalline silicon and further, if a high dielectric film and a ferroelectric film such as BST and PZT are used as a capacitor dielectric film, noble metal such as platinum is used.

Figure 14:
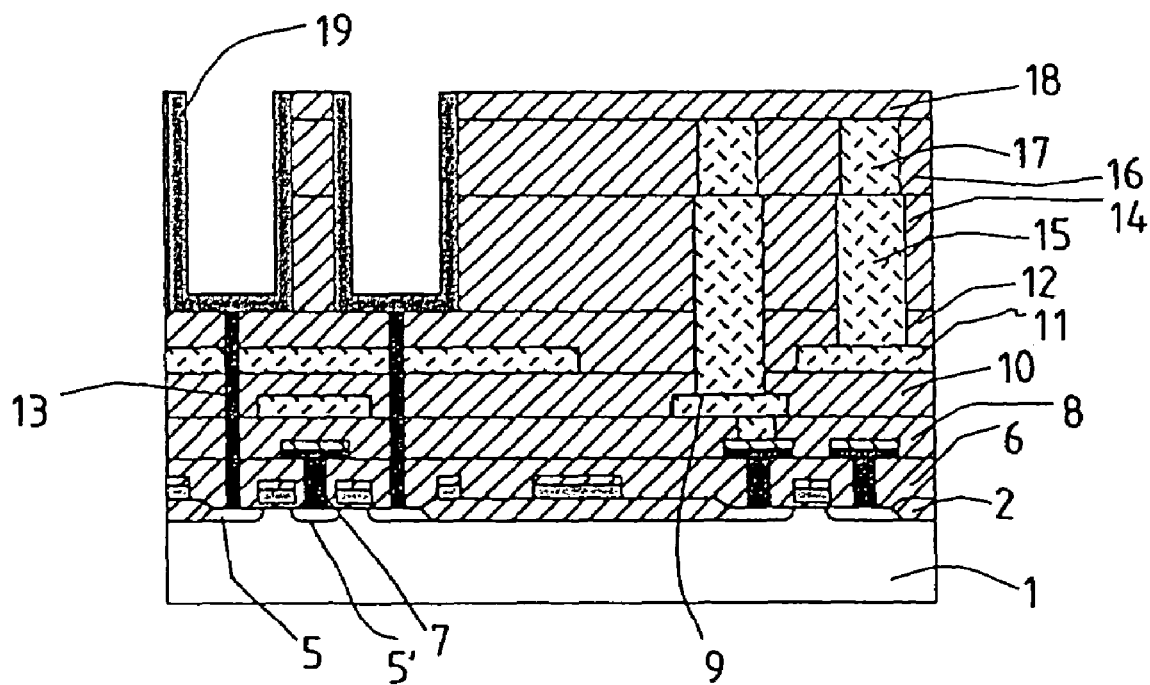
FIG. 14 shows a process of manufacturing a semiconductor memory device according to the present invention.

Next, as shown in FIG. 14, CMP is applied so as to leave the polycrystalline silicon film 19 only in the trench, and the capacitor lower electrode 19 is formed with it separated every memory cell.

Figure 15:
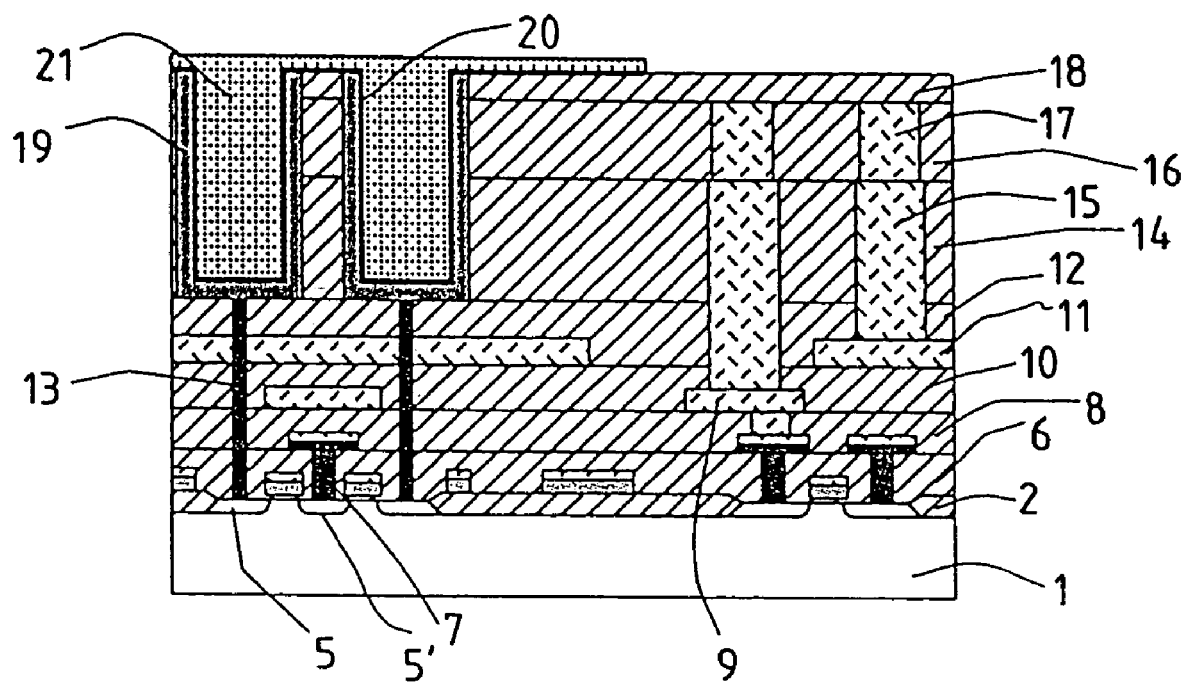
FIG. 15 shows a process of manufacturing a semiconductor memory device according to the present invention.

As shown in FIG. 15, a capacitor dielectric film 20 and a plate electrode 21 are stacked on the capacitor lower electrode 19. In this embodiment, a stacked film consisting of a tantalum pentoxide film and a silicon oxide film is used for the capacitor dielectric film 20 and a capacitor dielectric film 3 nm thick is realized in terms of the thickness of the silicon oxide film. A capacitor dielectric film is not limited to this, a stacked film used heretofore consisting of a silicon oxide film and a silicon nitride film can be used and if a lower electrode consisting of noble metal such as platinum is used, a ferroelectric film can be also used as a capacitor dielectric film. For the plate electrode 21, a variety of well-known conductive material can be also used, however, in this embodiment, a titanium nitride film is used. If a stacked film consisting of a silicon oxide film and a silicon nitride film is used for a capacitor dielectric film, a polycrystalline silicon film can be used and if a ferroelectric film is used, platinum can be used.

Figure 16:
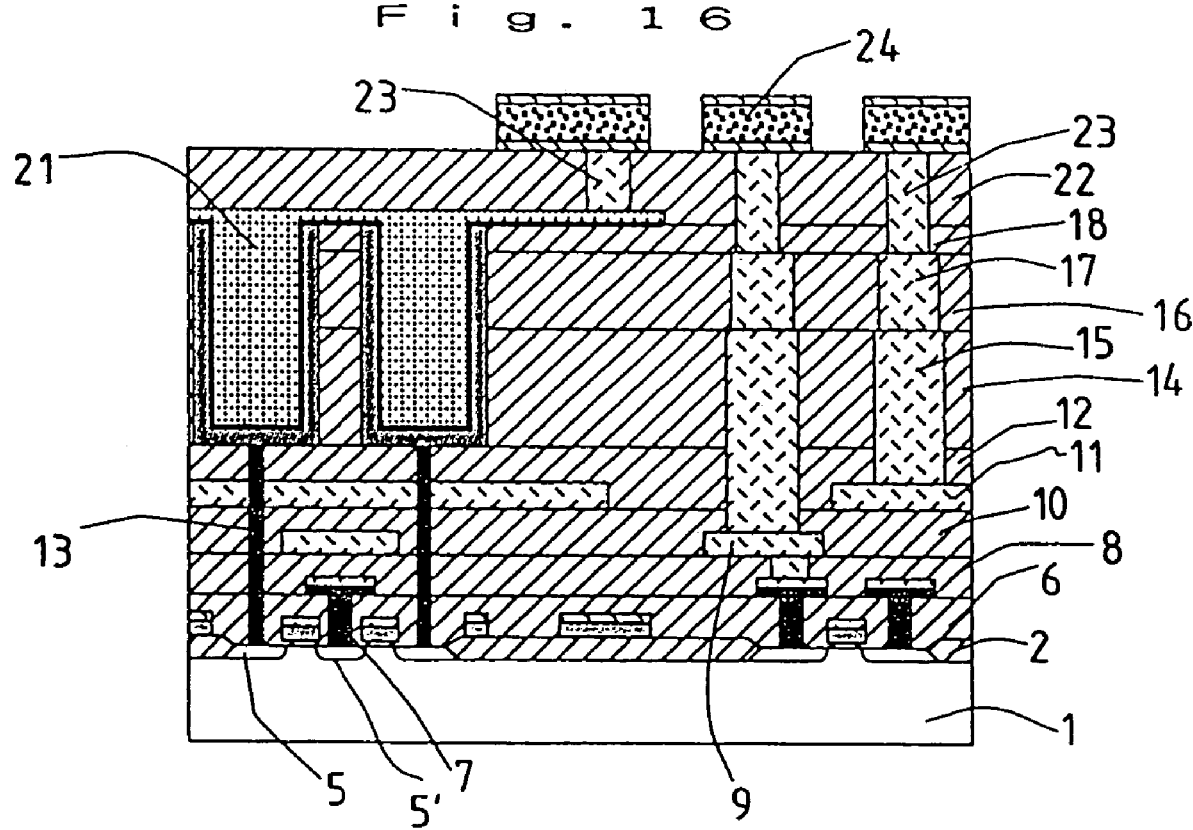
FIG. 16 shows a process of manufacturing a semiconductor memory device according to the present invention.

Next, as shown in FIG. 16, after an interlayer oxide film 22 is formed overall, a contact hole is formed through this interlayer oxide film 22 and the plate electrode 21 and the upper end of the tungsten plug 17 are exposed. After this contact hole is filled with metal to form a plug 23, wiring 24 in the uppermost layer is formed by a well-known method and a semiconductor memory device equivalent to this embodiment is completed. As the density of the wiring in the uppermost layer is extremely small, the dimension may be extremely long and as a relaxed design rule can be used, the wiring in the uppermost layer can be readily formed.

SECOND EMBODIMENT

Figure 17:
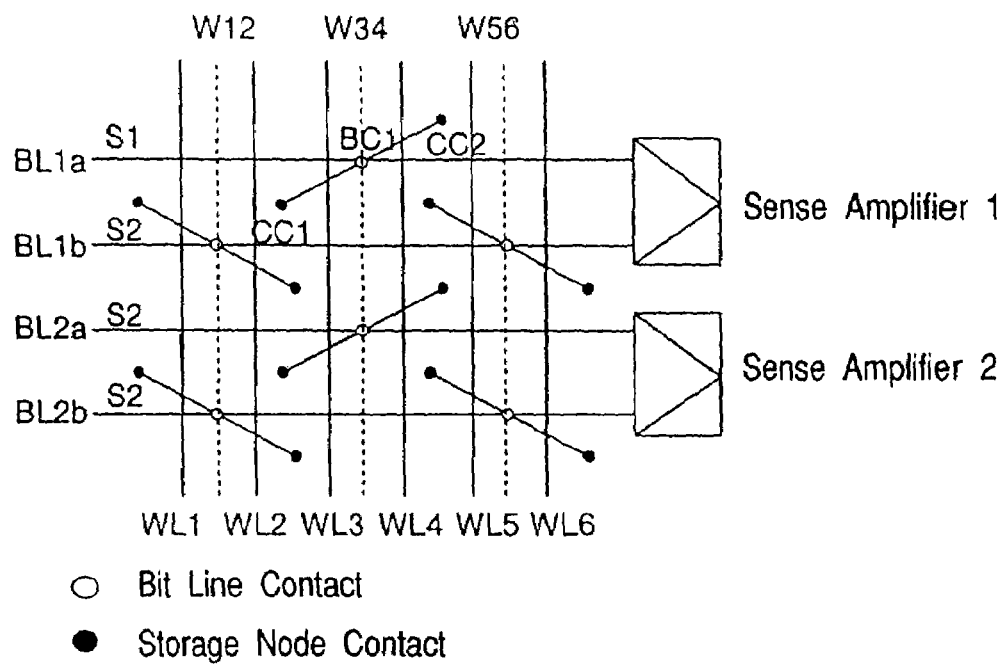
FIG. 17 is a conceptual drawing for explaining a second embodiment according to the present invention.

FIG. 17 is a conceptual drawing showing a memory array equivalent to a second embodiment according to the present invention. As shown in FIG. 17, word lines WL1 to WL6 are regularly arranged vertically and bit lines BL1a, BL1b, BL2a and BL2b are connected to sense amplifiers 1 and 2 with BL1a and BL1b forming a group and BL2a and BL2b forming a group.

One bit line contact BC1 (○) is shared by storage mode contacts CC1 and CC2 (●) connected to two memory cells.

As shown in FIG. 17, a straight line showing the active area of the MOSFET of a switching transistor between two storage mode contacts ● via the bit line contact ○ is arranged slantwise for the word lines WL1 to WL6 and the bit lines BL1a to BL2b. In addition, the direction of the gradient is different between adjacent memory cells. Therefore, each storage mode contact CC1 and CC2 (●) can be respectively formed in clearance between the word lines WL1 to WL6 and the bit lines BL1a and BL2b.

In this embodiment, buried wiring is arranged above the word lines WL1 to WL6 and the bit lines BL1a to BL2b and in addition, to secure a place where a storage mode contact is made, global word lines W12, W34 and W56 shown by a dotted line are arranged in the ratio of one to two word lines WL1 and WL2, WL3 and WL4, and WL5 and WL6 between which the bit line contact BC1 is put as shown in FIG. 17.

Selector lines S1 to S4 for selecting the bit lines BL1a to BL2b are arranged so that they respectively overlap with the bit lines BL1a to BL2b. As these global word lines W11 to W14 and the selector lines S1 to S4 do not require a contact area in a memory cell, each wiring pattern has only to be arranged. The ratio to a word line and a bit line is not limited to this embodiment and can be arbitrarily set.

Figure 18:
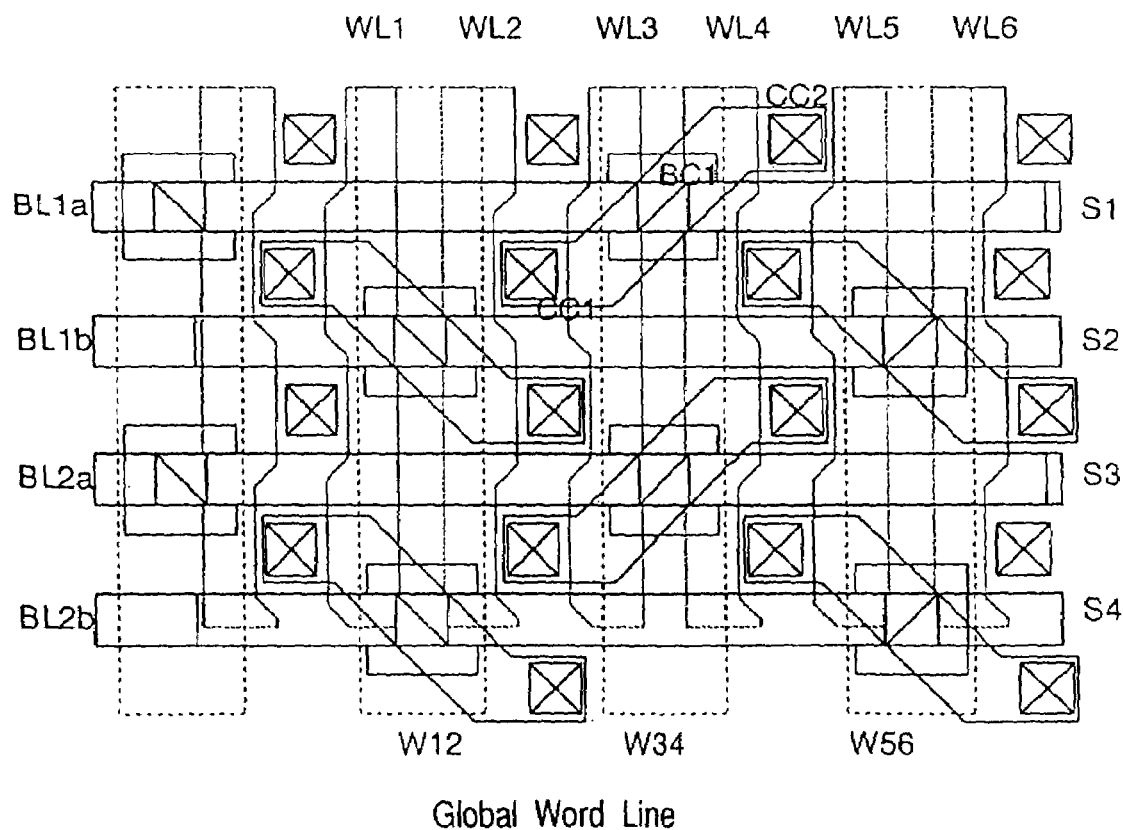
FIG. 18 is a pattern layout drawing showing the second embodiment according to the present invention.

FIG. 18 is a layout drawing shown so that the layout shown in FIG. 17 looks more realistic. However, to facilitate understanding, patterns for a storage capacity electrode, a plate electrode, wiring, peripheral circuit and others is not shown in FIG. 18.

In FIG. 18, an active area is arranged at an angle of 45 degrees to the bit lines BL1a to BL2b and the word lines WL1 to WL6, however, the angle is not limited to 45 degrees and may be other degrees. As the global word lines W12, W34 and W56 are respectively arranged in the ratio of one to two word lines as described above, the width of the global word lines W12, W34 S56 is approximately twice as wide as that of the word lines WL1 to WL6 and a rough layout rule may be adopted. In addition, as no contact area exists in a memory cell as described above, wiring has only to be arranged.

In the meantime, the selector lines S1, S2, S3 and S4 and the bit lines BL1a and BL2b are set so that the dimension of them is equal. In addition, as these selector lines S1, S2, S3 and S4 have no contact area in a memory cell as the global word lines W12, W34 and W56, they do not require an area in which the width of a line is widened as the bit lines. Therefore, a regular pattern can be arranged for the global word lines W12, W34 and W56 and the selector lines S1, S2, S3 and S4, and pattern formation by photolithography is easy.

Further, as the regularity of a pattern is high, it is also easy to apply minute processing technology such as photolithography method using phase shift by which a pattern smaller than the wavelength of light can be formed.

THIRD EMBODIMENT

In this embodiment, as shown in FIG. 19, two storage mode contacts CC1 and CC2 in a memory cell sharing one bit line contact BC1 are arranged so that they are symmetrical on a mirror based upon each global word line W12, W34 and W56. This embodiment is different from the second embodiment in this, however, basic memory operation is similar, the layout of a global word line and a selector line which are buried wiring, which characterizes the present invention, is also similar as shown in FIG. 20 and the same effect as in the second embodiment can be obtained.

FOURTH EMBODIMENT

Figure 21:
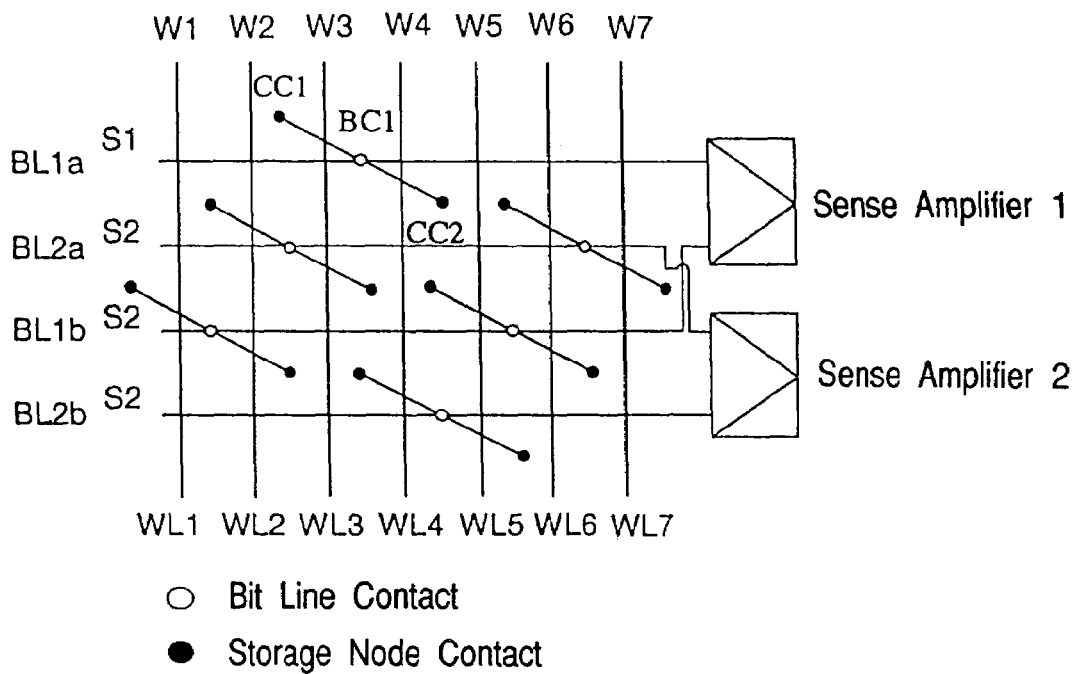
FIG. 21 is a conceptual drawing for explaining a fourth embodiment according to the present invention.

A memory cell in this embodiment is different from that in the second and third embodiments in pattern layout as shown in FIG. 21. However, a manufacturing method is the same as that in the second and third embodiments and a memory cell can be formed by the same method as in the first embodiment.

Pattern layout in this embodiment is characterized in that a word line is arranged between storage mode contacts of adjacent memory cells as described in Japanese published unexamined patent application No. H3-214670. In the second and third embodiments, two word lines are arranged between adjacent storage mode contacts. Therefore, extra area exists in a memory cell and this is a cause for which the area of a memory cell is prevented from being reduced.

However, according to pattern layout shown in FIG. 21, the area required for arranging two word lines is not required, only the area for arranging one word line is required and the area can be reduced by approximately 20%.

As similar memory operation is disabled in the prior bit line layout when such pattern layout is adopted, the two bit lines BL2a and BL1b are crossed and respectively connected to each sense amplifier 1 and 2 as shown in FIG. 21 although a pair of the two bit lines is connected to one sense amplifier in Japanese published unexamined patent application H3-214670 and the first to third embodiments.

Figure 22:
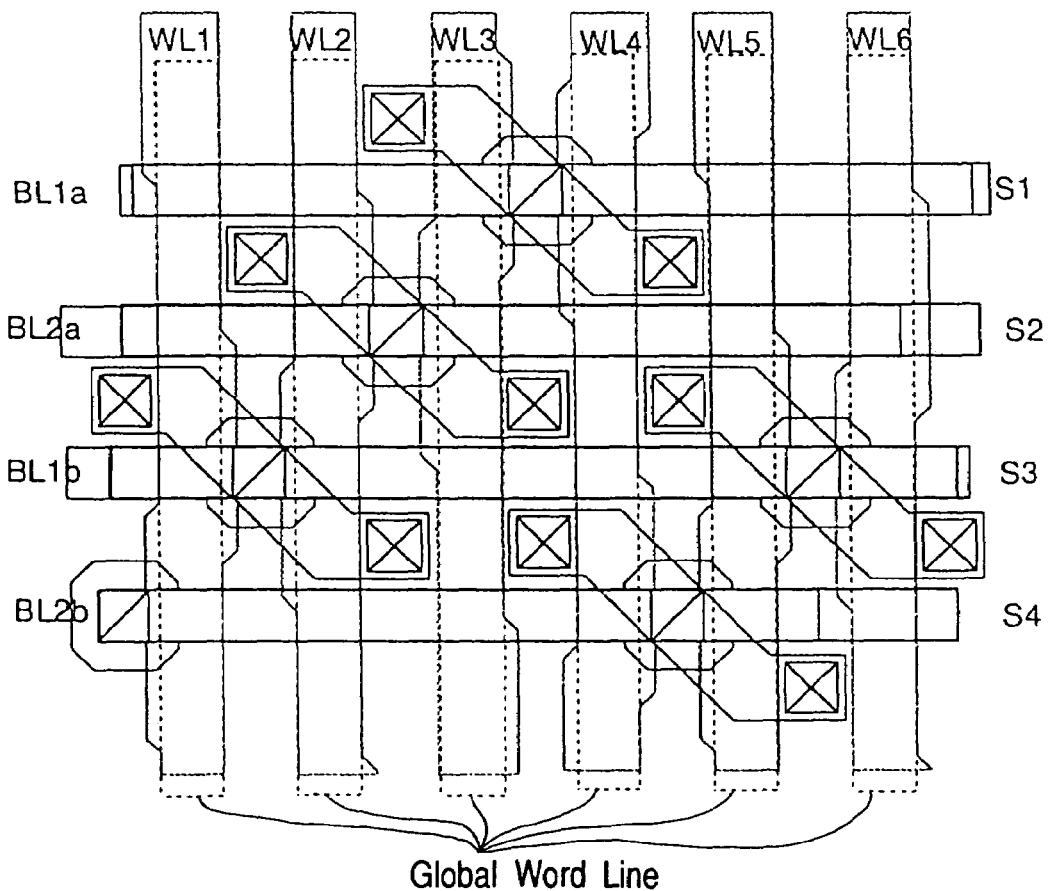
FIG. 22 is a pattern layout drawing showing the fourth embodiment according to the present invention.
Figure 23:
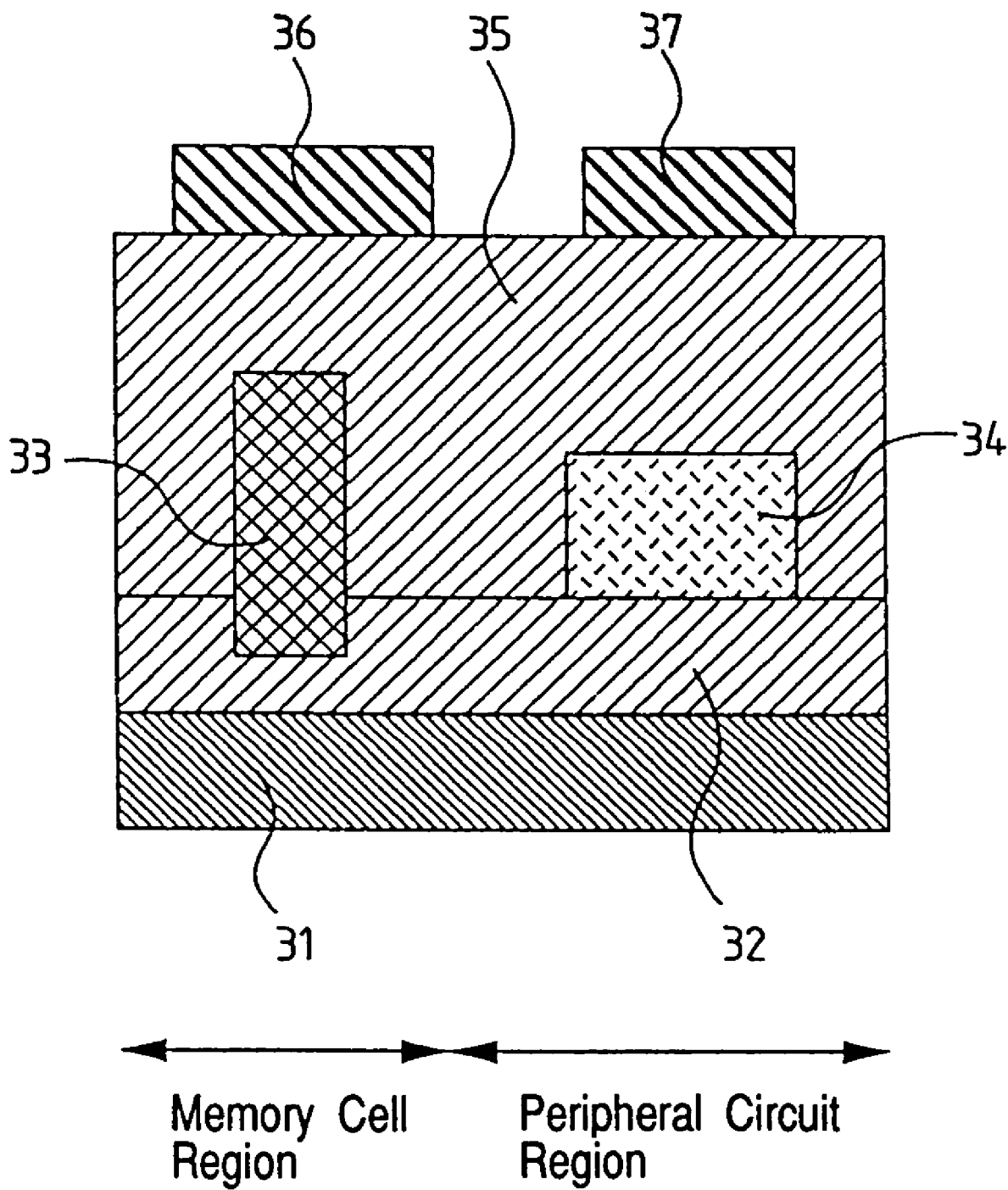
FIG. 23 is a sectional view for explaining constitution according to the present invention.

The area of a memory cell can be reduced by such layout, however, the global word lines W11 to W17 arranged in the ratio of one to two word lines in the first to third embodiments are required to be arranged according to the same design rule as word lines W1 to W7 as shown in FIG. 22. However, they can be readily formed by the same method as in the first embodiment and there is no problem in relation to practical use.

FIFTH EMBODIMENT

This embodiment is an example in which the present invention is applied to a DRAM and will be described below referring to FIGS. 24 to 38.

Figure 24:
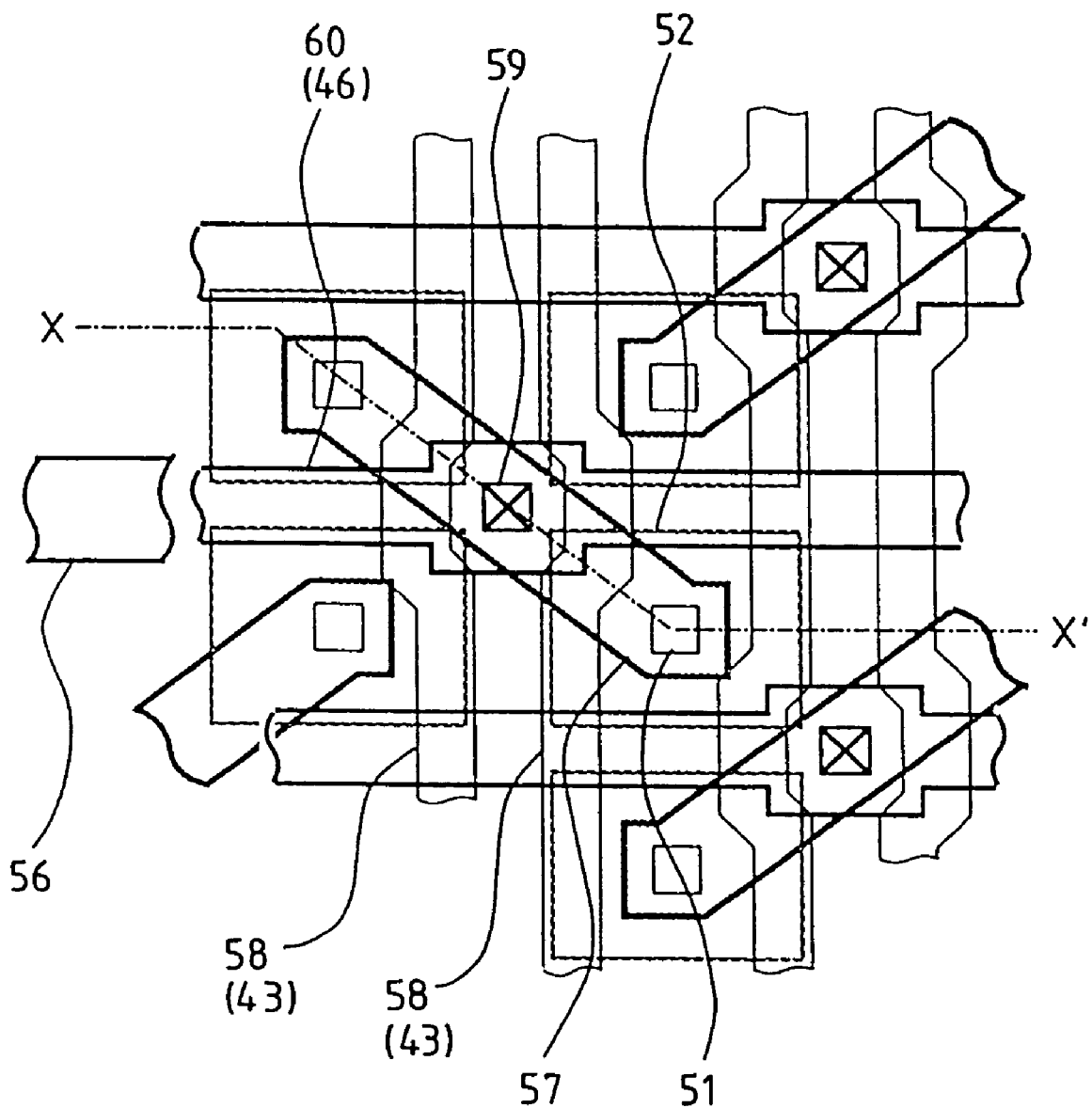
FIG. 24 is a plan showing a fifth embodiment according to the present invention.
Figure 25:
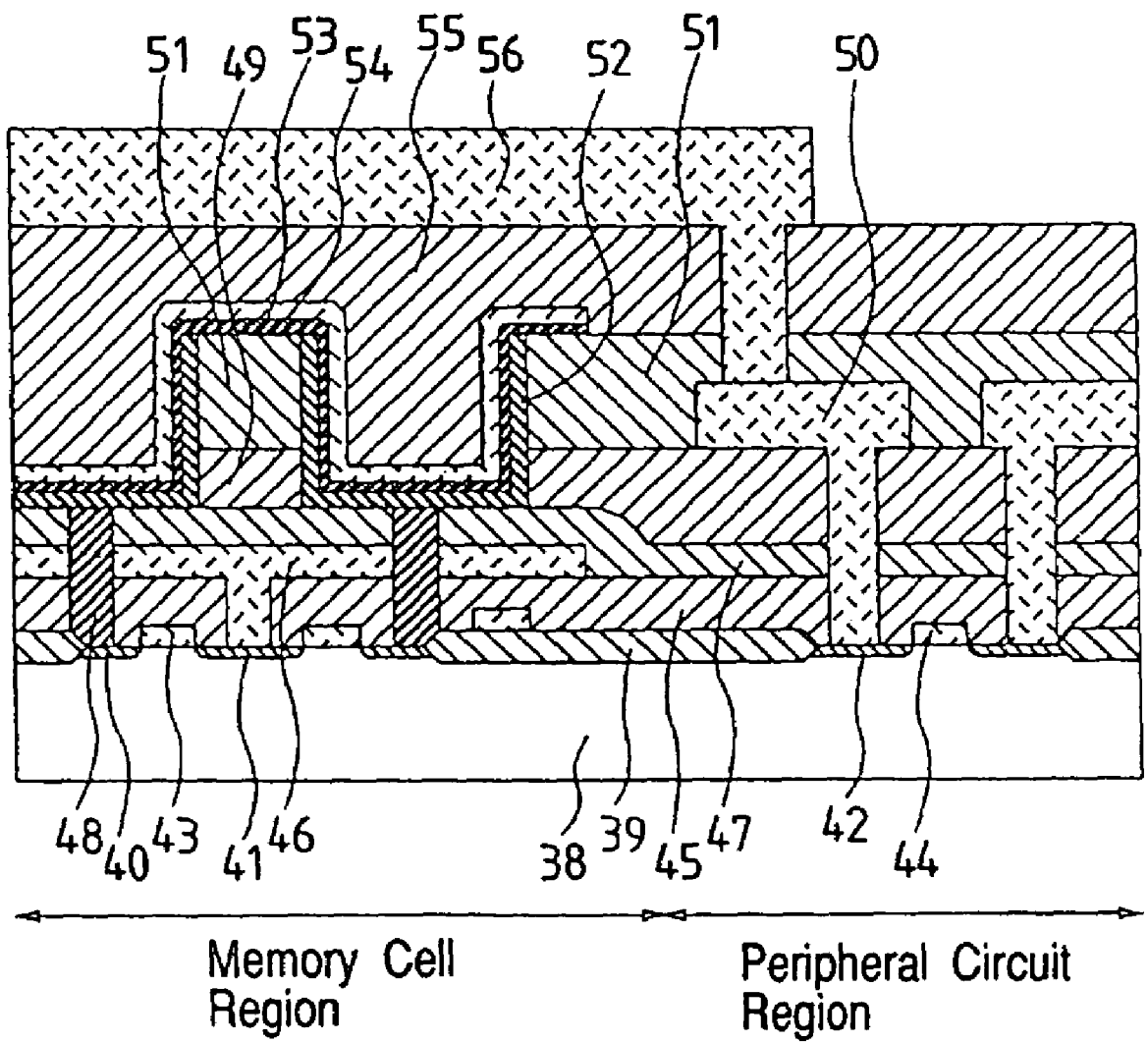
FIG. 25 is a sectional view showing the fifth embodiment according to the present invention.

FIG. 24 is a plan showing a memory cell equivalent to this embodiment and the sectional structure viewed along a line X-X' and the sectional structure of a MOSFET in peripheral circuit are shown in FIG. 25. The layout of a memory cell is similar to the prior one, a word line 58 is provided vertically, a data line 60 is provided horizontally and a trench-type capacitor is formed above these word line and data line.

The trench-type capacitor consists of a storage electrode 52, a capacitor dielectric film 53 and a plate electrode 54. The storage electrode 52 is connected to the active area 57 of a switching transistor in clearance between the word lines 58 and the data lines 60 and the plate electrode 54 is fixed to predetermined potential outside a memory cell. Further, the trench-shaped storage electrode 52 is formed on the inner side walls and at the bottom of a deep trench formed through an dielectric film 49 on which the metal wiring 50 of the peripheral circuit is formed and an dielectric film 51 stacked on the dielectric film.

Figure 26:
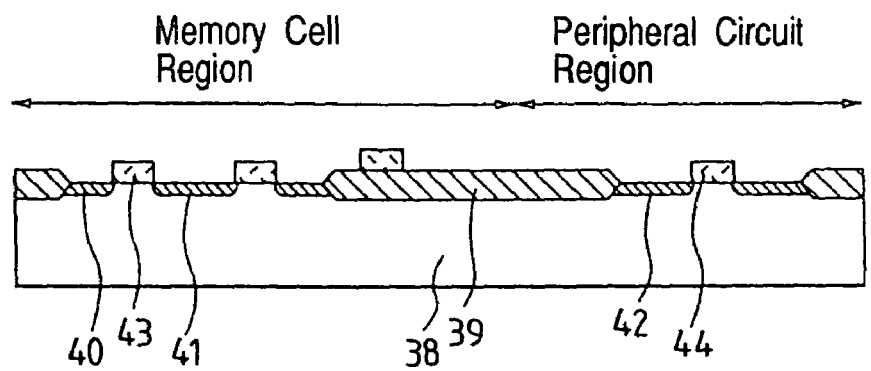
FIG. 26 is a process drawing showing the fifth embodiment according to the present invention.

Next, a method of manufacturing a DRAM equivalent to this embodiment will be described referring to FIGS. 26 to 35. First, as shown in FIG. 26, after a field oxide film 39 for device isolation is formed on a silicon substrate 38 by well-known selective oxidation, a MOSFET is formed by a well-known method. A MOSFET provided with high concentration impurity doped regions 40 and 41, a gate electrode 43 and a gate dielectric film not shown is formed in a memory cell and a MOSFET provided with a high concentration impurity doped region 42, a gate electrode 44 and a gate dielectric film not shown is formed in peripheral circuit. The gate electrode 43 shared by the memory cell and the adjacent cell functions as a word line 58 shown in FIG. 24. The polarity of such MOSFET may be N- channel or P-channel.

Figure 27:
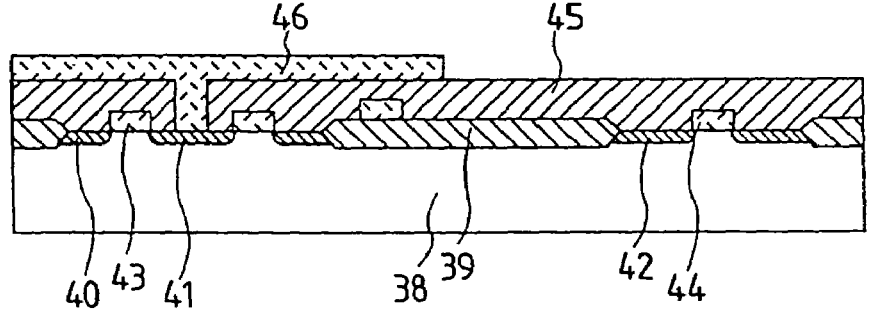
FIG. 27 is a process drawing showing the fifth embodiment according to the present invention.

As shown in FIG. 27, a silicon oxide film 45 including boron and phosphorus is formed by well-known CVD and the surface is flattened by annealing at the temperature of approximately 800° C. For the silicon oxide film 45, an undoped silicon oxide film may be used in place of the one including boron and phosphorus.

Next, an opening 59 shown in FIG. 24 is formed on the silicon oxide film 45 by well-known photolithography and dry etching and wiring 46 with the thickness of approximately 100 nm which functions as the data line 60 shown in FIG. 24 is formed by a well-known method. For the material of the wiring 46, a refractory metal film such as tungsten film is desirable, however, a compound film consisting of the silicide film of refractory metal such as tungsten and a polycrystalline silicon film may be also used. If refractory metal such as tungsten is used, it is desirable that a barrier metal film such as titanium nitride film is provided under the refractory metal film so as to prevent reaction upon the silicon substrate. It is also desirable that an undoped silicon oxide film for preventing impurities from being diffused is formed under the silicon oxide film 45.

Figure 28:
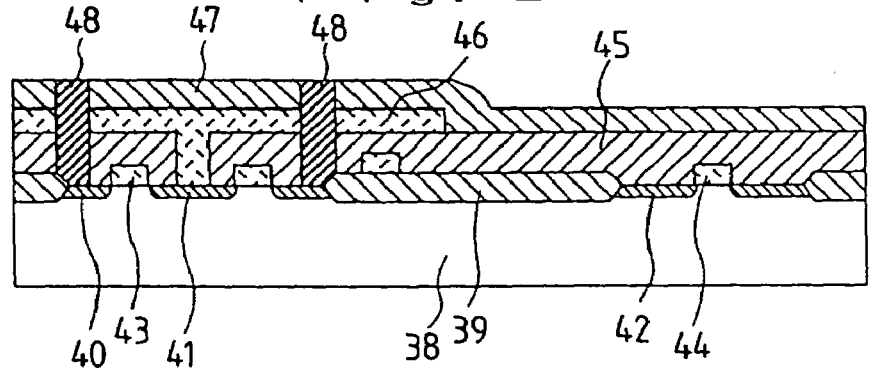
FIG. 28 is a process drawing showing the fifth embodiment according to the present invention.

As shown in FIG. 28, a silicon oxide film 47 with the thickness of approximately 200 nm is formed by well-known CVD using tetraethoxysilane (TEOS) gas at the temperature of approximately 400° C. Next, a predetermined portion of the silicon oxide films 45 and 47 on the high concentration impurity doped region 40 which functions as the source or drain of a switching transistor is removed to form an opening 51 shown in FIG. 24. After a polycrystalline silicon film approximately 200 nm thick including impurities at high concentration is formed by well-known low-pressure chemical vapor deposition (LPCVD), the polycrystalline silicon film is left only in the opening 51 and the other portion is removed by etchback employing anisotropic dry-etching without mask so that a silicon plug 48 for filling the opening 51 is formed. In this embodiment, the silicon plug 48 is directly formed on the high concentration impurity region 40. However, if a well-known pad of a polycrystalline silicon film is used, the gate electrode 43 and the silicon plug 48 can be insulated by self-alignment and the method is effective to reduce the area of a memory cell.

Figure 29:
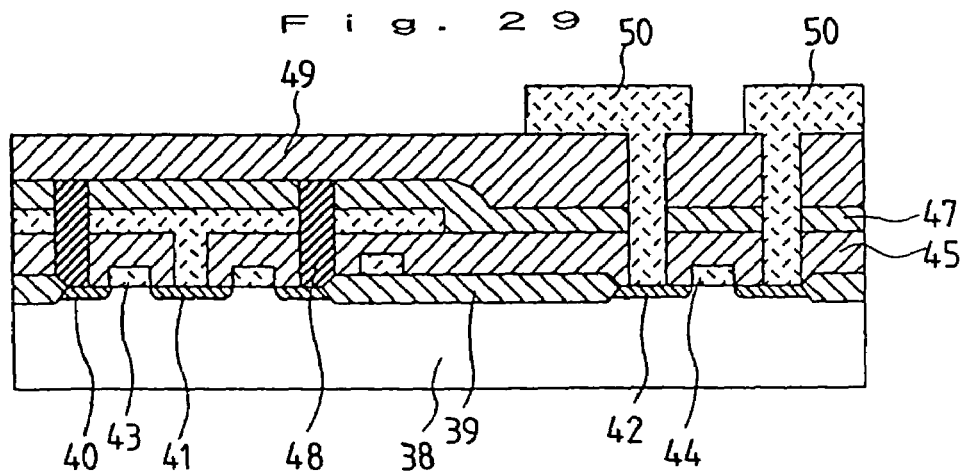
FIG. 29 is a process drawing showing the fifth embodiment according to the present invention.

As shown in FIG. 29, a silicon oxide film 49 with the thickness of approximately 200 nm is formed by CVD using well-known TEOS gas at the temperature of approximately 400° C. and a contact hole through the silicon oxide films 45, 47 and 49 is formed by a well-known method and the surface so as to expose the surface of the highly concentrated impurity region 42 in the peripheral circuit. Next, a tungsten film 200 nm thick is formed by well-known sputtering or CVD and is patterned so that it is in a predetermined shape so as to form the metal wiring 50 of the peripheral circuit. The surface of the silicon oxide film 49 may be flattened by well-known CMP and in this case, a plug for filling the contact hole may be used. In this embodiment, tungsten is used for the material of the metal wiring 50, however, refractory metal such as titanium nitride may be also used. Further, if a capacitor is manufactured at low temperature, not only refractory metal but low resistivity metal such as aluminum can be used.

Figure 30:
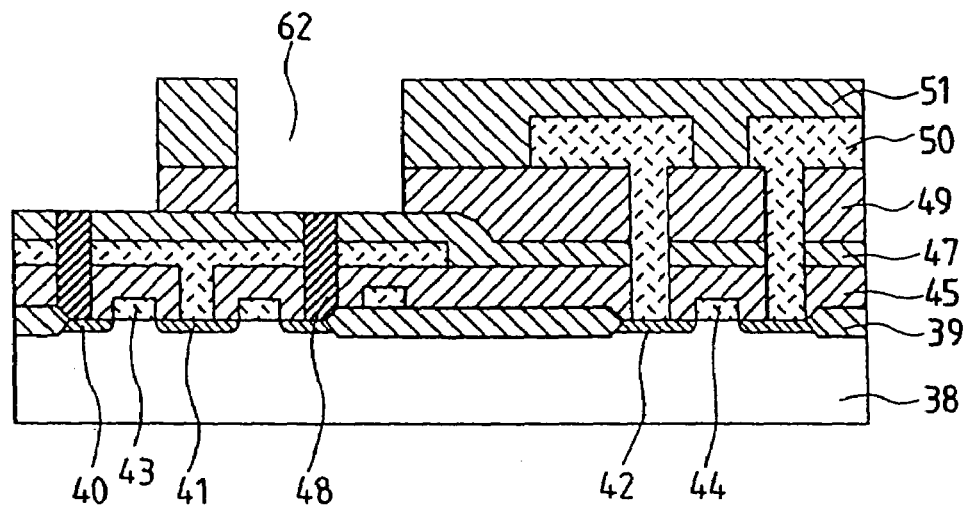
FIG. 30 is a process drawing showing the fifth embodiment according to the present invention.

As shown in FIG. 30, a silicon oxide film 51 with the thickness of approximately 0.5 to 1 μm is formed by CVD using well-known TEOS gas at the temperature of approximately 400° C. and the surface is flattened by well-known CMP. Next, a trench (opening) 62 reaching the silicon plug 48 is formed through the silicon films 49 and 51 by well-known photolithography and dry etching. At this time, if an dielectric film such as a silicon nitride film slower than a silicon oxide film in an etching rate is formed under the silicon oxide film 49 as an etching stopper, the trench can be extremely readily formed.

Figure 31:
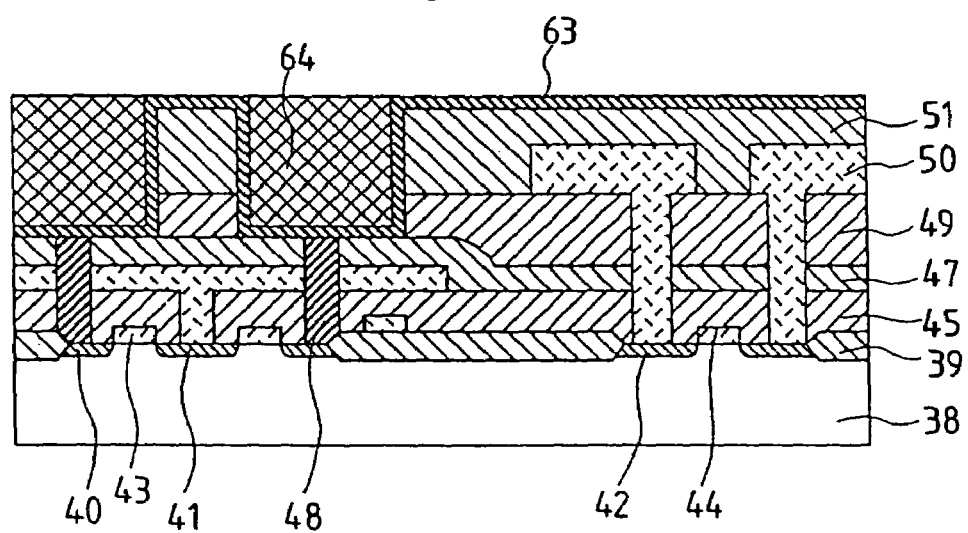
FIG. 31 is a process drawing showing the fifth embodiment according to the present invention.

As shown in FIG. 31, a polycrystalline silicon film 63 with the thickness of 50 nm doped with high-density impurities is formed by well-known LPCVD. At this time, the silicon plug 48 and the polycrystalline silicon film 63 are connected at the low part of the trench.

Next, after a photoresist film approximately 1 µm thick is applied overall, the photoresist 64 is left only in the trench and that in the other portion is removed by etchback by anisotropic dry etching.

Figure 32:
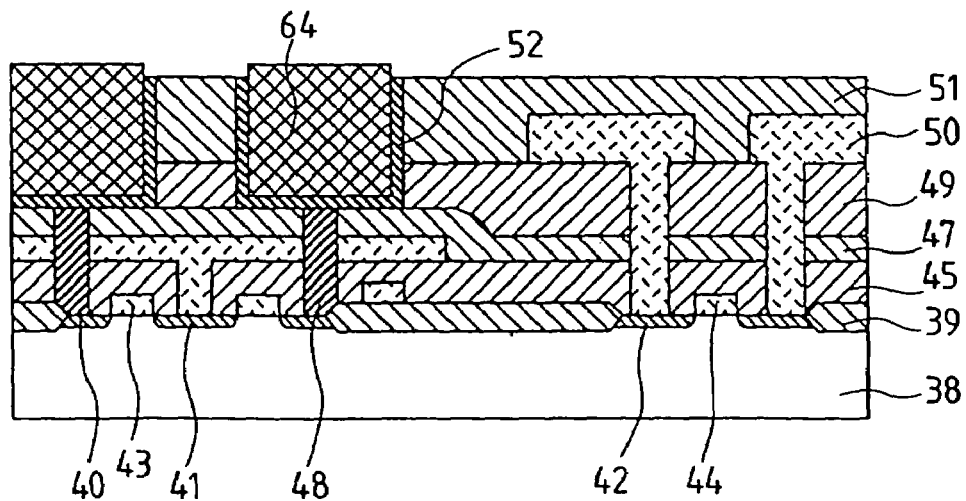
FIG. 32 is a process drawing showing the fifth embodiment according to the present invention.

As shown in FIG. 32, the polycrystalline silicon film 63 formed on a portion other than in the trench is removed by dry etching using the photoresist 64 as a mask and as a result, the storage electrode 52 of the capacitor is formed on the inner wall of the trench.

Figure 33:
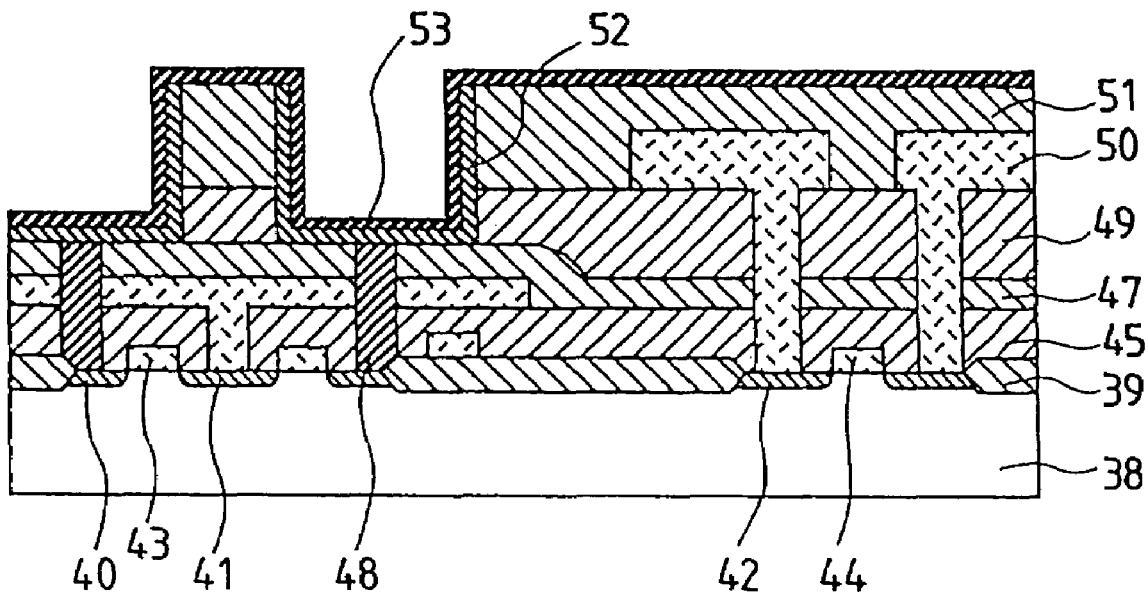
FIG. 33 is a process drawing showing the fifth embodiment according to the present invention.

As shown in FIG. 33, after the photoresist 64 is removed, a capacitor dielectric film 53 consisting of tantalum pentoxide ($Ta_2O_5$) is formed by CVD. It is desirable that the thickness of this capacitor dielectric film 53 in terms of a silicon oxide film is 3 nm or less in the case of a dynamic RAM in the gigabit range. In this embodiment, a polycrystalline silicon film is used for the storage electrode 52, however, a refractory metal film such as tungsten and a titanium nitride film may be also used. In this case, as a natural oxide film is not formed on the surface of the refractory metal film as a polycrystalline silicon film, the equivalent oxide thickness can be thinned. For the material of the capacitor dielectric film, a film consisting of $SrTiO_3$, a well-known high dielectric dielectric film such as $(Ba, Sr)TiO_3$ and a well-known ferroelectrics dielectric film such as a PZT film can be also used in addition to an dielectric film consisting of silicon nitride.

Figure 34:
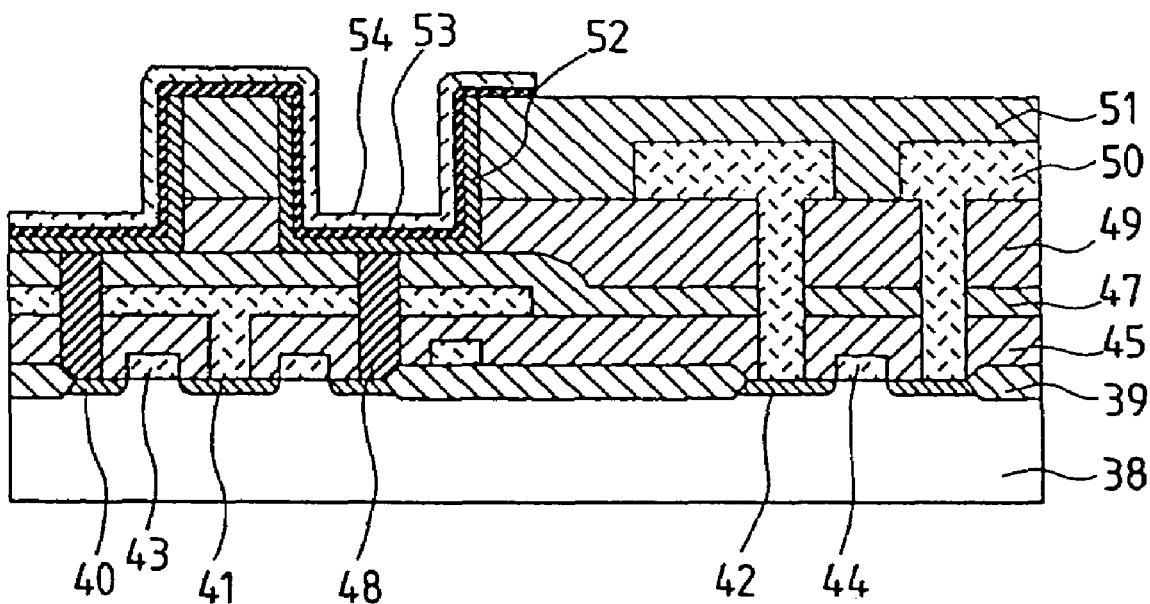
FIG. 34 is a process drawing showing the fifth embodiment according to the present invention.

As shown in FIG. 34, a plate electrode 54 consisting of a tungsten film approximately 50 nm thick is formed by CVD which is excellent in step coverage.

Finally, a silicon oxide film 55 with the thickness of approximately 400 nm is formed as an interlayer dielectric film and after a through hole is formed through the interlayer dielectric film 55 on the metal wiring 50 of the peripheral circuit, metal wiring 56 is formed by a well-known method and a semiconductor integrated circuit shown in FIG. 25 is completed. For the metal wiring 56, low-resistance metal such as aluminum is desirable and as the metal wiring can be used as wiring in a memory cell array shown in FIG. 35, it can be used as a signal line connected to a data line and a main word line. As the surface of the interlayer dielectric film 55 is flattened when the metal wiring 56 is formed, well-known plug technology and CMP can be applied.

Figure 35:
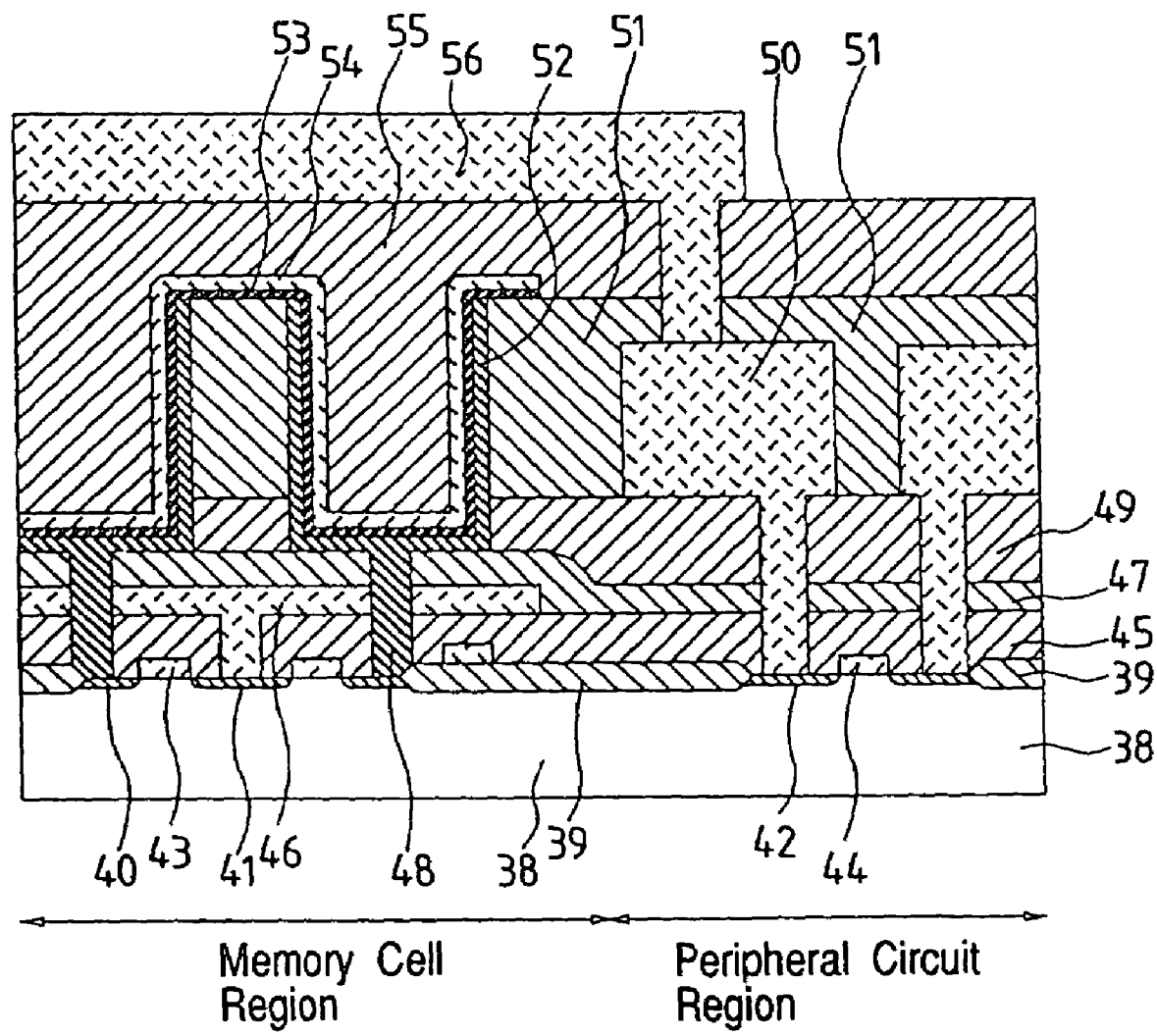
FIG. 35 is a sectional view showing the fifth embodiment according to the present invention.

FIG. 35 shows an example in which the trench is deepened more than that shown in FIG. 25 and the capacity of the capacitor is increased. In this case, the metal wiring 50 is twice as thick as that shown in FIG. 25. However, if the silicon oxide film 51 formed thereon is thickened, the trench can be also deepened twice and as a result, the height of a storage electrode and the quantity of stored charge are also approximately doubled.

Figure 36:
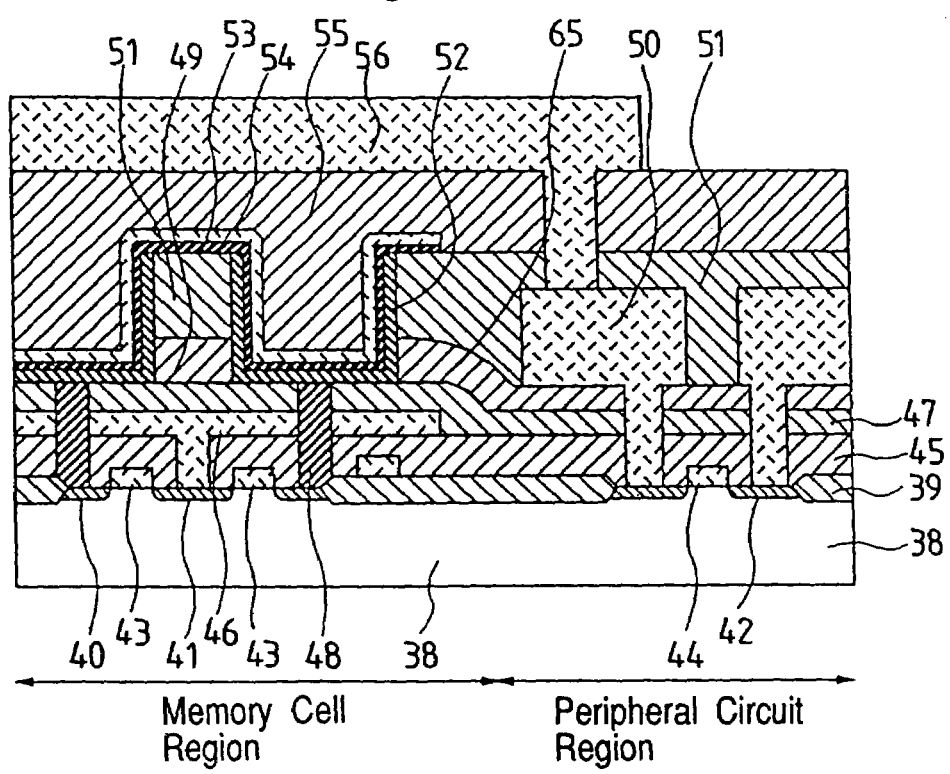
FIG. 36 is a sectional view showing the fifth embodiment according to the present invention.

As shown in FIGS. 25 to 35, the surface of the silicon oxide film 49 which functions as an interlayer dielectric film and on which the metal wiring 50 is formed is flattened. However, as shown in FIG. 36, the metal wiring 50 may be also formed on a silicon oxide film 65 the surface of which is not flat. Also in this case, as shown in FIG. 36, as the upper face of the silicon oxide film 65 is extended to a position in which a capacitor is formed and is in contact with the side of the storage electrode 52, the same effect can be obtained as a case shown in FIG. 35 in which the surface of the silicon oxide film 49 on which the metal wiring 50 is formed is flat.

Figure 37:
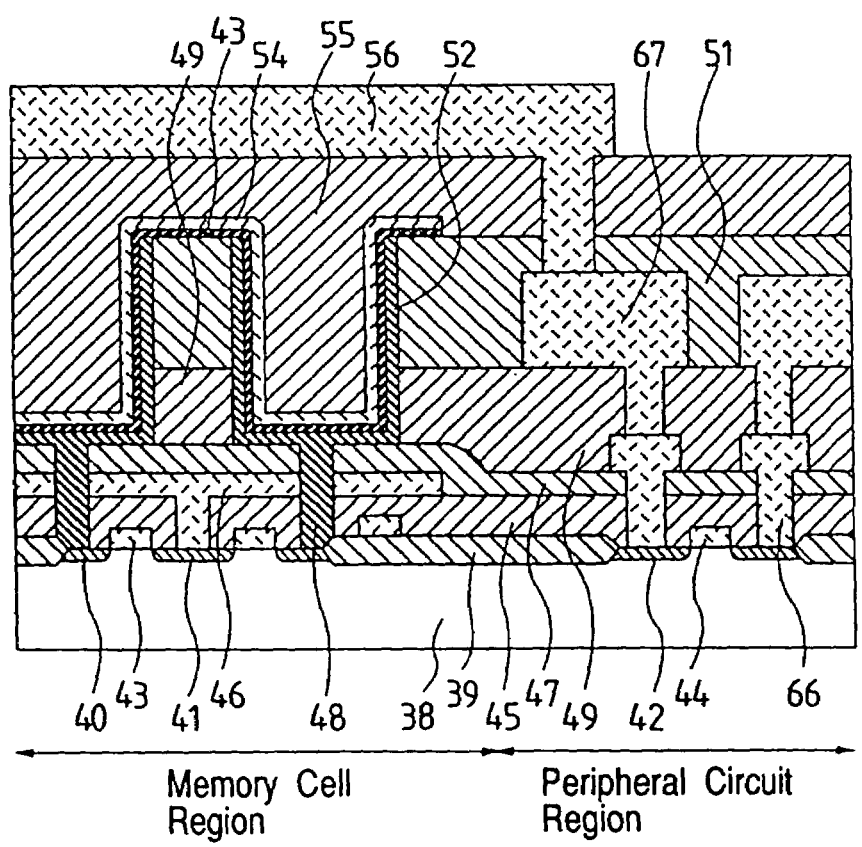
FIG. 37 is a sectional view showing the fifth embodiment according to the present invention.

Further, the metal wiring 50 is the first wiring layer in the peripheral circuit. However, as shown in FIG. 37, two metal wirings 66 and 67 may be also stacked and a wiring layer may also be formed on the wirings 66 and 67.

As the upper face of plural wiring layers can be extended to the position of a capacitor according to this embodiment, a trench can be deepened extremely and a trench-type capacitor the area of the electrode of which is extremely large can be formed.

In this embodiment, the metal wiring 50 is a signal line connected to the source or the drain of a MOSFET in the peripheral circuit. However, the metal wiring 50 may also be a power line for supplying fixed potential and may serve as a dummy pattern for reducing step height between a memory cell array area and a peripheral circuit area.

As clear from the description, according to this embodiment, a capacitor with high stereoscopic structure can be formed and as minute wiring can be respectively formed in each area and an area including both areas even if large step height exists between the memory cell array area and the peripheral circuit area, a semiconductor integrated circuit the degree of integration of which is high can be formed.

SIXTH EMBODIMENT

This embodiment is an example using material which cannot be etched such as copper as metal wiring material in the fifth embodiment and will be described below referring to FIGS. 38 to 47.

Figure 38:
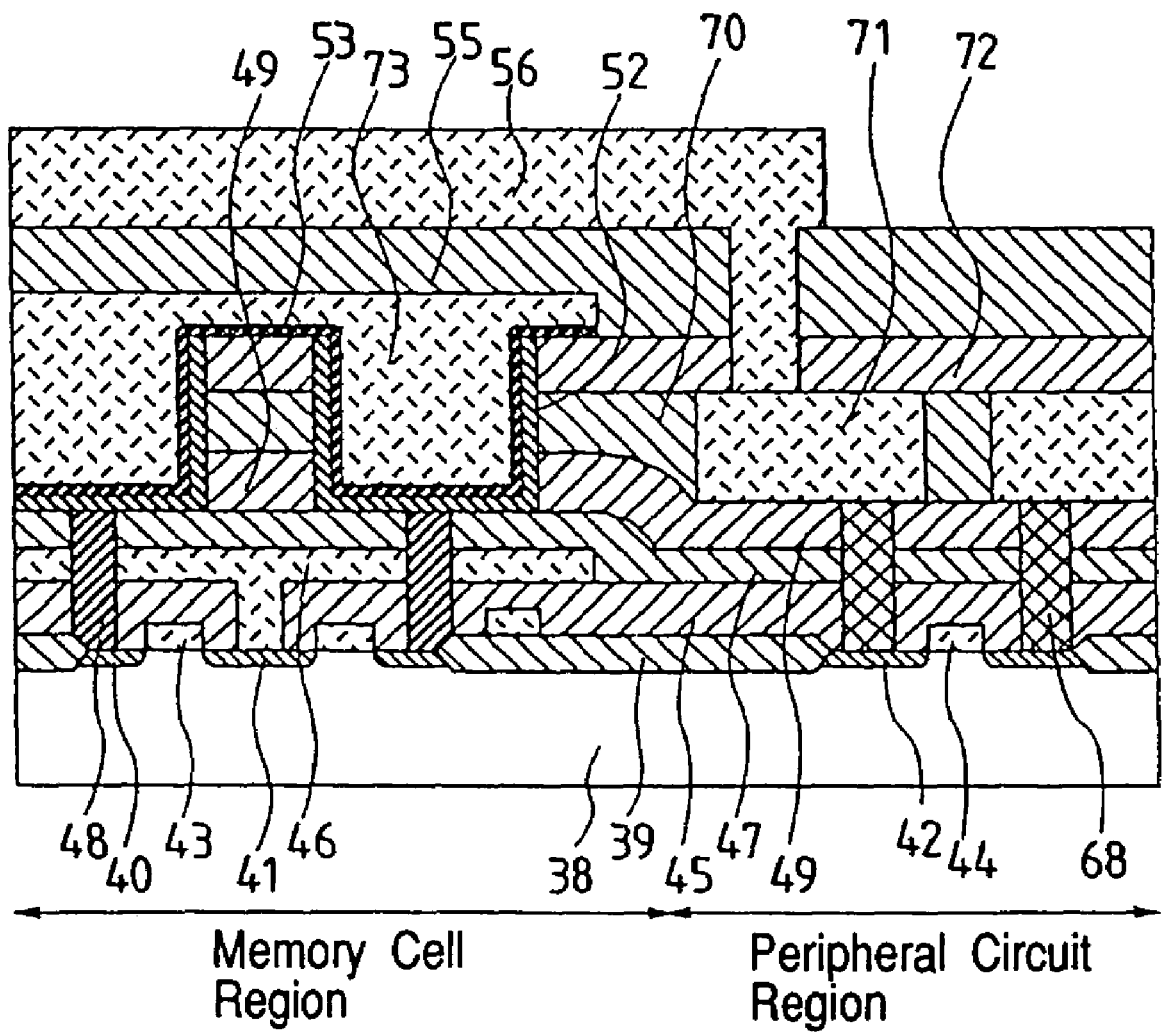
FIG. 38 is a sectional view showing a sixth embodiment according to the present invention.

FIG. 38 shows the sectional structure of a MOSFET in a memory cell and peripheral circuit in a DRAM equivalent to this embodiment. As shown in FIG. 38, metal wiring 71 is connected to a metallic plug 68 formed on a highly concentrated impurity doped region 42 and buried in a silicon oxide film 70.

Figure 39:
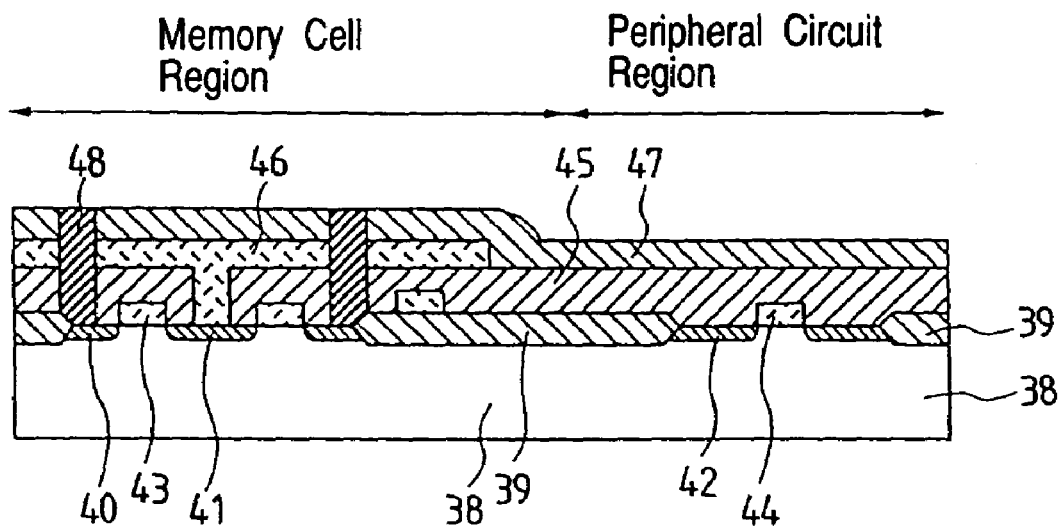
FIG. 39 is a process drawing showing the sixth embodiment according to the present invention.
Figure 40:
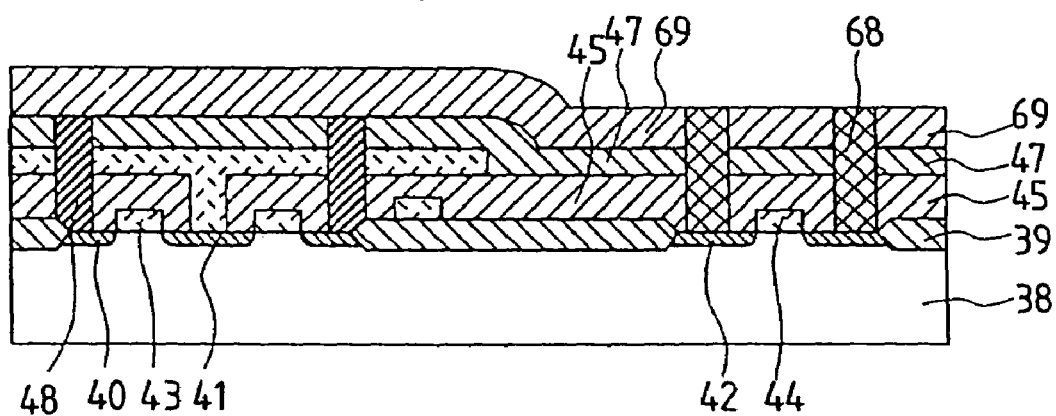
FIG. 40 is a process drawing showing the sixth embodiment according to the present invention.

A DRAM with such structure is formed as follows:

First, structure shown in FIG. 39 is formed by the same method as the one shown in FIGS. 26 to 28 in relation to the fifth embodiment. Next, as shown in FIG. 40, after a silicon oxide film 69 is formed, a connecting hole through the silicon oxide films 45, 47 and 69 is formed by a well-known method and as a result, the surface of the highly concentrated impurity doped region 42 is exposed. After a tungsten film is formed overall, only the portion formed in the connecting hole of the tungsten film is left and the other portion is removed by anisotropic dry-etching without mask to form the metallic plug 68 consisting of tungsten.

Figure 41:
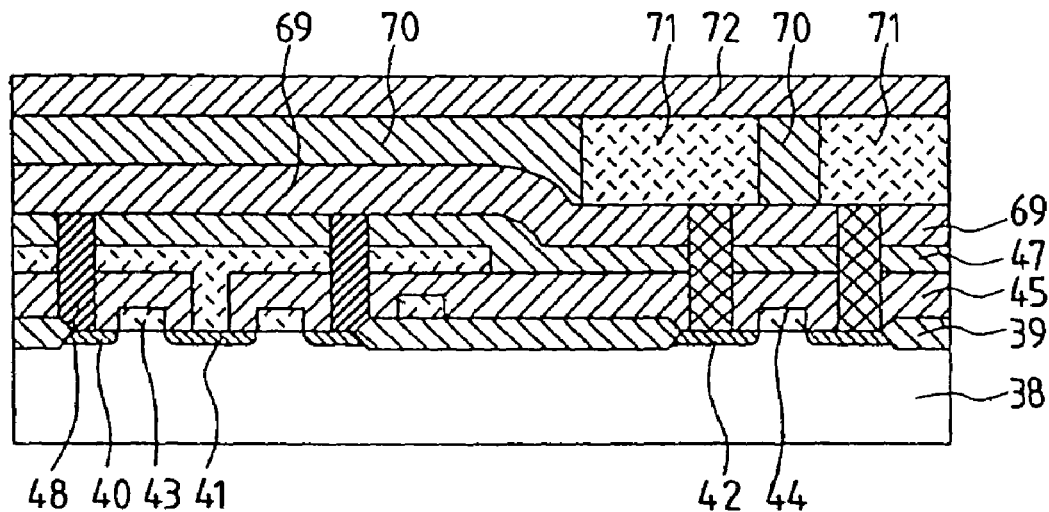
FIG. 41 is a process drawing showing the sixth embodiment according to the present invention.

As shown in FIG. 41, a silicon oxide film 70 with the thickness of 400 nm is formed and an opening is formed through the silicon oxide film 70 by well-known photolithography and anisotropic dry etching. If a silicon nitride film formed at low temperature is arranged under the silicon oxide film 70 as an etching stopper film in the anisotropic dry etching, the tolerance of etching is increased and the connecting hole can be formed with high precision. Next, after a copper film 500 nm thick is formed, the surface of the copper film is polished by CMP to flatten it until the surface of the silicon oxide film 70 is exposed, the copper film 71 is left only in the opening and as a result, the structure in which the copper film 71 is buried in the silicon oxide film 70 is formed. For a method of forming the copper film, CVD which is excellent in covering step height is used.

Figure 42:
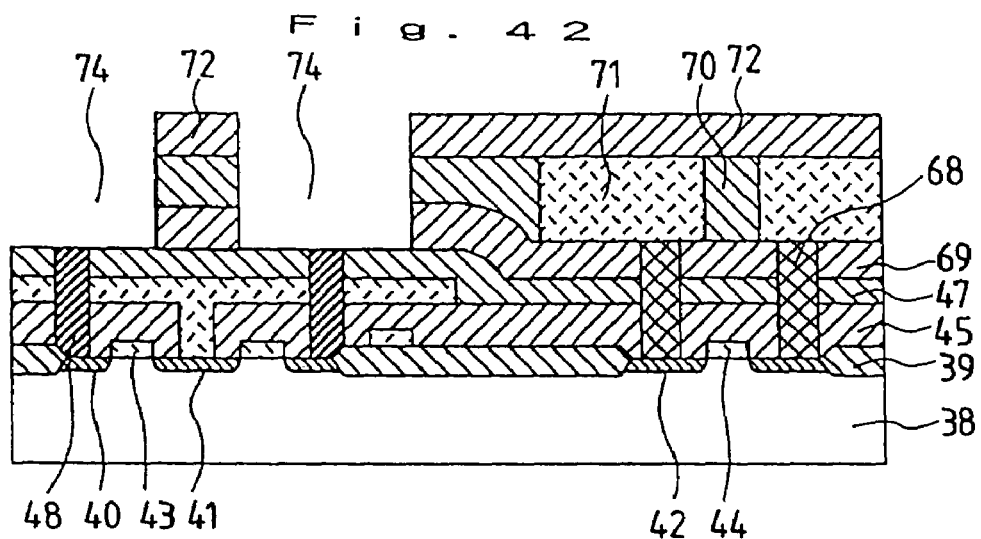
FIG. 42 is a process drawing showing the sixth embodiment according to the present invention.
Figure 43:
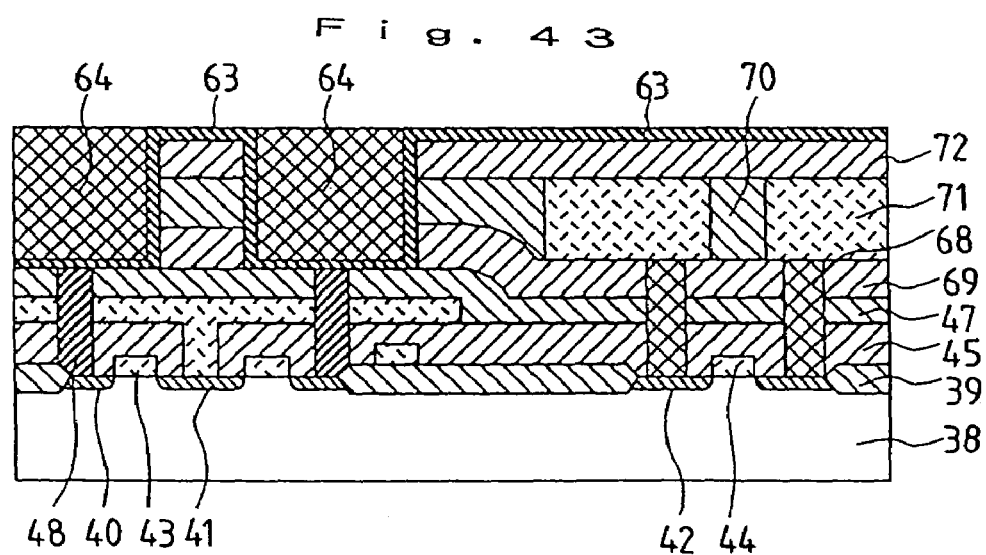
FIG. 43 is a process drawing showing the sixth embodiment according to the present invention.
Figure 44:
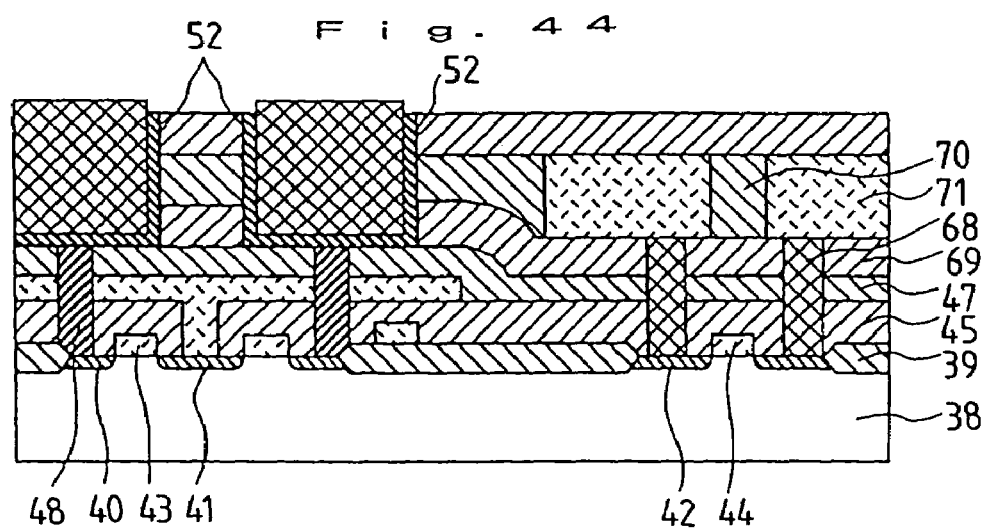
FIG. 44 is a process drawing showing the sixth embodiment according to the present invention.
Figure 45:
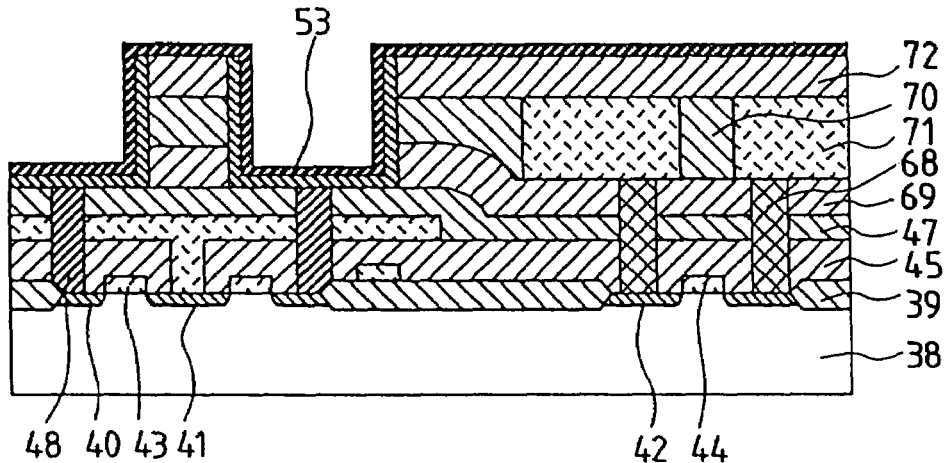
FIG. 45 is a process drawing showing the sixth embodiment according to the present invention.
Figure 46:
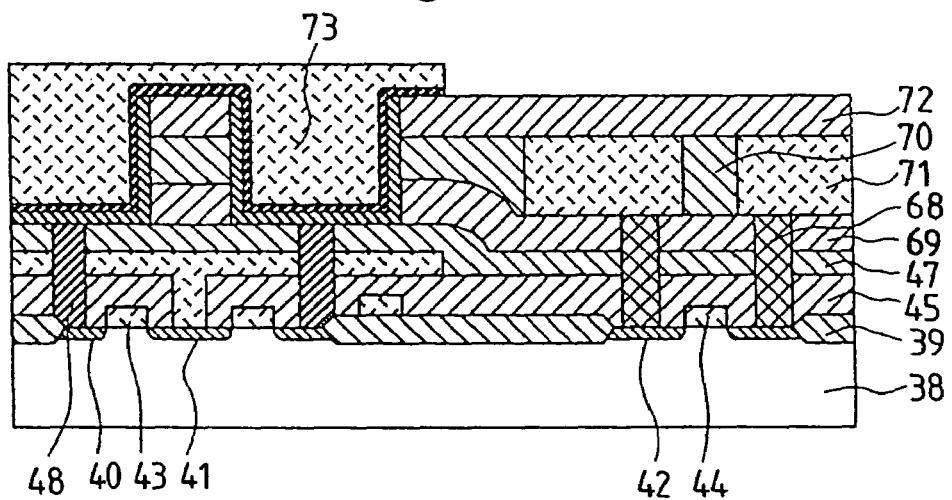
FIG. 46 is a process drawing showing the sixth embodiment according to the present invention.
Figure 47:
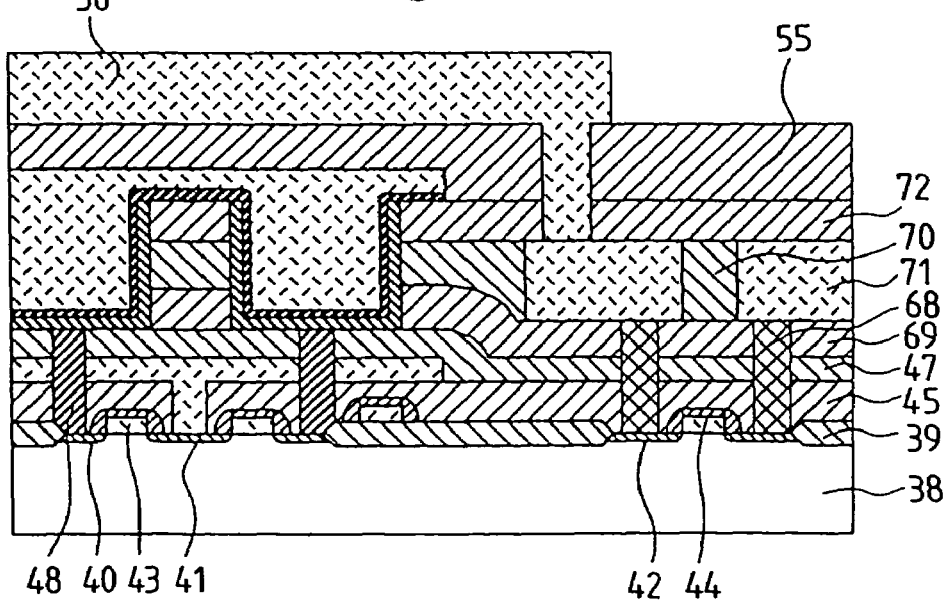
FIG. 47 is a process drawing showing the sixth embodiment according to the present invention.

Next, as shown in FIG. 42, a silicon oxide film 72 with the thickness of 100 nm is formed by well-known CVD, a trench 74 reaching the silicon plug 48 through the silicon oxide films 69, 70 and 72 is formed by well-known photolithography and anisotropic dry etching.

Processing is performed in a process shown in FIGS. 43 to 47, however, as this process is the same as in the fifth embodiment shown in FIGS. 31 to 35, detailed description is omitted. However, in this embodiment, the surface of a plate electrode 73 is flattened and this embodiment is different from the fifth embodiment in this point.

As low-resistance copper is used for the wiring layer of the peripheral circuit formed on the side of a capacitor according to this embodiment, high-speed operation is enabled. The wiring layer of a logical circuit can be formed in the position of an dielectric film on which the capacitor is formed by applying this embodiment to an on-chip logic LSI embedded with memory.

SEVENTH EMBODIMENT

Figure 48:
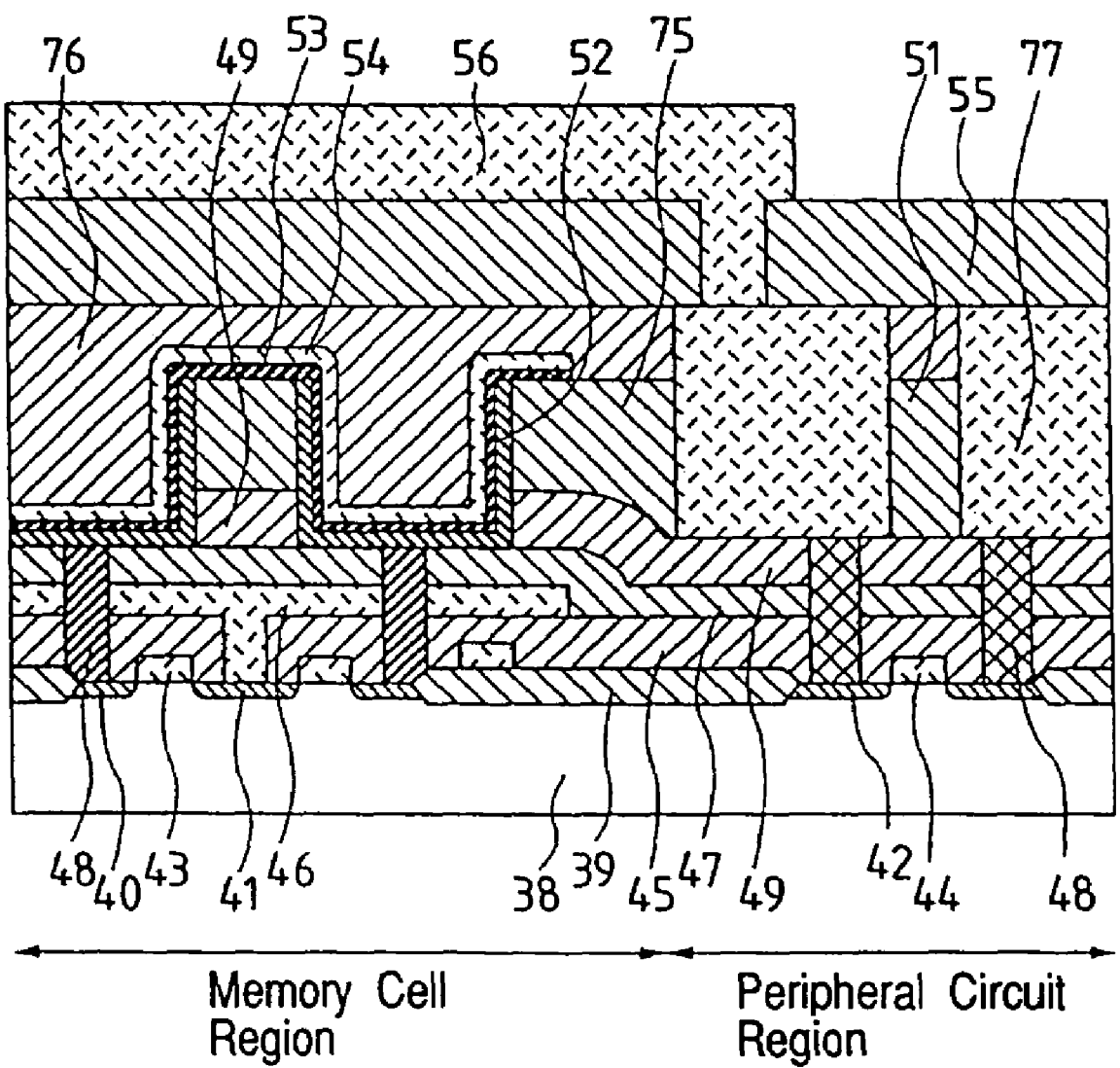
FIG. 48 is a sectional view showing a seventh embodiment according to the present invention.
Figure 49:
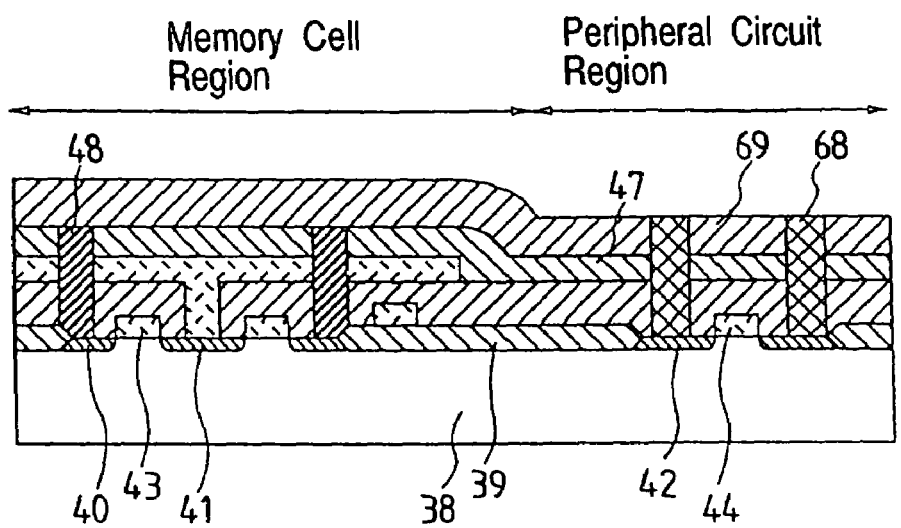
FIG. 49 is a process drawing showing the seventh embodiment according to the present invention.

This embodiment is an example in which the metal wiring in the DRAM equivalent to the fifth or sixth embodiment is further thickened and will be described below referring to FIGS. 48 to 56. FIG. 48 is a sectional structural drawing showing a MOSFET in a memory cell and peripheral circuit in a DRAM equivalent to this embodiment. As shown in FIG. 48, in this embodiment, metal wiring 77 is buried in silicon oxide films 75 and 76 and the upper face of the metal wiring 77 is higher than the upper end of a capacitor.

A method of manufacturing such a DRAM will be described below referring to FIGS. 49 to 56. First, processing is performed as shown in FIGS. 39 and 40 in relation to the sixth embodiment to form structure shown in FIG. 49.

Figure 50:
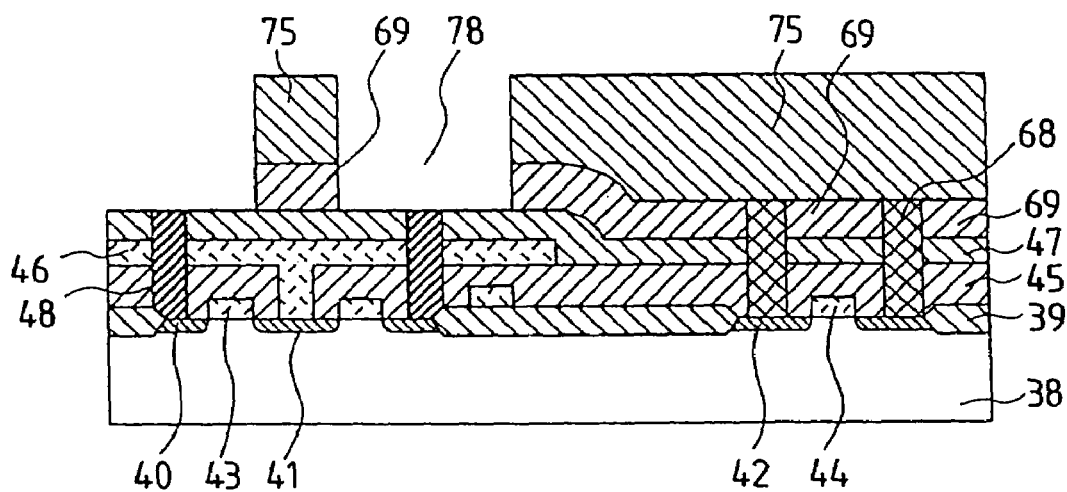
FIG. 50 is a process drawing showing the seventh embodiment according to the present invention.
Figure 51:
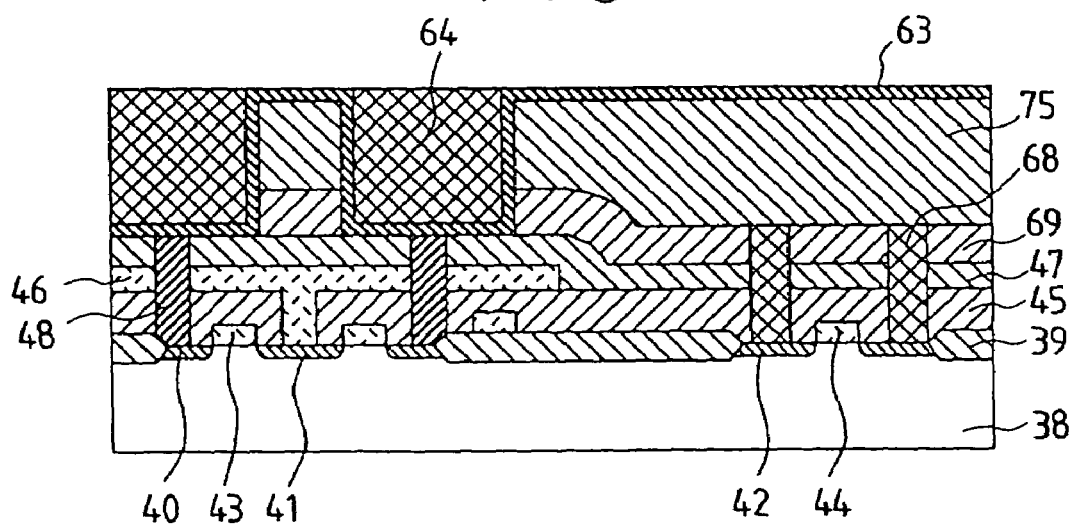
FIG. 51 is a process drawing showing the seventh embodiment according to the present invention.
Figure 52:
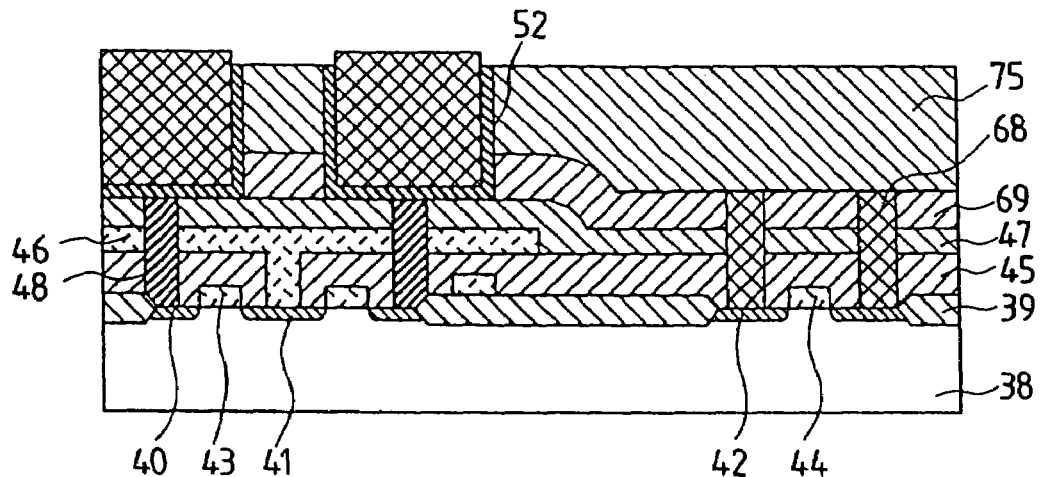
FIG. 52 is a process drawing showing the seventh embodiment according to the present invention.
Figure 53:
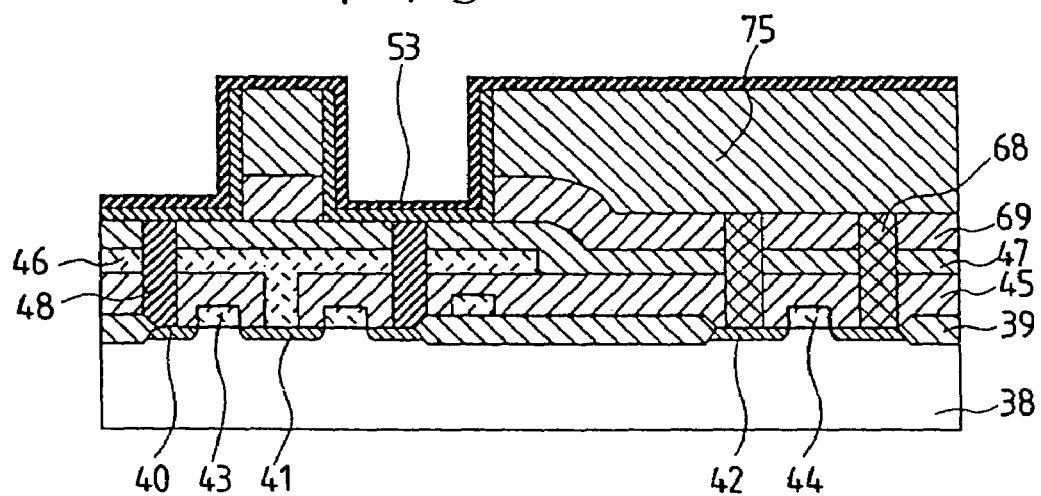
FIG. 53 is a process drawing showing the seventh embodiment according to the present invention.
Figure 54:
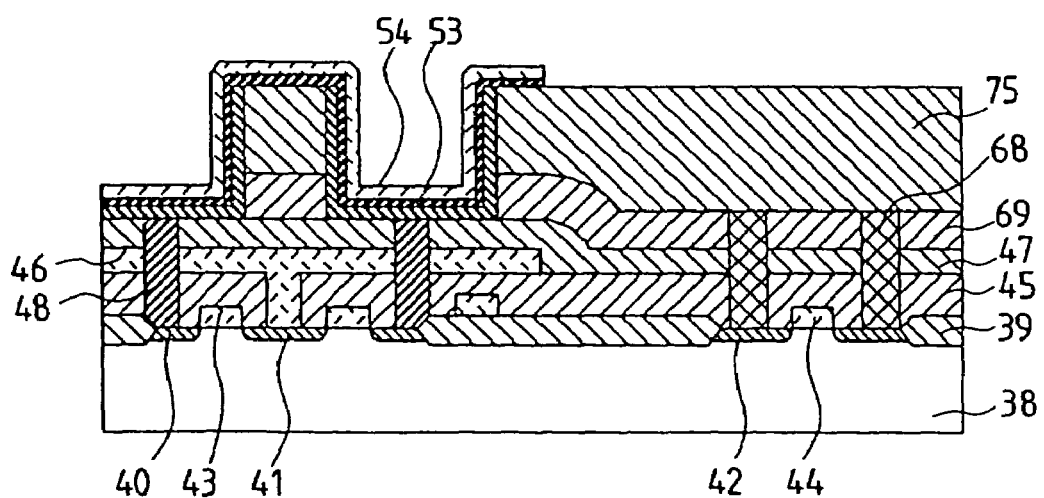
FIG. 54 is a process drawing showing a seventh embodiment according to the present invention.

Next, as shown in FIG. 50, a silicon oxide film 75 with the thickness of 300 nm is formed and a trench 78 through silicon oxide films 69 and 75 is formed by well-known photolithography and dry etching to expose the upper face of the silicon plug 48.

A capacitor is formed in a process shown in FIGS. 51 to 54, however, as this process is the same as the process shown in FIGS. 31 to 34 in relation to the fifth embodiment, detailed description is omitted.

Figure 55:
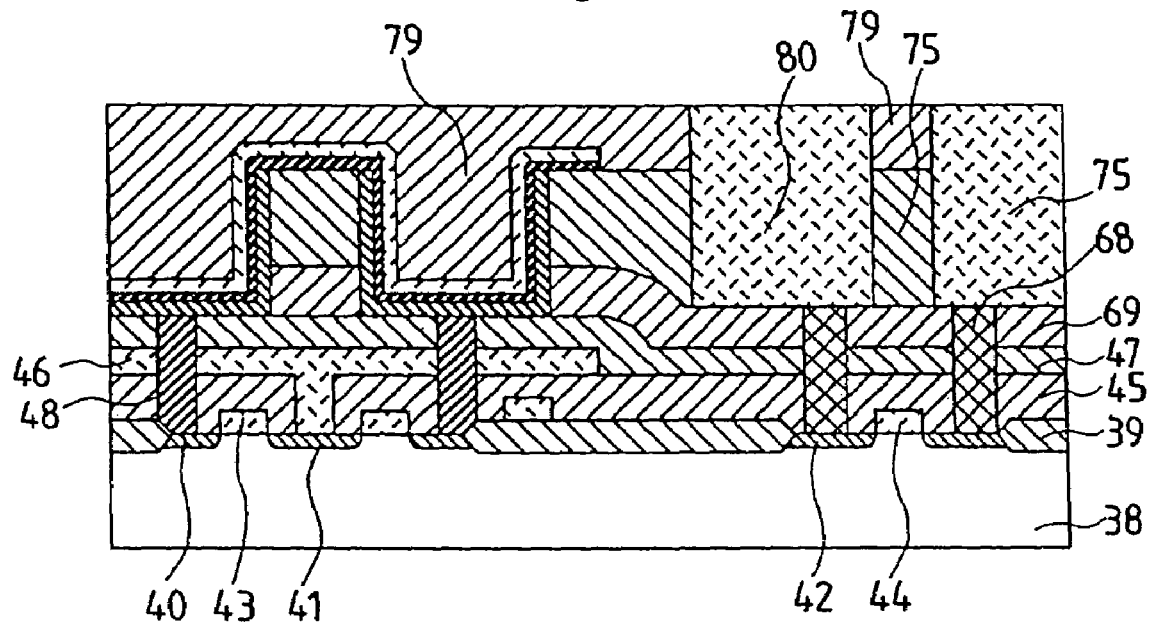
FIG. 55 is a process drawing showing the seventh embodiment according to the present invention.

Next, as shown in FIG. 55, after a silicon oxide film 79 with the thickness of 400 nm is formed, an opening reaching a metallic plug 68 is formed through the silicon oxide films 75 and 79 by photolithography and dry etching. After a film consisting of metallic material such as tungsten, aluminum or copper is formed overall, the metal wiring 80 of the peripheral circuit is formed by leaving the metal film only in the opening and removing the metal film from the other portion by well-known etchback by anisotropic etching.

Figure 56:
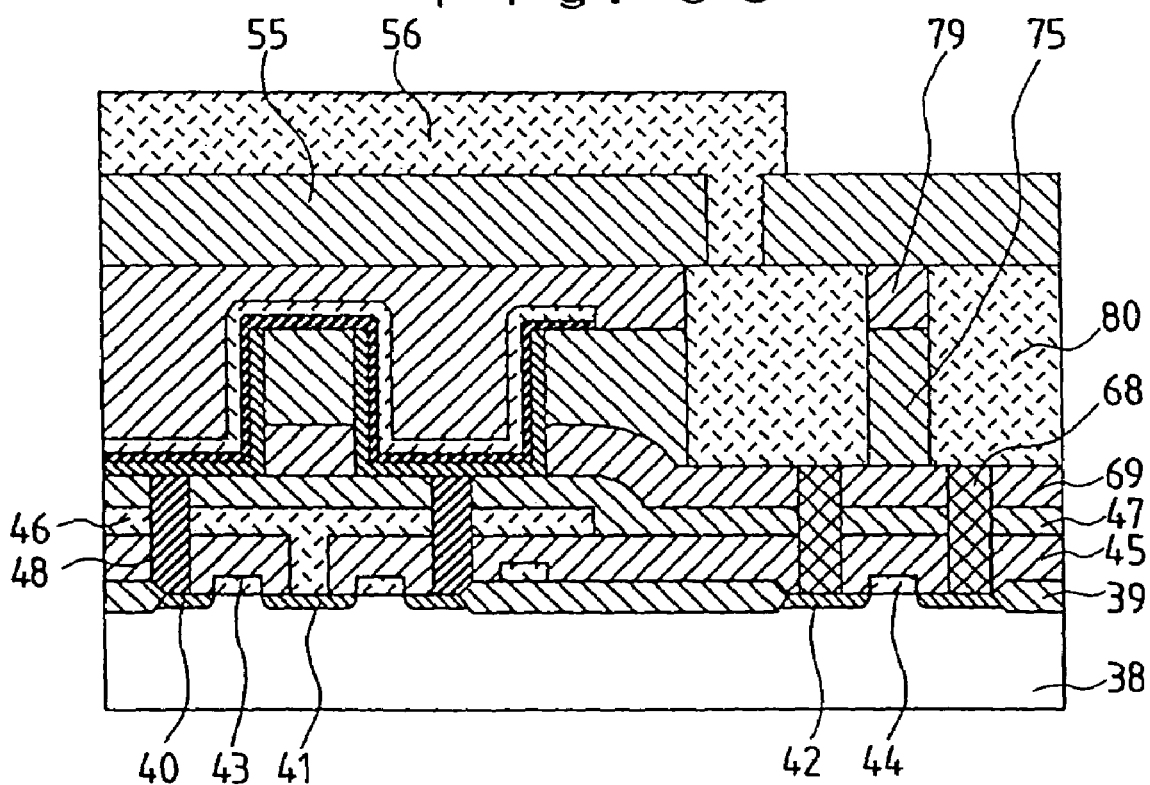
FIG. 56 is a process drawing showing the seventh embodiment according to the present invention.

Finally, as shown in FIG. 56, after an interlayer dielectric film 55, for example consisting of a silicon oxide film approximately 400 nm thick is formed, a through hole reaching the surface of the metal wiring 80 is formed through the interlayer dielectric film 55. Further, metal wiring 56 is formed by a well-known method and a semiconductor integrated circuit is completed.

As the metal wiring of the peripheral circuit can be thickened more than the one in the fifth and sixth embodiments according to this embodiment, the resistance value of the wiring of the peripheral circuit can be reduced and operating speed is further increased.

EIGHTH EMBODIMENT

This embodiment is an example in which a capacitor provided with structure in which a stereoscopic crown-type capacitor and a trench-type capacitor are combined is formed in a memory cell of a DRAM and will be described below referring to FIGS. 57 to 65.

Figure 57:
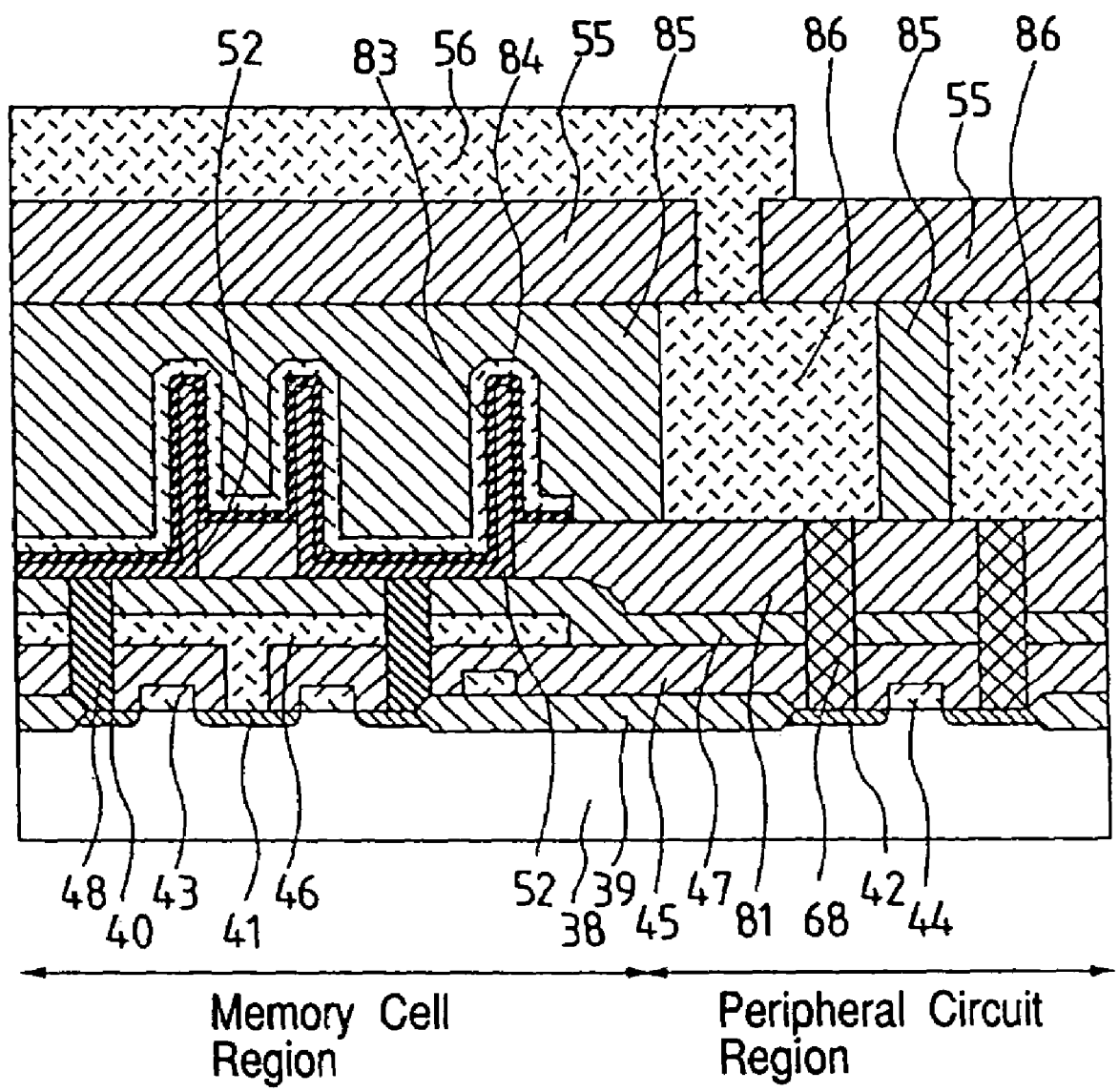
FIG. 57 is a sectional view showing an eighth embodiment according to the present invention.

FIG. 57 shows the sectional structure of a MOSFET in a memory cell and peripheral circuit in a DRAM equivalent to this embodiment. As shown in FIG. 57, metal wiring 86 formed in the peripheral circuit is buried in a silicon oxide film 85, and the upper face of a silicon oxide film 81 formed under the silicon oxide film 85 is extended from the peripheral circuit into a memory cell and is in contact with the side of the capacitor.

Figure 58:
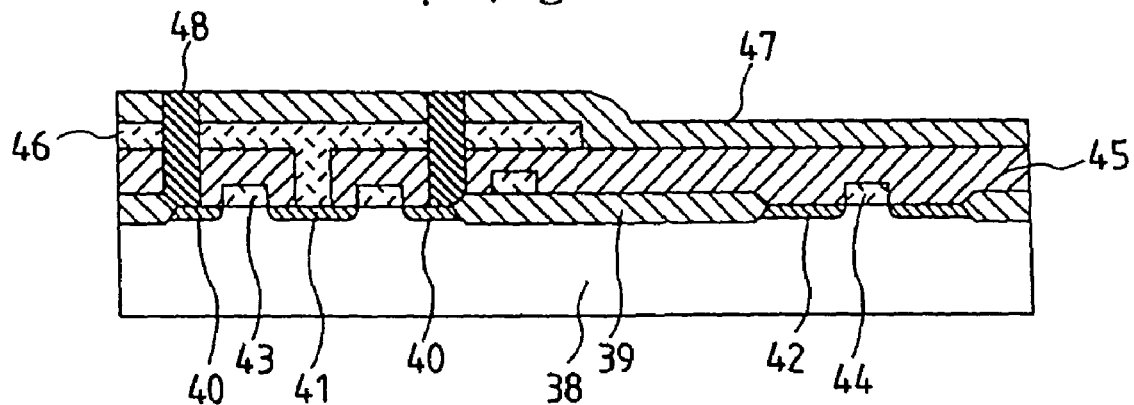
FIG. 58 is a sectional view showing the eighth embodiment according to the present invention.

Next, a manufacturing method according to this embodiment will be described referring to FIGS. 58 to 65. First, structure shown in FIG. 58 is formed, however, as the process is the same as the one shown up to FIG. 28 in relation to the fifth embodiment, description is omitted.

Figure 59:
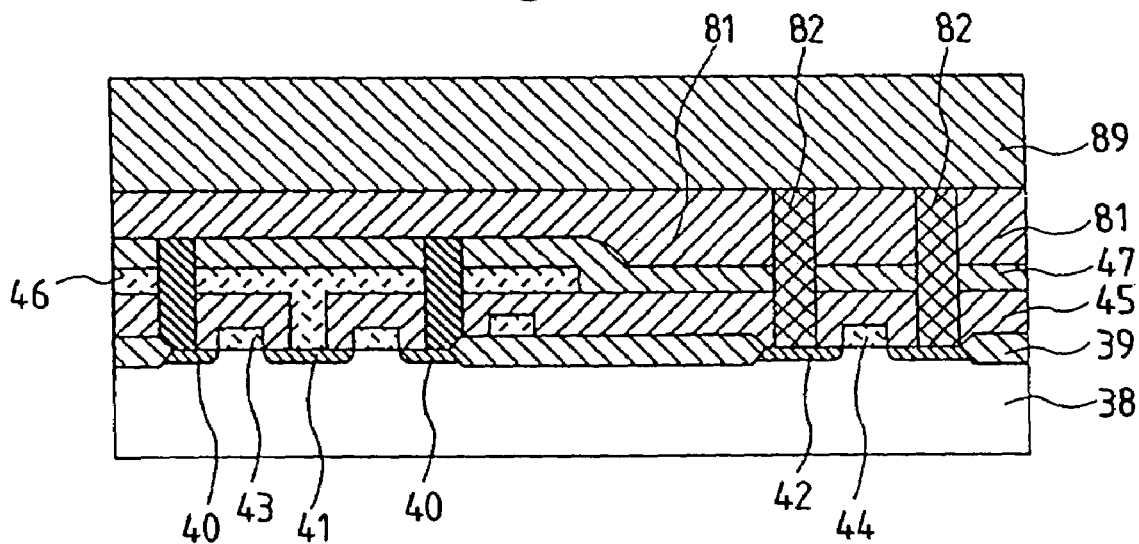
FIG. 59 is a sectional view showing the eighth embodiment according to the present invention.

As shown in FIG. 59, after the silicon oxide film 81 is formed, a connecting hole through the silicon oxide films 45, 47 and 81 is formed to expose the surface of a highly concentrated impurity region 42. After a tungsten film is formed overall, a metallic plug 82 consisting of tungsten is formed by leaving the tungsten film only in the connecting hole and removing it from the other portion by etchback by overall anisotropic etching and a silicon oxide film 89 with the thickness of 400 nm is further formed overall. A silicon nitride film may be used in place of the silicon oxide film 81.

Figure 60:
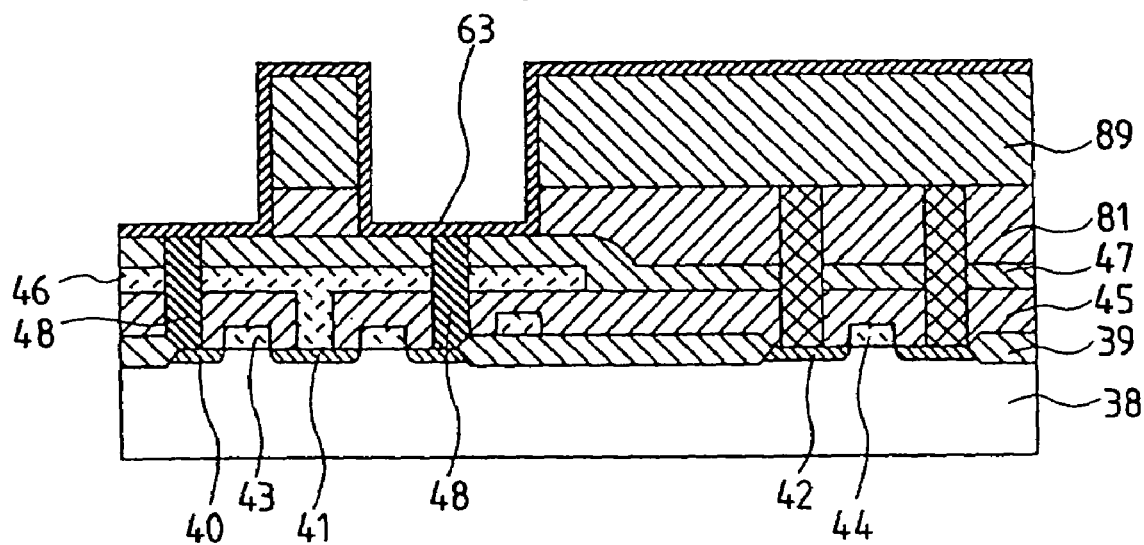
FIG. 60 is a sectional view showing the eighth embodiment according to the present invention.

As shown in FIG. 60, a trench reaching a silicon plug 48 is formed by well-known photolithography and dry etching through the silicon oxide film 81 and 89 in an area in which the storage electrode 5 of the capacitor is formed and a polycrystalline silicon film 63 with the thickness of 50 nm into which impurities are doped at high density is formed by well-known LPCVD. Hereby, the silicon plug 48 is connected to the polycrystalline silicon film 63 at the bottom of the trench.

Figure 61:
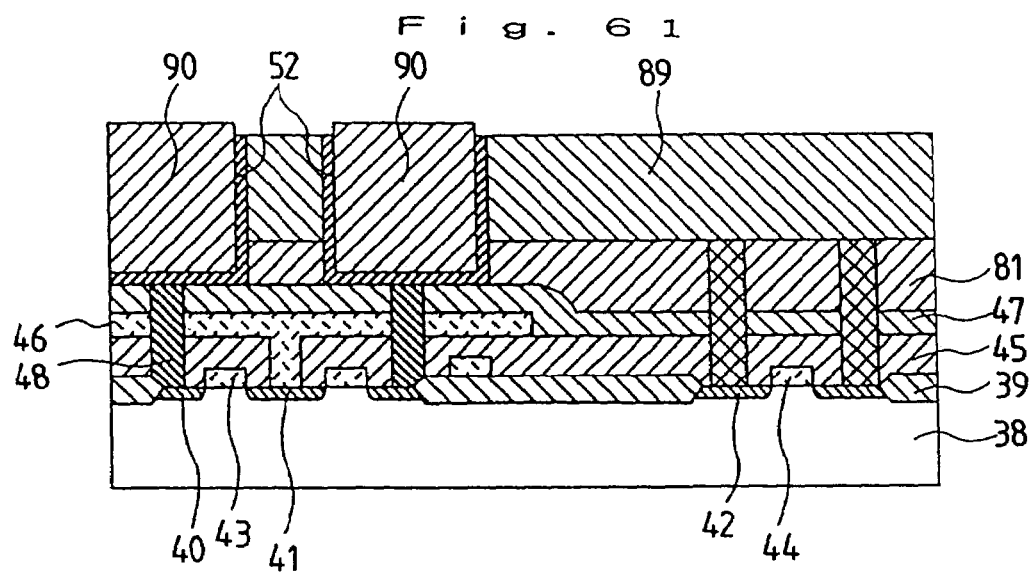
FIG. 61 is a sectional view showing the eighth embodiment according to the present invention.

Next, as shown in FIG. 61, a silicon oxide film 90 including boron and phosphorus is formed by well-known CVD, after annealing treatment is applied, the silicon oxide film 90 is left only in the trench and the film formed on the other portion is removed by etchback by employing overall anisotropic dry etching. Further, the exposed portion of the polycrystalline silicon film 63 is removed by dry etching using the silicon oxide film 90 as an etching mask. As a result, the storage electrode 52 of the capacitor is formed in the trench.

Figure 62:
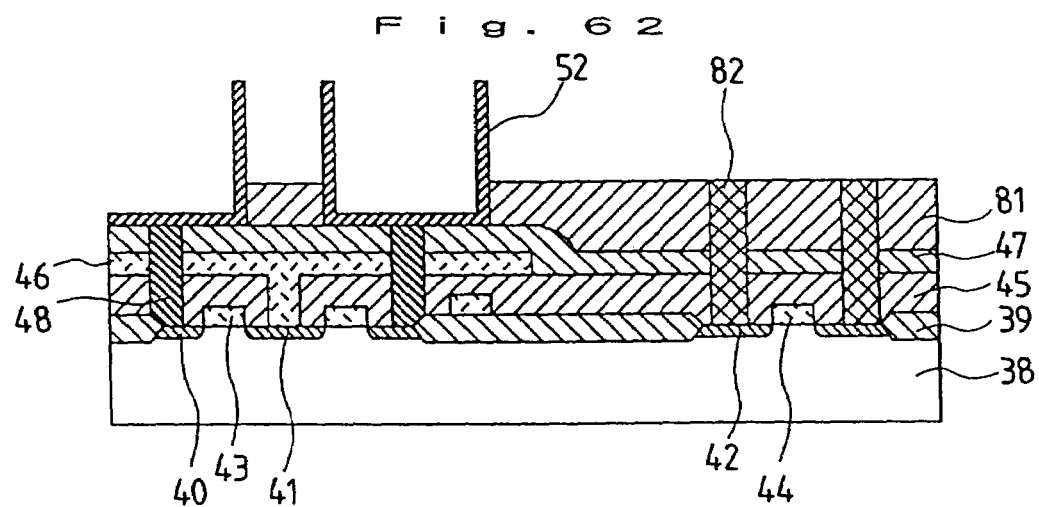
FIG. 62 is a sectional view showing the eighth embodiment according to the present invention.

Next, as shown in FIG. 62, the silicon oxide film 90 left in the trench and the silicon oxide film 89 on the metallic plug 82 are removed by wet etching using diluted hydrofluoric acid (HF) in water to expose the surface of the metallic plug 82. As the silicon oxide film 90 buried in the trench includes boron and phosphorus, the speed of etching the silicon oxide film in hydrofluoric aqueous solution is faster than that of etching the silicon oxide film 89 similarly using hydrofluoric aqueous solution. Therefore, though the silicon oxide film 90 is thicker than the silicon oxide film 89, silicon oxide film 90 formed in the trench can be completely removed. To prevent overetching in wet etching, it is desirable that an etching stopper film such as silicon nitride film formed at low temperature is provided under the silicon oxide film 89.

Figure 63:
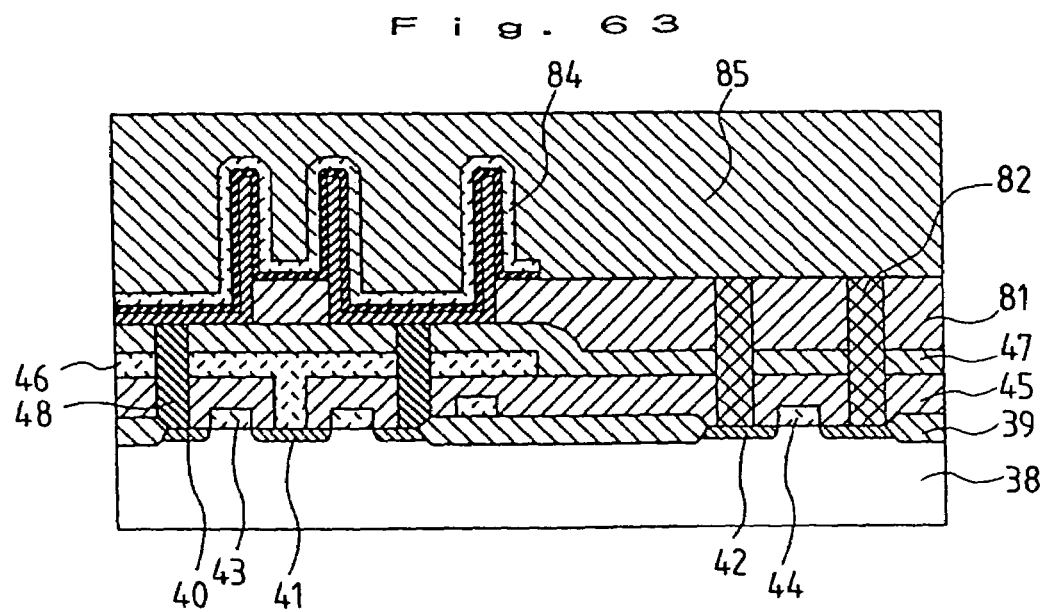
FIG. 63 is a sectional view showing the eighth embodiment according to the present invention.

After predetermined cleaning, as shown in FIG. 63, a capacitor dielectric film 83 consisting of a tantalum pentoxide film is formed, then a tungsten film or a titanium nitride film which is approximately 50 nm thick is formed and an unnecessary portion is removed by photolithography and dry etching to form a plate electrode 84. Further, a thick silicon oxide film 85 with the thickness of 800 nm is formed and the surface is flattened.

Figure 64:
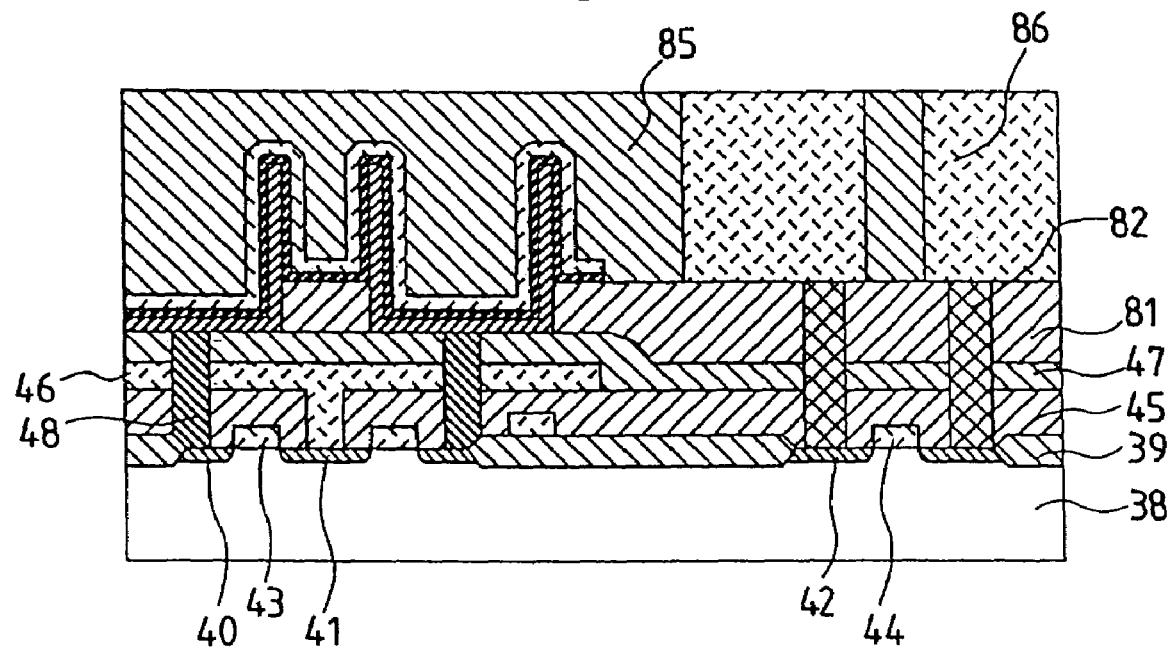
FIG. 64 is a sectional view showing the eighth embodiment according to the present invention.

Next, processing shown in FIG. 42 in relation to the sixth embodiment is performed to form metal wiring 86 and as a result, structure shown in FIG. 64 is formed.

Figure 65:
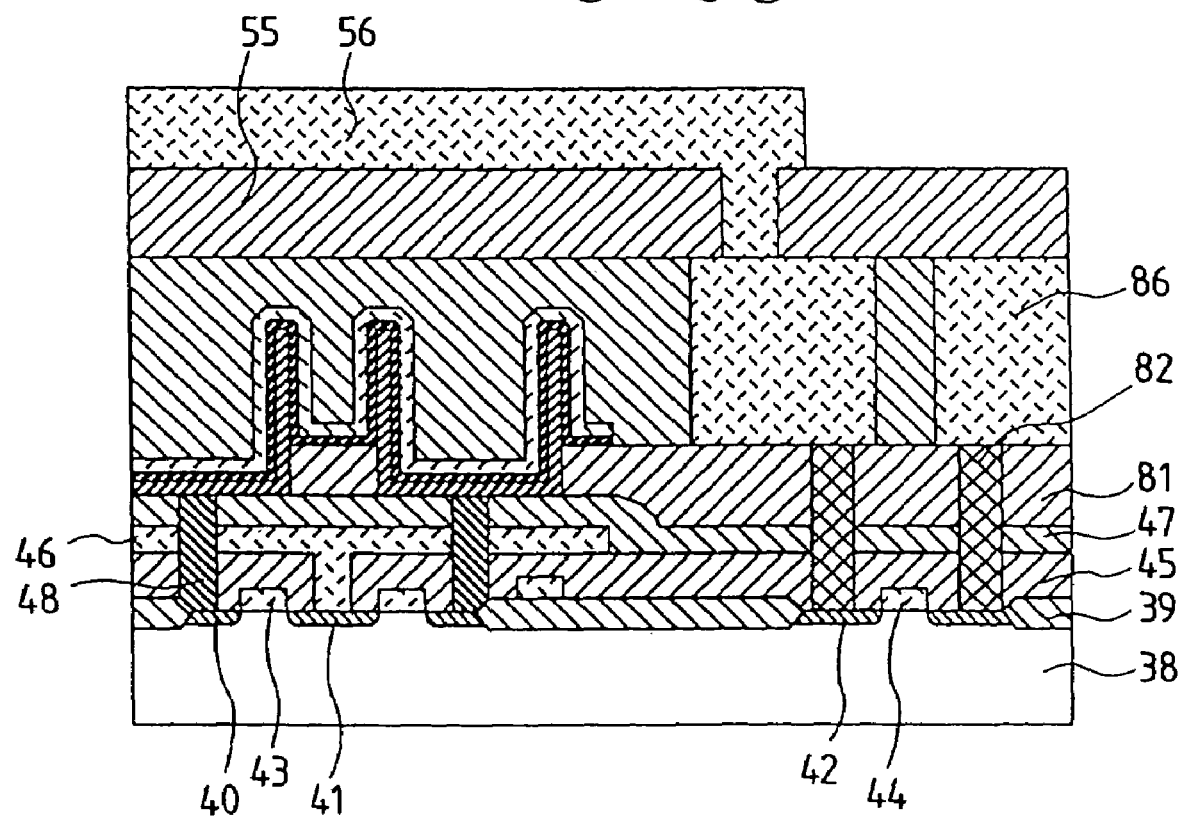
FIG. 65 is a sectional view showing the eighth embodiment according to the present invention.

Finally, an interlayer dielectric film 55 such as a silicon oxide film approximately 400 nm thick is formed and after a through hole is formed through the interlayer dielectric film 55 on the metal wiring 86 in the peripheral circuit, metal wiring 56 is formed and a semiconductor integrated circuit shown in FIG. 65 is completed.

As the storage electrode 52 of a capacitor formed in a memory cell is a crown type according to this embodiment, both inner and outer walls can be utilized as a storage electrode, extremely large storage capacity can be obtained and a high integrated semiconductor integrated circuit which is high and which is excellent in resistance to a soft error can be formed.

NINTH EMBODIMENT

This embodiment is another example of a DRAM memory provided with a capacitor formed by combining crown-type and trench-type capacitors. This embodiment will be described below referring to FIGS. 66 to 72.

Figure 66:
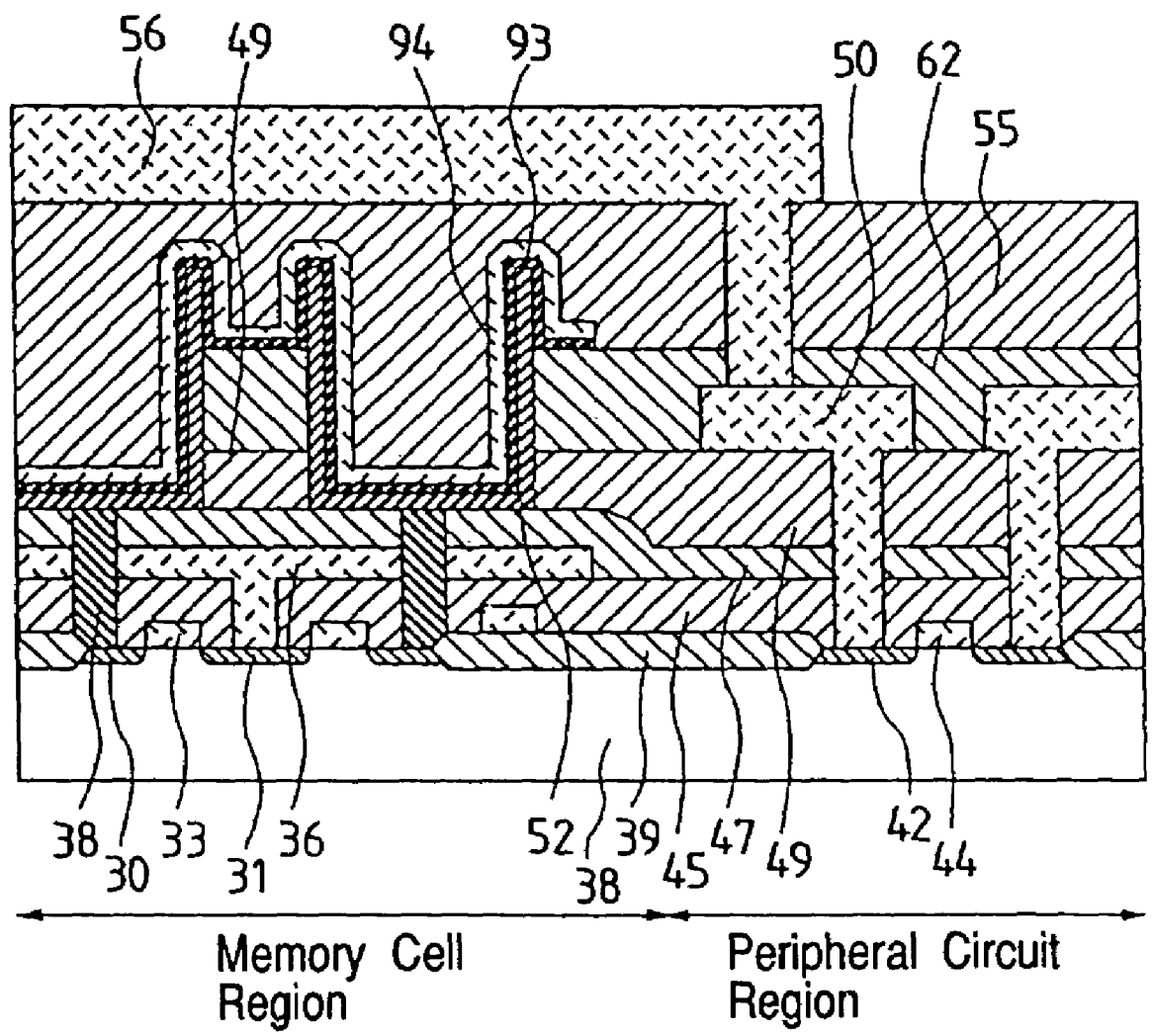
FIG. 66 is a sectional view showing a ninth embodiment according to the present invention.

FIG. 66 shows the sectional structure of a MOSFET in a memory cell and peripheral circuit of a DRAM of this embodiment. As shown in FIG. 66, metal wiring 50 is formed in an opening formed through a silicon oxide film 49. A trench type capacitor of a memory cell is formed in a portion which is in contact with the silicon oxide films 49 and 92 and a crown type capacitor is formed in a portion which is in contact with a silicon oxide film 55. Therefore, the upper face of the silicon oxide film 49 on which the metal wiring 50 extends to a memory cell area and is in contact with the side of the capacitor.

Next, a method of manufacturing this DRAM cell will be described referring to FIGS. 67 to 72.

Figure 67:
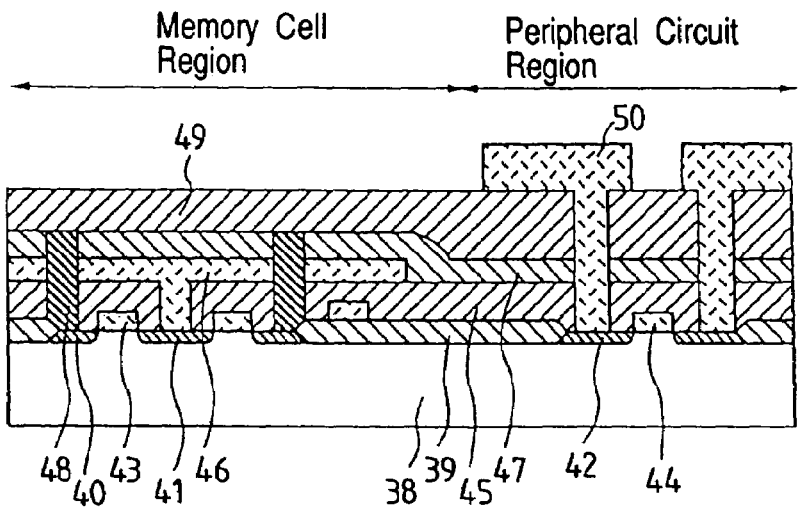
FIG. 67 is a process drawing showing the ninth embodiment according to the present invention.
Figure 68:
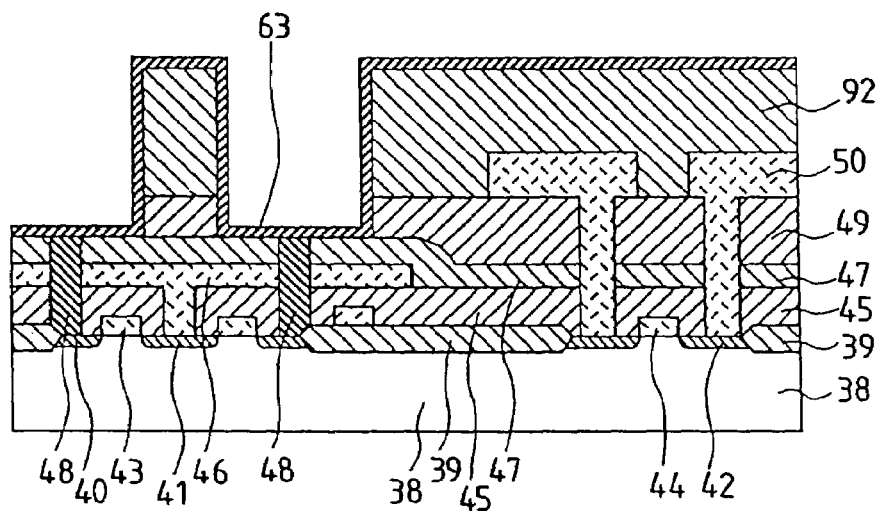
FIG. 68 is a process drawing showing the ninth embodiment according to the present invention.

First, structure shown in FIG. 67 is formed in the same process as the one shown up to FIG. 30 in relation to the fifth embodiment. Next, as shown in FIG. 68, a silicon oxide film 92 with the thickness of 400 nm is formed and after the surface is flattened by well-known CMP, a trench reaching a silicon plug 48 is formed through the silicon oxide films 49 and 92 in a portion in which the storage electrode 93 of the capacitor is to be formed by well-known photolithography and dry etching.

Next, a polycrystalline silicon film 63 with the thickness of 50 nm into which impurities are doped at high density is formed by well-known LPCVD. Hereby, the silicon plug 48 is connected to the polycrystalline silicon film 63 at the bottom of the trench.

Figure 69:
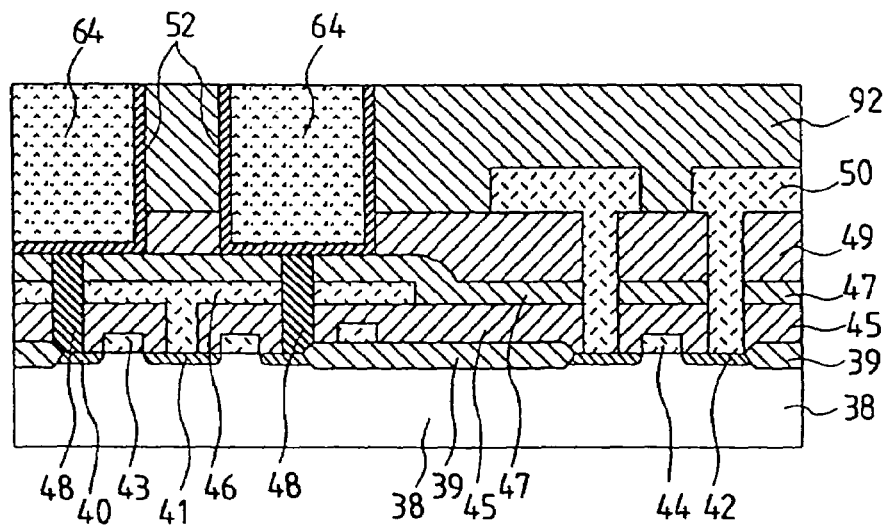
FIG. 69 is a process drawing showing the ninth embodiment according to the present invention.

Photoresist 1 μm thick is applied, the photoresist 64 is left only in the trench and it in the other portion is removed by well-known overall anisotropic dry etching as shown in FIG. 69.

Next, the exposed portion of the polycrystalline silicon film 63 is removed by dry etching using the photoresist 64 as a mask and the storage electrode 52 of the capacitor is formed on the inner wall of the trench.

Figure 70:
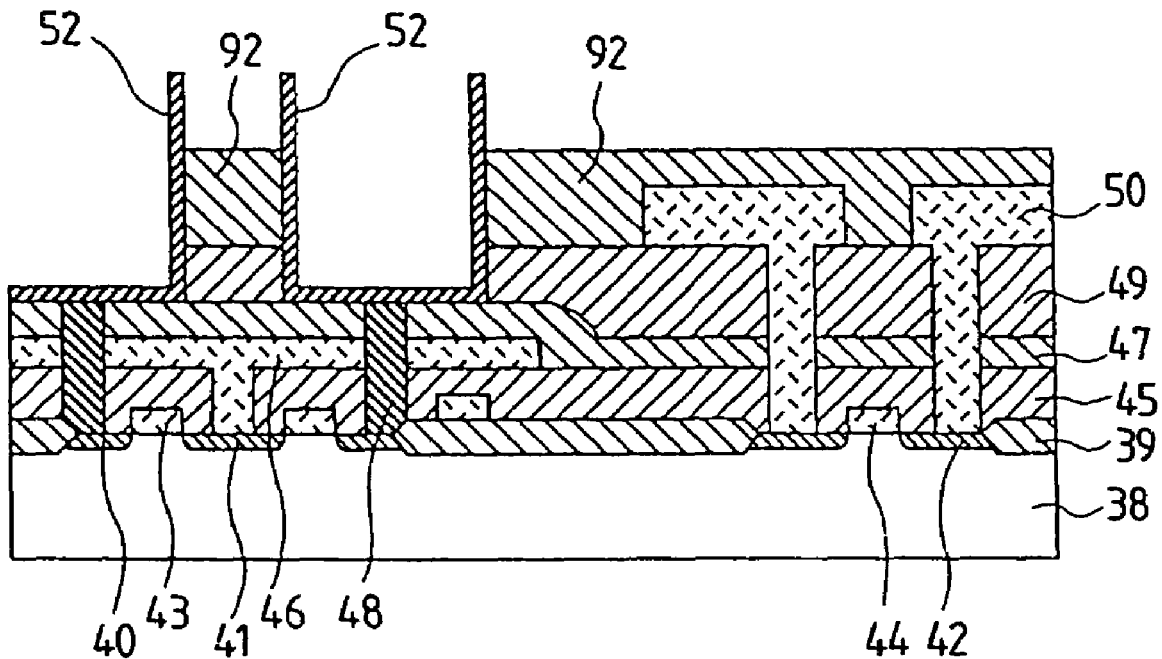
FIG. 70 is a process drawing showing the ninth embodiment according to the present invention.

After the photoresist 64 is removed and predetermined cleaning is performed, the silicon oxide film 92 is etched by 200 nm in thickness using hydrofluoric aqueous solution. Hereby, as shown in FIG. 70, the upper part of the storage electrode 52 is protruded upward.

Figure 71:
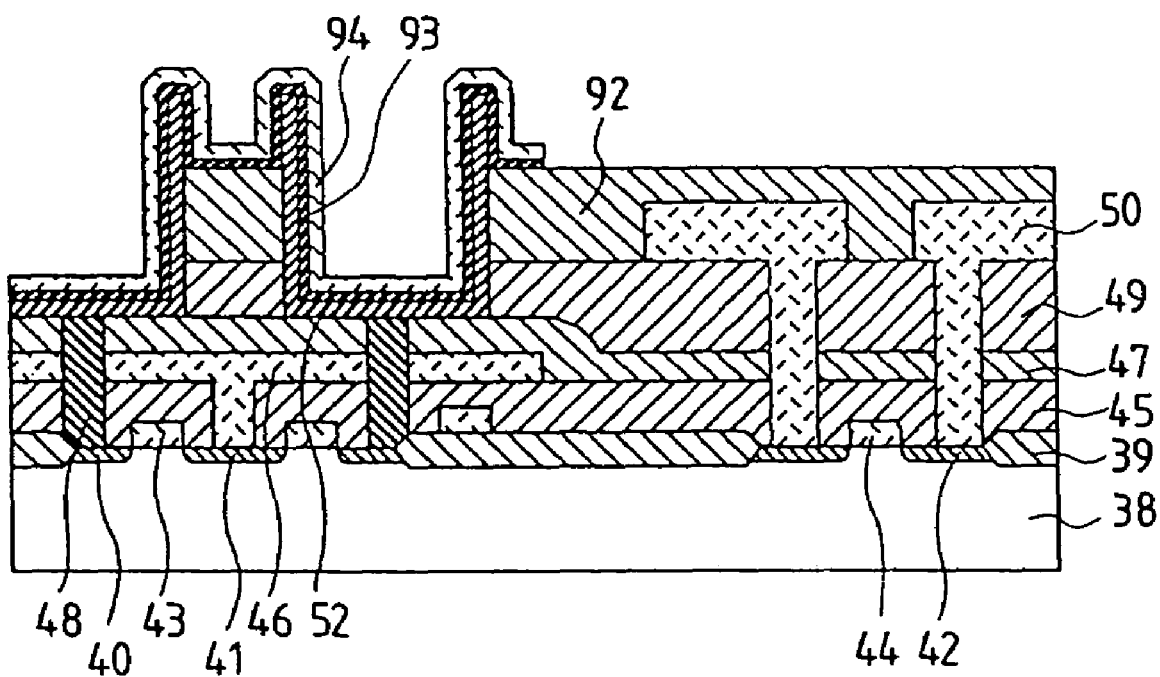
FIG. 71 is a process drawing showing the ninth embodiment according to the present invention.

As shown in FIG. 71, a capacitor dielectric film 93 consisting of a dielectric with a larger dielectric constant than that of silicon dioxide (tantalum pentoxide in this embodiment) is formed and a plate electrode 94 consisting of tungsten or titanium nitride and others with the thickness of approximately 50 nm is formed by a well-known method. For a method of forming the capacitor dielectric film 93 and the plate electrode 94, CVD which is excellent in covering step height is used.

Figure 72:
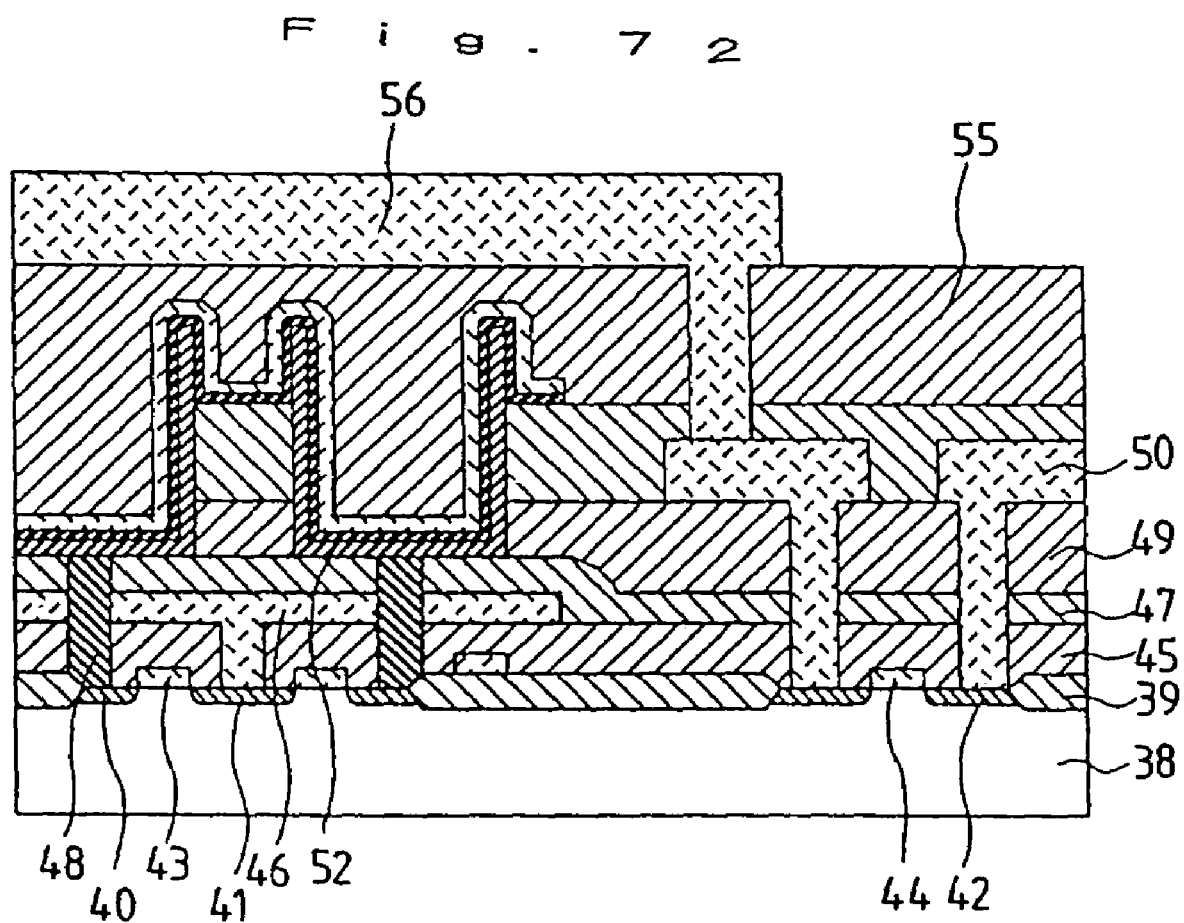
FIG. 72 is a process drawing showing the ninth embodiment according to the present invention.
Figure 73:
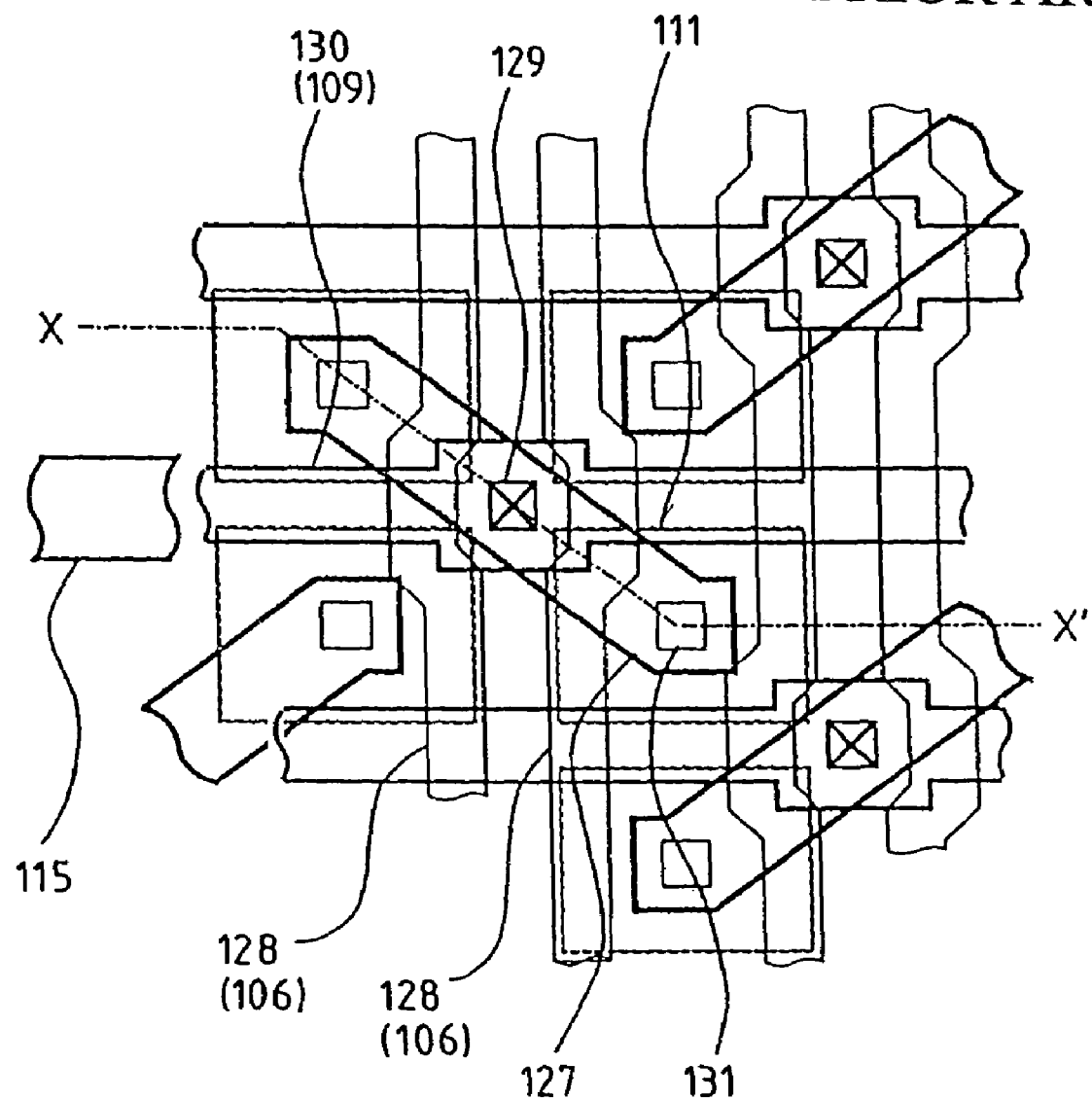
FIG. 73 is a plan showing a conventional semiconductor integrated circuit.
Figure 74:
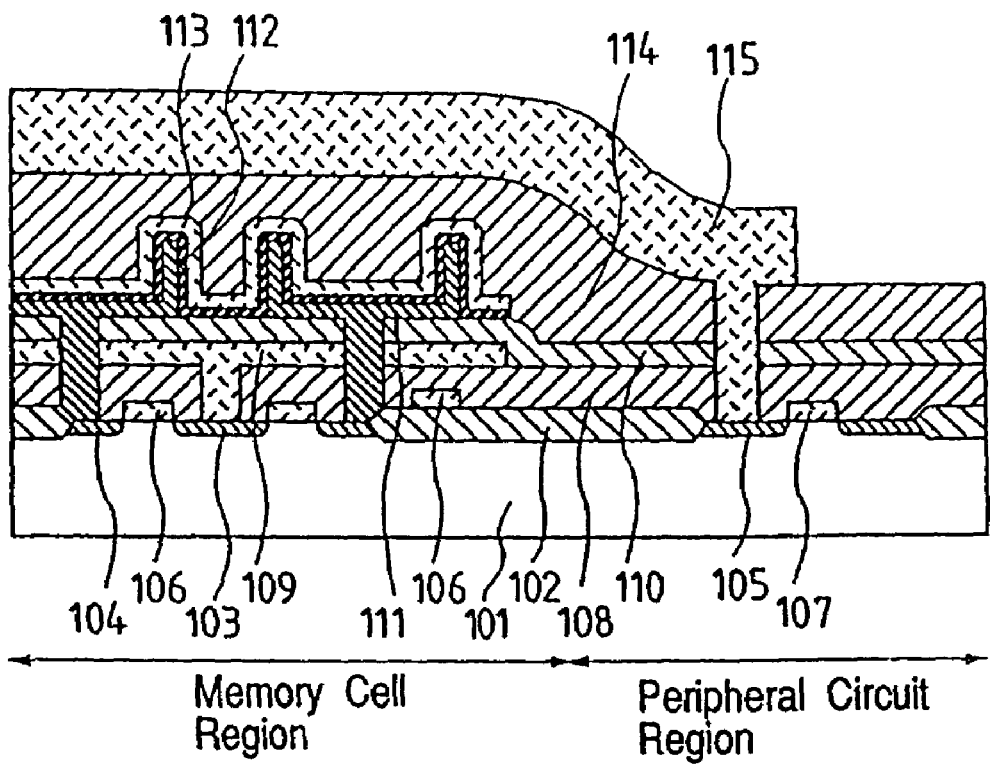
FIG. 74 is a sectional view showing the conventional semiconductor integrated circuit.
Figure 75:
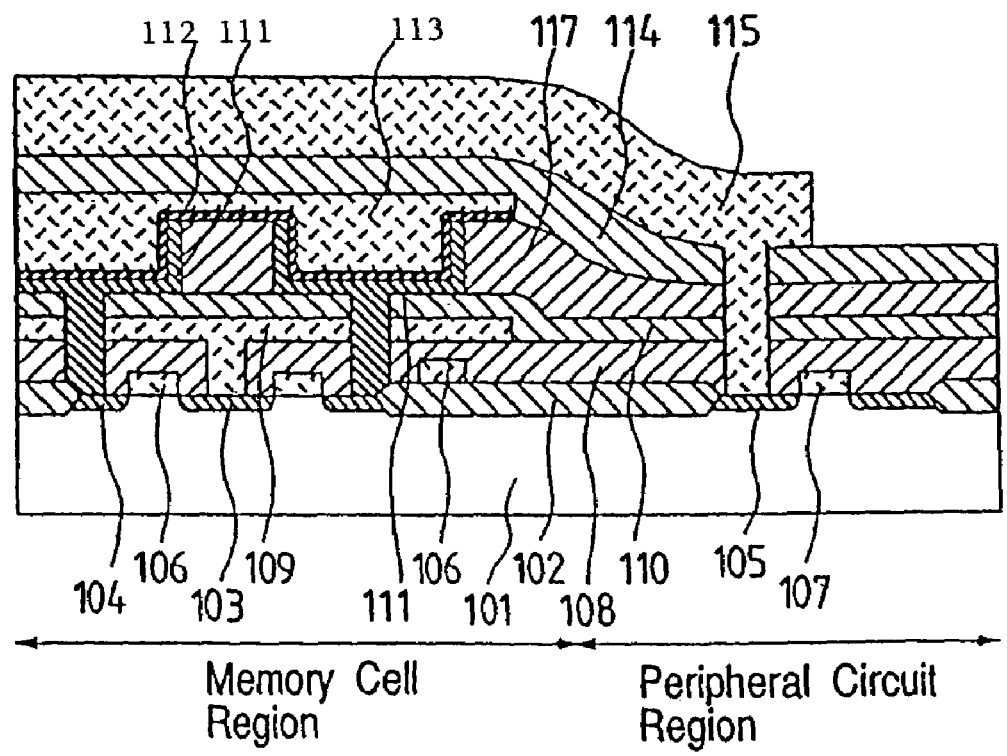
FIG. 75 is a sectional view showing a conventional semiconductor integrated circuit.

Finally, an interlayer dielectric film 55 consisting of a silicon oxide film approximately 400 nm thick is formed and after a through hole is formed through the interlayer dielectric film 55 over the metal wiring 50 in the peripheral circuit, metal wiring 56 is formed and a semiconductor integrated circuit according to the present invention shown in FIG. 72 is completed.

As shown in FIG. 72, the capacitor dielectric film 93 and the plate electrode 94 are formed on not only the inner wall but the outer wall of the upper portion of the storage electrode 52 of a capacitor formed in a memory cell according to this embodiment and in this portion, a crown-type capacitor is formed. Therefore, larger storage capacity than that of a trench-type capacitor using only the inner wall of a trench as a capacitor can be obtained and a semiconductor integrated circuit the degree of integration of which is high and which is excellent in soft error immunity is formed.

TENTH EMBODIMENT

Figure 76:
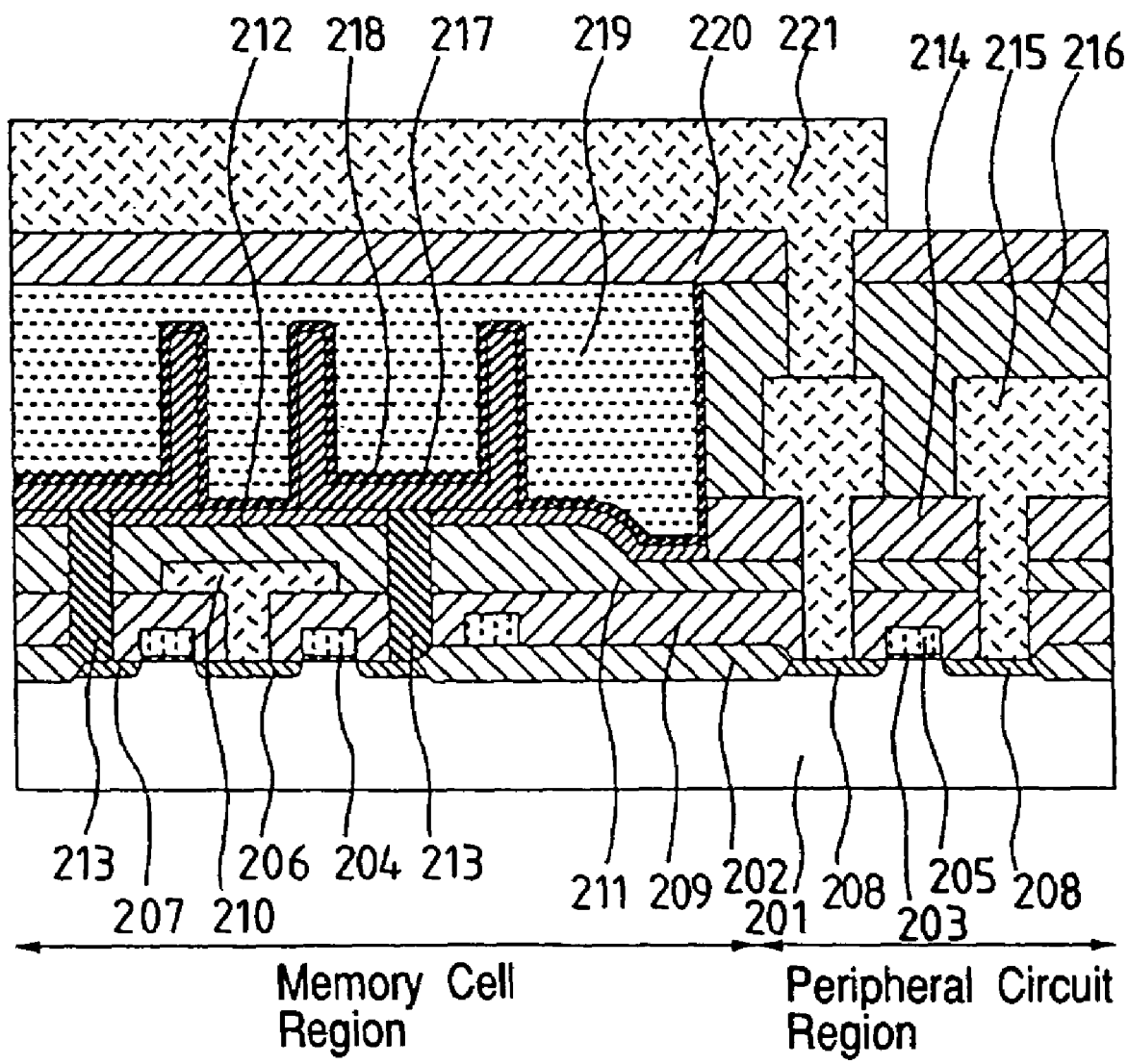
FIG. 76 is a sectional view showing a tenth embodiment according to the present invention.
Figure 77:
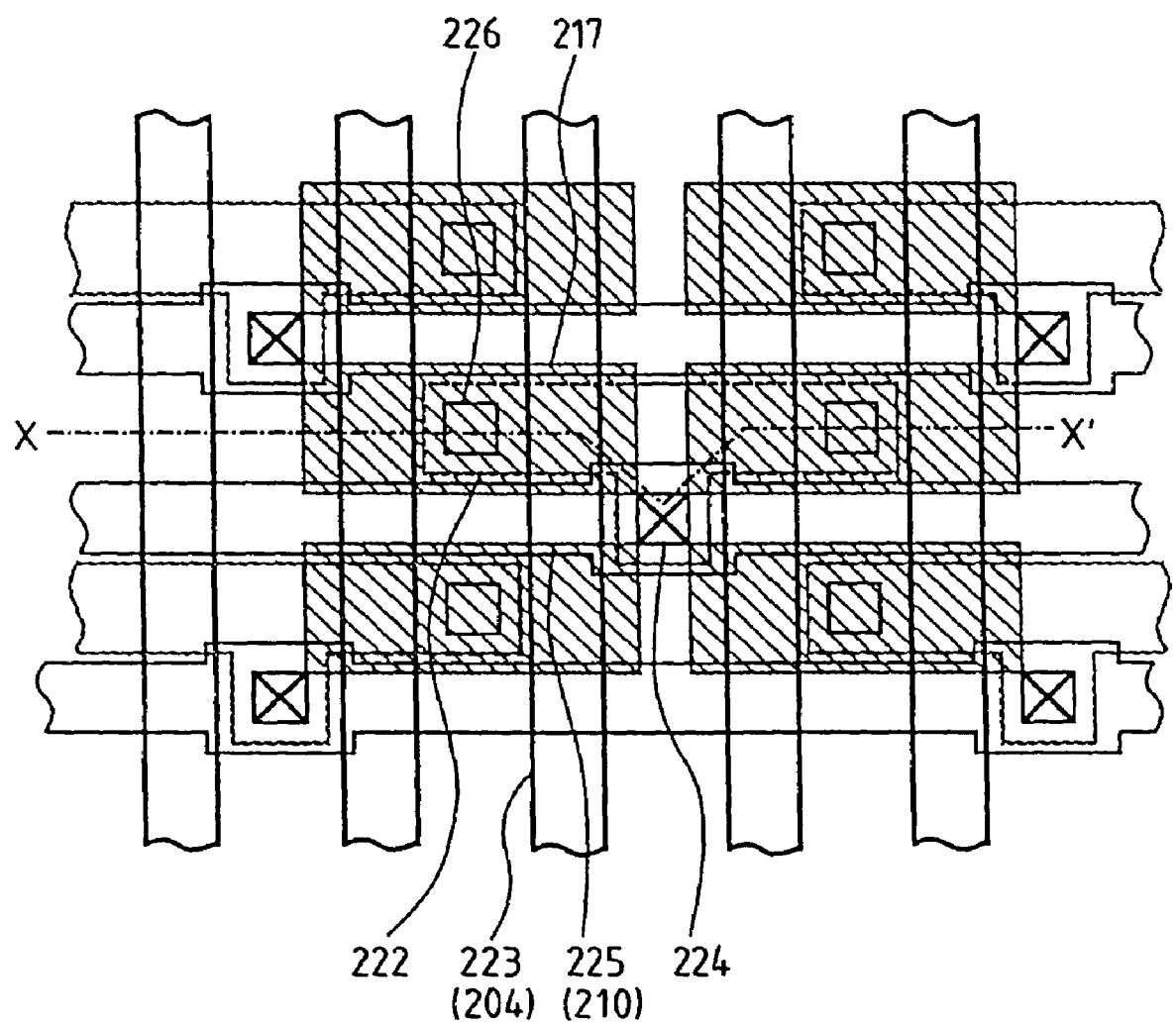
FIG. 77 is a plan showing the tenth embodiment according to the present invention.

An embodiment of a DRAM according to the present invention will be described below referring to FIGS. 76 to 88. FIG. 76 shows the sectional structure of a MOSFET in a memory cell and peripheral circuit equivalent to this embodiment on the same drawing and FIG. 77 shows the plane layout of the memory cell. FIG. 76 shows a part of the section of the memory cell viewed along a line X-X' in FIG. 77.

As shown in FIG. 76, a MOSFET in a memory cell consists of a gate dielectric film 203, a gate electrode 204 and high-density N-type impurity areas 206 and 207 which are respectively the source and drain, and a MOSFET in the peripheral circuit consists of the gate dielectric film 203, a gate electrode 205 and a high-density N-type impurity area 208 which is the source or drain. A wiring electrode 210 is connected to the high-density N-type impurity area 206 of the MOSFET in the memory cell as a data line and a crown-type capacitor is further provided over the wiring electrode.

This crown-type capacitor is formed in an area in which silicon oxide films 214 and 216 which are interlayer dielectric films in which metal wiring 215 in a peripheral circuit area is formed are removed and a storage electrode 217 is connected to the high-density N-type impurity area 207 via a silicon plug 213. A capacitor dielectric film 218 is formed on the storage electrode 217, further the plate electrode 219 of the capacitor is buried in an area from which the silicon oxide films 214 and 216 are removed and the crown-type capacitor is formed.

FIG. 77 shows the layout of a plurality of memory cells to explain the positional relationship among the adjacent memory cells. In FIG. 77, a word line 223 is arranged longitudinally, a data line 225 is arranged horizontally and a crown-type capacitor is formed above these word line 223 and data line 225. Further, the capacitor is connected to an active area 222 in clearance between these word line 223 and data line 217 via an opening 226.

Figure 78:
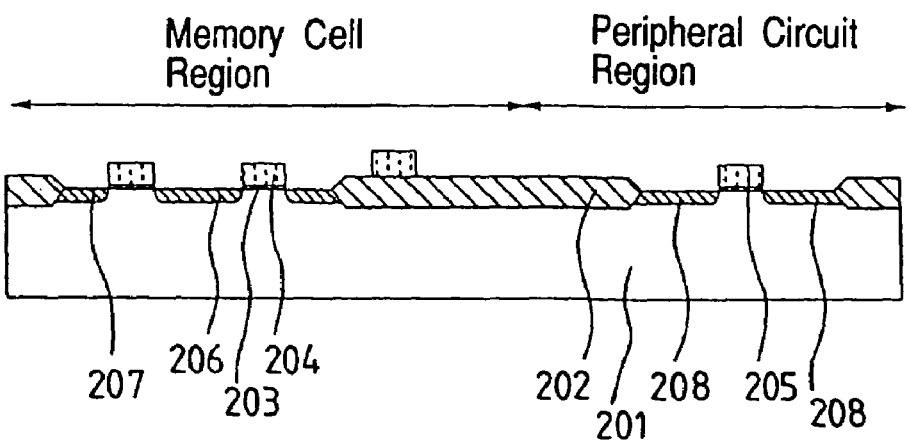
FIG. 78 is a process drawing showing the tenth embodiment according to the present invention.

This embodiment will be described further in detail below referring to FIGS. 78 to 88. First, as shown in FIG. 78, after a field oxide film 202 is formed on a silicon substrate 201 by well-known selective oxidation (LOCOS technique), a MOSFET is formed on an active area. In this embodiment, an N-channel MOSFET is formed, however, a P-channel MOSFET may be also formed. To reduce the deterioration of an element caused by a hot carrier, well-known lightly doped drain (LDD) structure may be also used. Further, an dielectric film such as silicon nitride may be formed on the side wall and on the upper face of the gate electrode 204 to use a well-known self-matching contact.

Next, after a silicon oxide film 209 including boron and phosphorus is formed by well-known CVD, it is annealed at the temperature of approximately 800° C. to smooth the surface of the silicon oxide film 209. For a silicon oxide film, an undoped silicon oxide film may be used in place of the silicon oxide film 209 which is doped by boron and phosphorus and it may be smoothed by another method. Even if the surface of the silicon oxide film is not smoothed, there is no problem in a later process.

An opening 224 shown in FIG. 77 is formed through the silicon oxide film 209 by photolithography and dry etching and a wiring electrode 210 with the thickness of approximately 100 nm which is to function as the data line 225 shown in FIG. 77 is formed by patterning so that the wiring electrode is in a predetermined shape by photolithography and dry etching. For material for the wiring electrode 210, a compound film consisting of a silicide film of refractory metal such as tungsten and a polycrystalline silicon film or a refractory metal film such as tungsten may be used. If refractory metal such as tungsten is used, it is desirable that a barrier metal film such as titanium nitride is provided under the refractory metal film so as to prevent reaction against a silicon substrate. It is also desirable that an undoped silicon oxide film for preventing impurities from being diffused is provided under the silicon oxide film 209.

Figure 79:
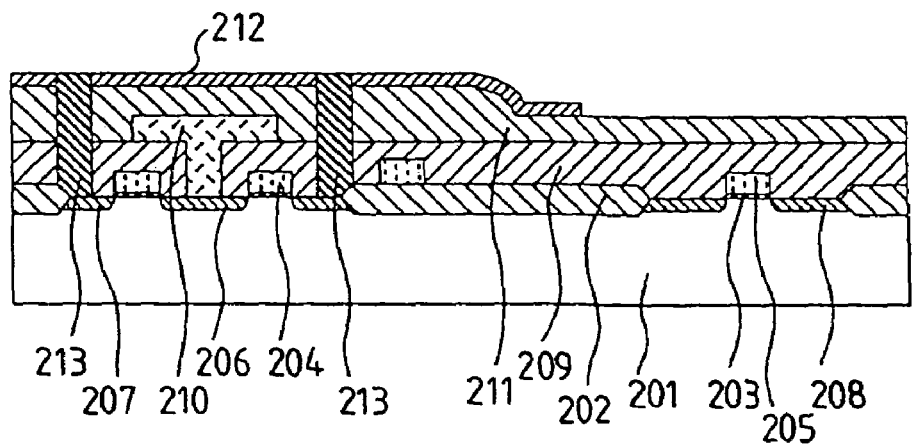
FIG. 79 is a process drawing showing the tenth embodiment according to the present invention.

A silicon oxide film 211 with the thickness of approximately 200 nm including boron and phosphorus is formed by CVD and the surface is smoothed by annealing at the temperature of approximately 80° C. Next, a silicon nitride film 212 with the thickness of approximately 100 nm is formed by LPCVD, an opening 226 shown in FIG. 77 is formed through the silicon nitride film 212 and the silicon oxide films 209 and 211 on the highly concentrated impurity region 207 which is to function as the source or drain of the MOSFET by well-known photolithography and dry etching, a polycrystalline silicon film approximately 200 nm thick into which impurities are doped at high density is formed by LPCVD and the polycrystalline silicon film is left only in the opening 226 by etchback by overall anisotropic dry etching so as to form a silicon plug 213 as shown in FIG. 79. In this embodiment, the silicon nitride film 212 in a peripheral circuit area is removed by photolithography, however, the silicon nitride film 212 may be also left in the peripheral circuit area. In this embodiment, the silicon plug 213 is directly formed on the highly concentrated impurity region 210, however, if a pad consisting of a well-known polycrystalline silicon film is used, the gate electrode 204 the silicon plug 213 can be also insulated by self-alignment and it is effective in reducing the area of a memory cell.

Figure 80:
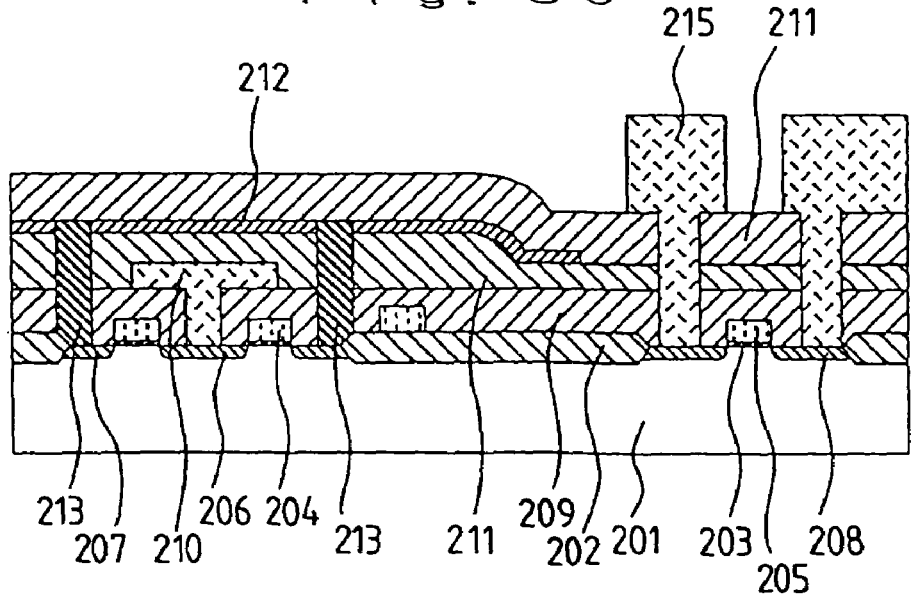
FIG. 80 is a process drawing showing the tenth embodiment according to the present invention.

Next, as shown in FIG. 80, a silicon oxide film 214 with the thickness of approximately 200 nm is formed at the temperature of approximately 400° C. by well-known CVD using TEOS gas and then the silicon oxide films 209, 211 and 214 on the highly concentrated impurity region 208 in the peripheral circuit are removed by etching so as to form a contact hole. A tungsten film approximately 200 nm thick is formed by well-known sputtering or CVD and the metal wiring 215 of the peripheral circuit is formed by well-known photolithography and dry etching. The surface of the silicon oxide film 214 may be flattened by well-known CMP. In this case, a plug may be formed in the contact hole. In this embodiment, tungsten is used for the material of the metal wiring 215, however, in this case it is desirable that a barrier metal film such as titanium nitride is provided below. Further, if the later process for manufacturing a capacitor is kept at low temperature, low-resistance metal such as aluminum may be also used.

Figure 81:
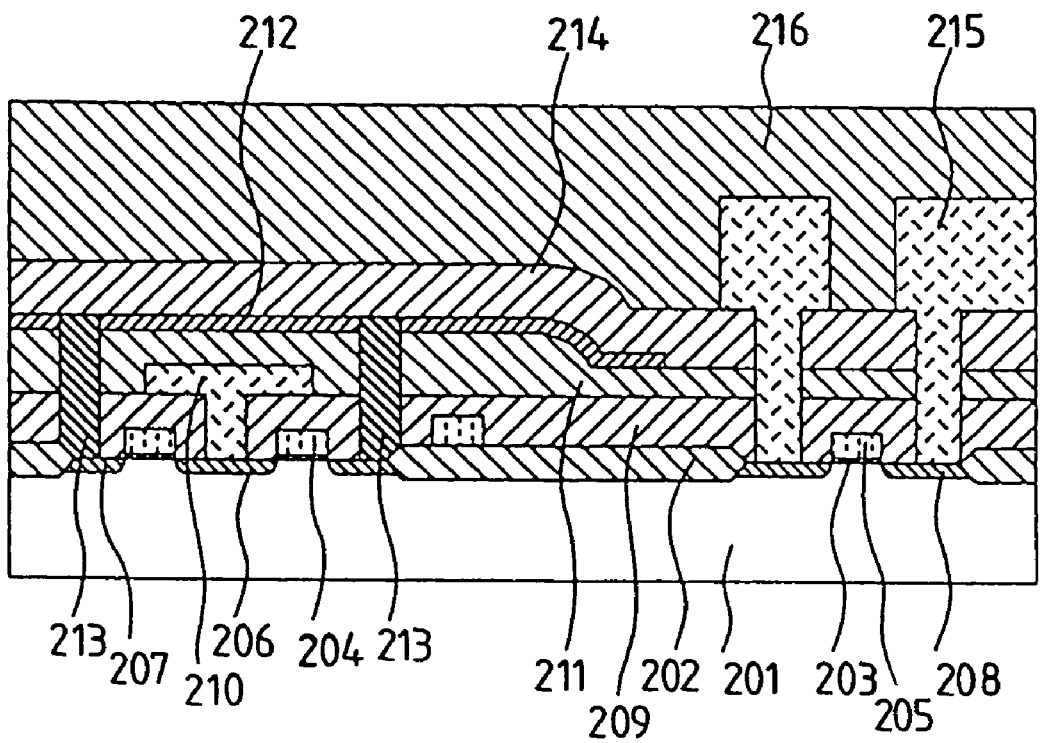
FIG. 81 is a process drawing showing the tenth embodiment according to the present invention.

As shown in FIG. 81, a silicon oxide film 216 with the thickness of 0.3 to 1 μm is formed at the temperature of approximately 400° C. by CVD using TEOS gas and the surface is flattened by CMP.

Figure 82:
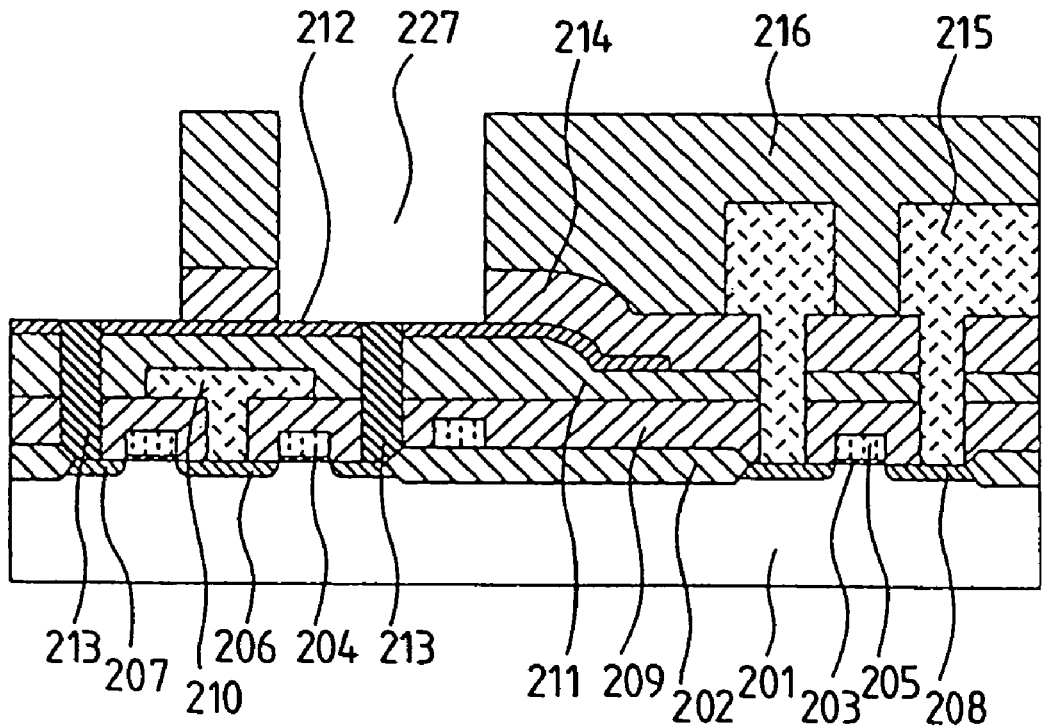
FIG. 82 is a process drawing showing the tenth embodiment according to the present invention.

Next, as shown in FIG. 82, a trench 227 reaching the silicon plug 213 is formed through the silicon oxide films 214 and 216 in a portion in which the storage electrode of a capacitor is to be formed by well-known photolithography and dry etching. At this time, it is desirable that a silicon nitride film 212 is provided under the silicon oxide film 214 as an etching stopper.

Figure 83:
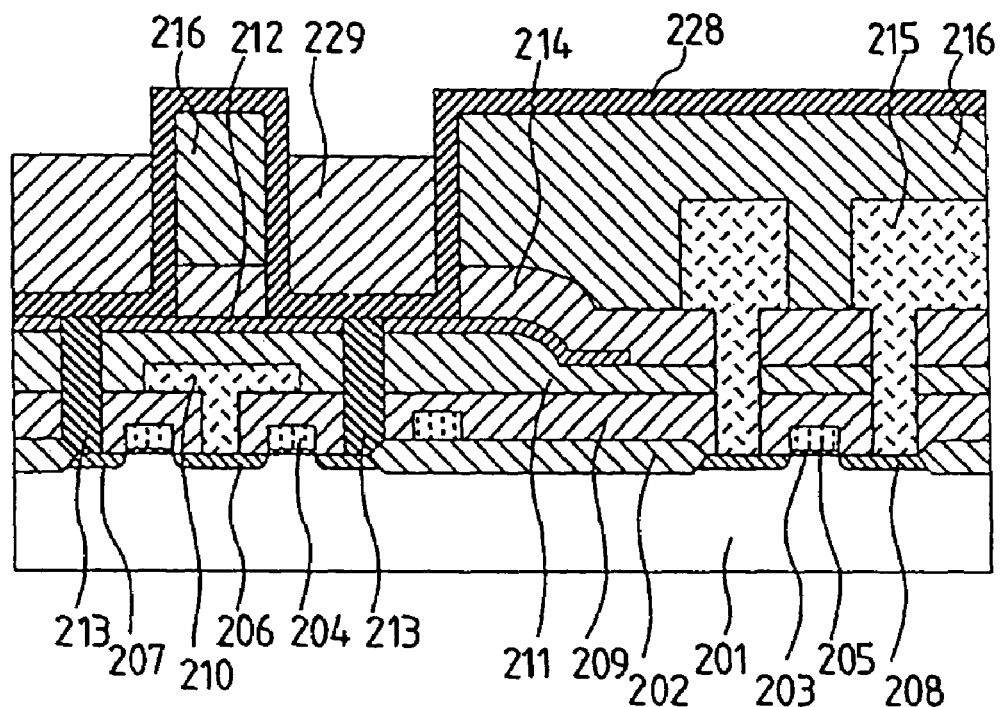
FIG. 83 is a process drawing showing the tenth embodiment according to the present invention.

As shown in FIG. 83, a polycrystalline silicon film 228 with the thickness of 20 to 100 nm into which impurities are doped at high density is formed by well-known LPCVD. At this time, the silicon plug 213 and the polycrystalline silicon film 228 are connected at the bottom of the trench. Next, after a photoresist film 1 μm thick is applied, the photoresist film 229 is left only in the trench and it in the other portion is removed by etchback by overall anisotropic dry etching. The position of the upper face of the photoresist film 229 left in the trench is controlled by controlling the dry etching so that the position is lower by approximately 0.2 μm than the upper face of the silicon oxide film 216.

Figure 84:
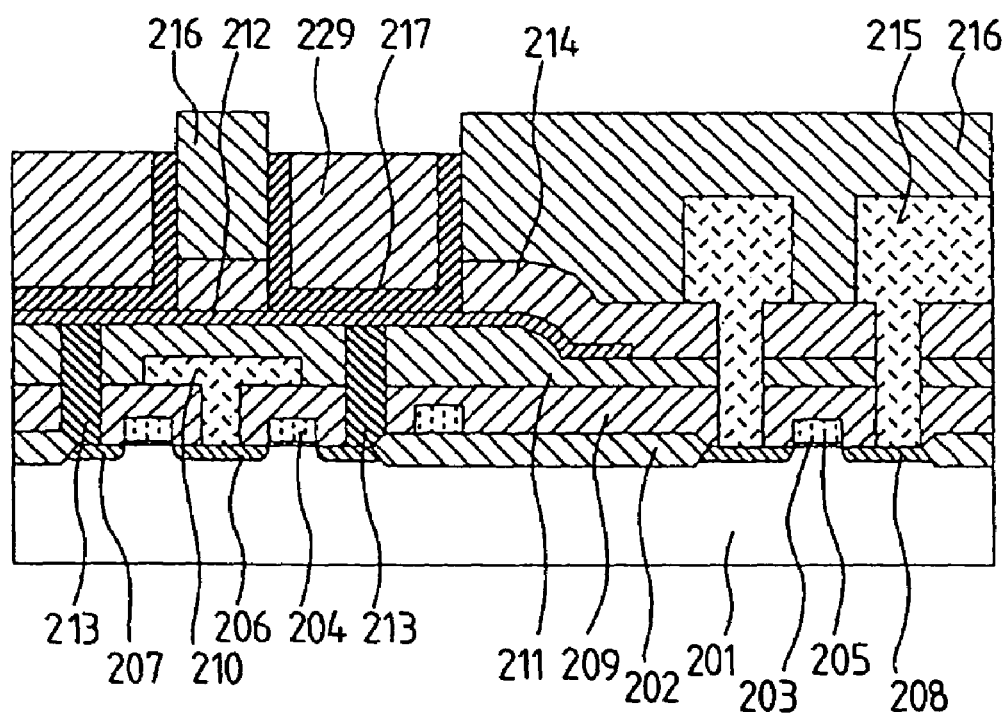
FIG. 84 is a process drawing showing the tenth embodiment according to the present invention.

Next, the exposed portion of the polycrystalline silicon film 228 is removed by dry etching using the photoresist film 229 as a mask and as shown in FIG. 84, the storage electrode 17 of the capacitor is formed on the inner wall of the trench.

Figure 85:
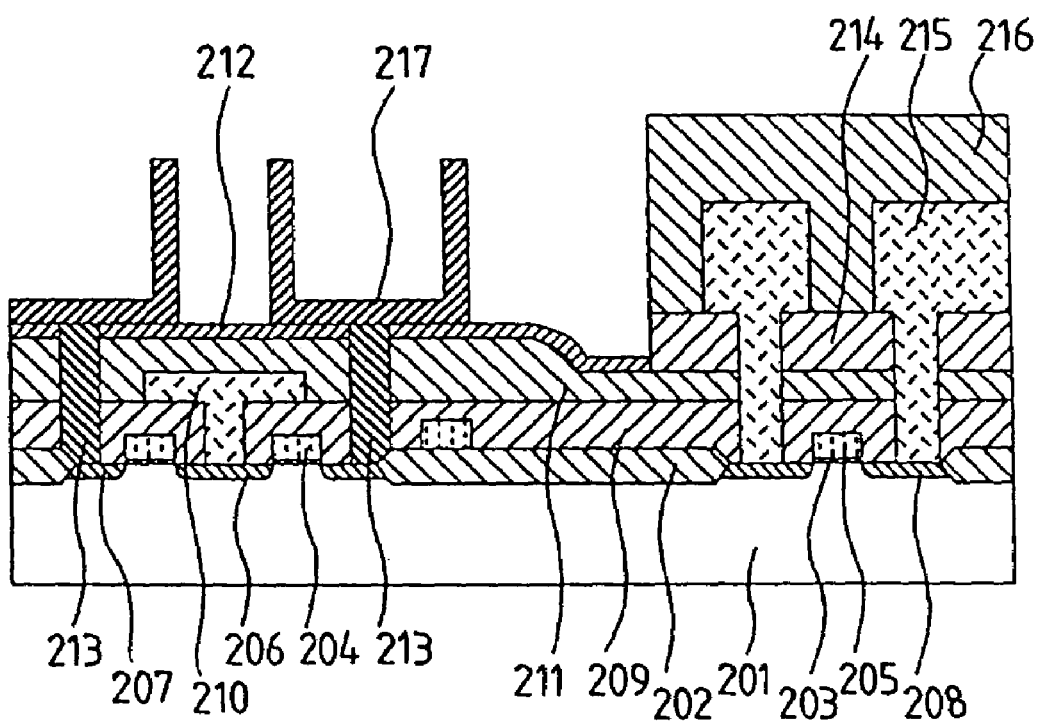
FIG. 85 is a process drawing showing the tenth embodiment according to the present invention.

After the photoresist film 229 is removed and predetermined cleaning is performed, the silicon oxide film 216 and the silicon oxide film 214 under it are etched using hydrofluoric aqueous solution so as to expose the inner face and the side of the crown-type storage electrode 217 as shown in FIG. 85. At this time, the silicon oxide films 216 and 214 formed in a memory cell array area are etched by photolithography and they formed in the peripheral circuit area are left without being etched. As at least the silicon nitride film 212 is provided under the silicon oxide film 214 in the memory cell array area, a portion under the silicon nitride film is not overetched in the wet etching.

Figure 86:
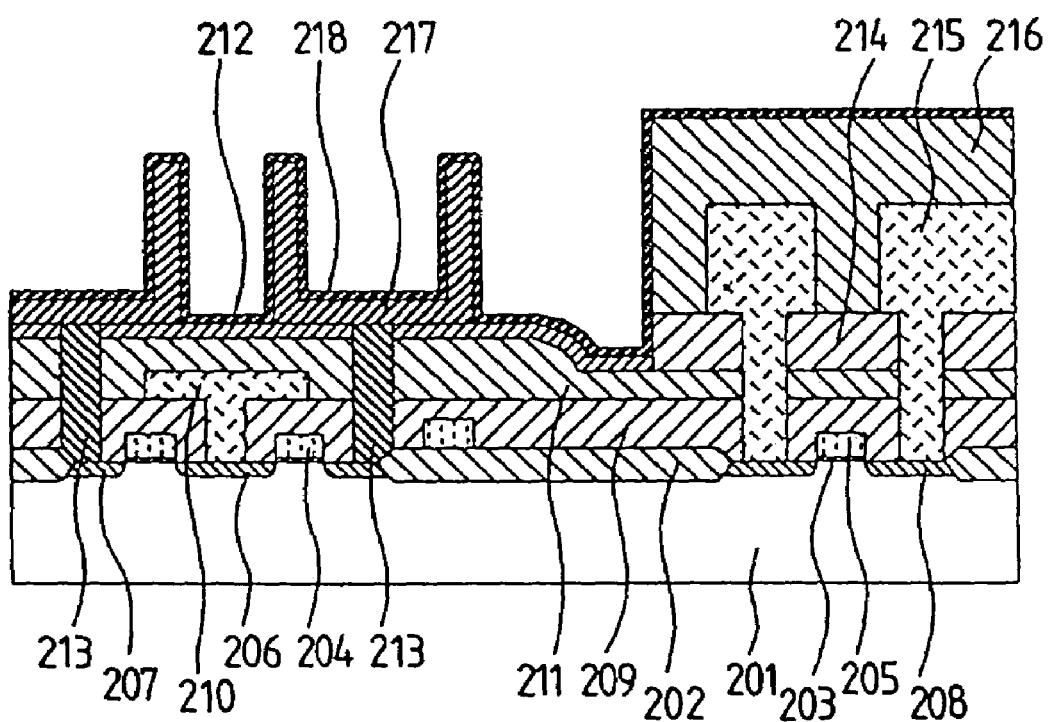
FIG. 86 is a process drawing showing the tenth embodiment according to the present invention.

As shown in FIG. 86, a capacitor dielectric film 218 consisting of a dielectric with a larger dielectric constant such as tantalum pentoxide ($Ta_2O_5$) than that of a silicon oxide film is formed. For a method of forming the capacitor dielectric film 218, CVD which is excellent in covering step height is used. Further, it is desirable that the thickness of the capacitor dielectric film 218 in terms of an silicon oxide film is 3 nm or less in the case of a mass DRAM in the gigabit range. In this embodiment, a polycrystalline silicon film is used for the storage electrode 217, however, a refractory metal film such as tungsten and a titanium nitride film may be used and as the effect of a natural oxide film existing on the surface of the polycrystalline silicon film can be removed in that case, the capacitor dielectric film in terms of a silicon oxide film can be thinned. For material for the capacitor dielectric film, a film with a high dielectric constant such as a SrTaO3 film and a (Ba, Sr) TaO3 film (BST film) and further, a ferroelectric film such as a PZT film may be also used in addition to a compound film consisting of a silicon nitride film and a silicon oxide film.

Figure 87:
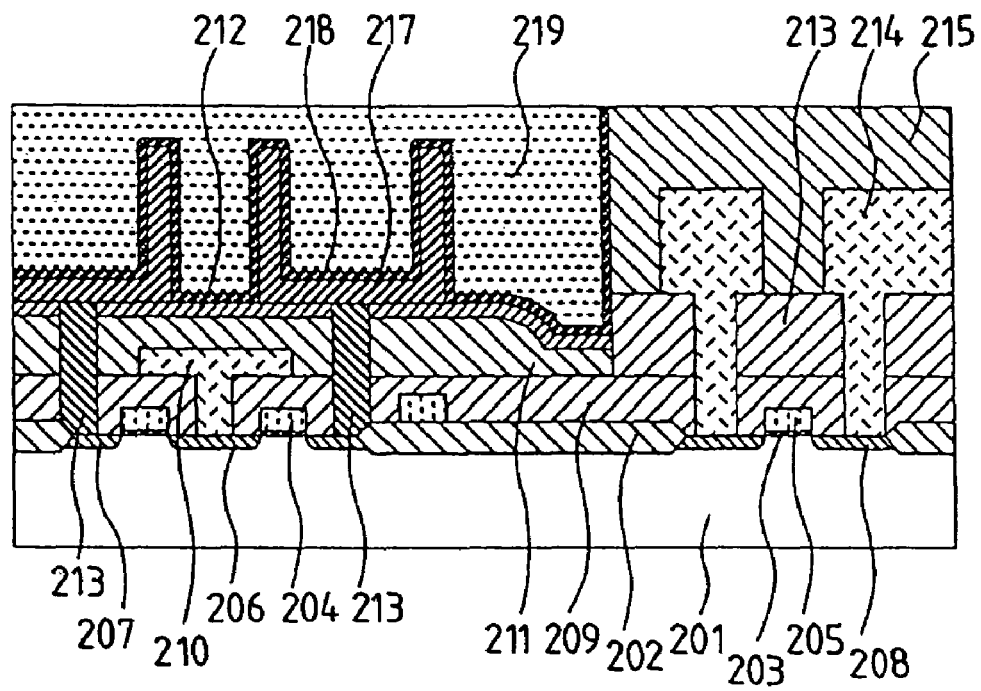
FIG. 87 is a process drawing showing the tenth embodiment according to the present invention.

After a thick tungsten film approximately 300 nm thick is formed overall, the surface is polished by CMP, the tungsten film is left only in an area in which the silicon oxide films 214 and 216 are removed as shown in FIG. 87 so as to form a plate electrode 219. In this embodiment, the plate electrode 219 is formed using CMP, however, after the tungsten film 219 is formed, a photoresist film is also formed and overall dry etchback may be also performed. For a method of forming the plate electrode 219, CVD which is excellent in covering step height is desirable.

Figure 88:
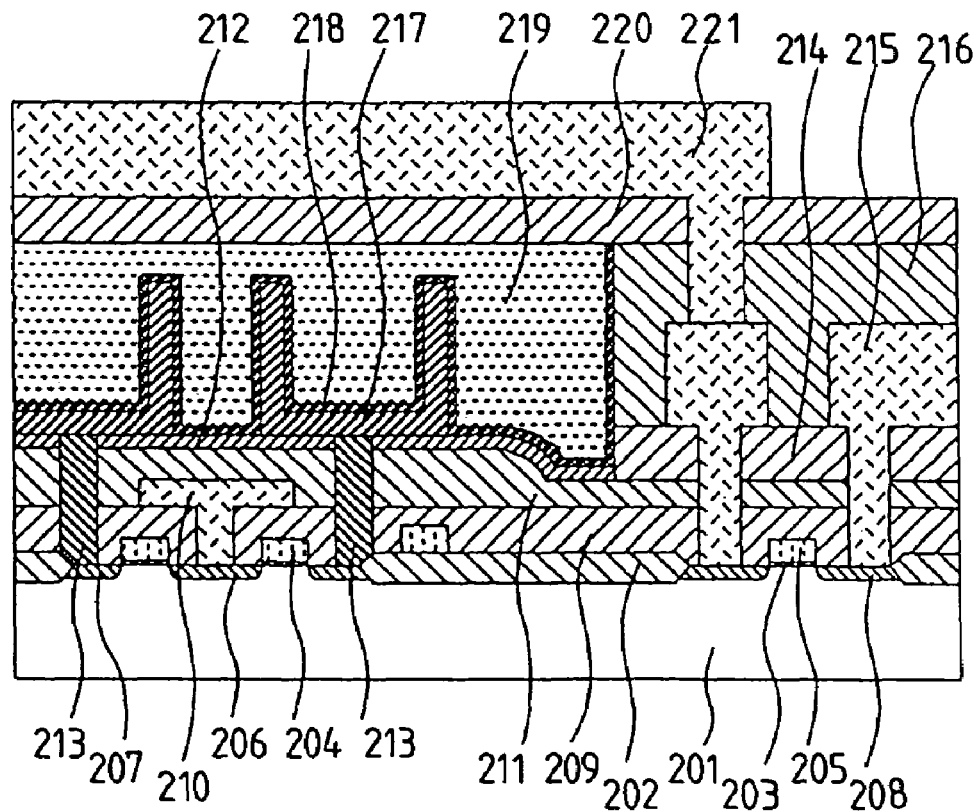
FIG. 88 is a process drawing showing the tenth embodiment according to the present invention.

A silicon oxide film 220 with the thickness of approximately 200 nm is formed as an interlayer dielectric film and after a through hole through the silicon oxide films 216 and 220 on the metal wiring 215 of the peripheral circuit is formed, metal wiring 221 is formed by a well-known method and a semiconductor memory device according to the present invention shown, in FIG. 88 is completed.

As clear owing to the description, for a method of manufacturing a semiconductor memory device equivalent to this embodiment, after an dielectric film provided on the main surface of a semiconductor substrate is flattened, a predetermined portion of the dielectric film in a memory array is selectively removed and the capacitor is formed in the removed portion.

For the metal wiring 221, low-resistance metal such as aluminum is desirable and as low-resistance metal can be used as wiring in the memory array as shown in FIG. 88, it can be used as a signal line connected to the data line and a global word line. To flatten an interlayer dielectric film when the metal wiring 221 is formed, well-known plug technology and CMP may be also applied.

The metal wiring 215 in this embodiment is a first wiring layer of the peripheral circuit, however, the wiring electrode 210 used for the data line of a memory cell may be also used for the first wiring layer of the peripheral circuit area.

Further, the surface area of the storage electrode 217 can be increased and storage capacity can be further increased by making the surface of the polycrystalline silicon film used for the storage electrode 217 in this embodiment uneven.

As the plate electrode 219 is buried in an area in which the silicon oxide films 214 and 216 are removed according to this embodiment, an extra photolithographic process for forming the plate electrode 219 is not required and a DRAM with large storage capacity can be obtained without increasing the number of masks. In this embodiment, the metal wiring 221 is a signal line connected to the source or drain of a MOSFET in the peripheral circuit, however, the metal wiring may be also a power line for supplying fixed potential and may be also floating as a dummy pattern for reducing step height between the memory cell array area and the peripheral circuit area.

ELEVENTH EMBODIMENT

Figure 89:
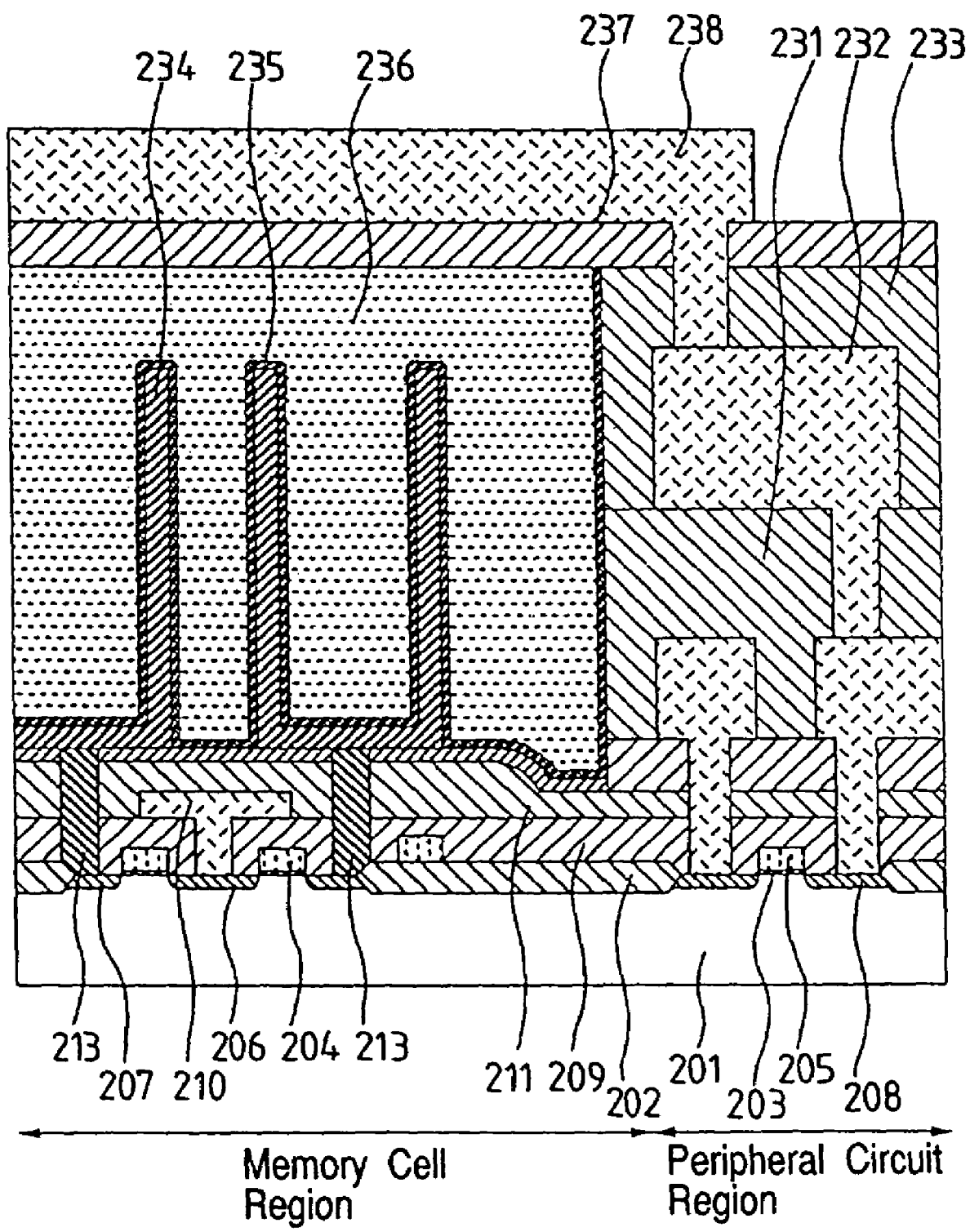
FIG. 89 is a sectional view showing an eleventh embodiment according to the present invention.

This embodiment is an example in which a plurality of wiring layers are formed in a peripheral circuit area in the DRAM described in the tenth embodiment. FIG. 89 is a sectional view showing a MOSFET in a memory cell array and a peripheral circuit area adjacent to it of a DRAM equivalent to this embodiment.

As shown in FIG. 89, a silicon oxide film 231 with the thickness of approximately 0.3 μm is formed on the metal wiring 215 of the peripheral circuit area as an interlayer dielectric film and metal wiring 232 with the thickness of approximately 0.3 μm is formed further on it. This metal wiring 232 is connected to the metal wiring 215 via an opening formed through the silicon oxide film 231. Further, a silicon oxide film 233 with the thickness of approximately 0.3 μm is formed on the metal wiring 232 as an interlayer dielectric film, a silicon oxide film 237 with the thickness of approximately 200 nm is formed on it and metal wiring 238 formed on this silicon oxide film 237 is connected to the metal wiring 232 via an opening through the silicon oxide films 233 and 237. A crown-type capacitor in a memory cell is formed in a deep concave portion formed by removing the silicon oxide films 214, 231 and 233, the height of a crown-shaped storage electrode 234 (neighboring capacitor dielectric film 235) is approximately 1 μm and high, and the plate electrode 236 of the capacitor is buried in the concave portion.

According to this embodiment, the storage capacity of a capacitor for storing charge in the area of a memory cell of 0.15 square micron can be increased up to approximately 50 fF and a dynamic RAM with large SN ratio and high resistance to a soft error which is excellent in the stability of operation can be obtained. However, it need scarcely be said that according to this embodiment, the number of wiring layers can be further increased, the crown-type storage electrode 234 can be further heightened and storage capacity can be further increased.

TWELFTH EMBODIMENT

Figure 90:
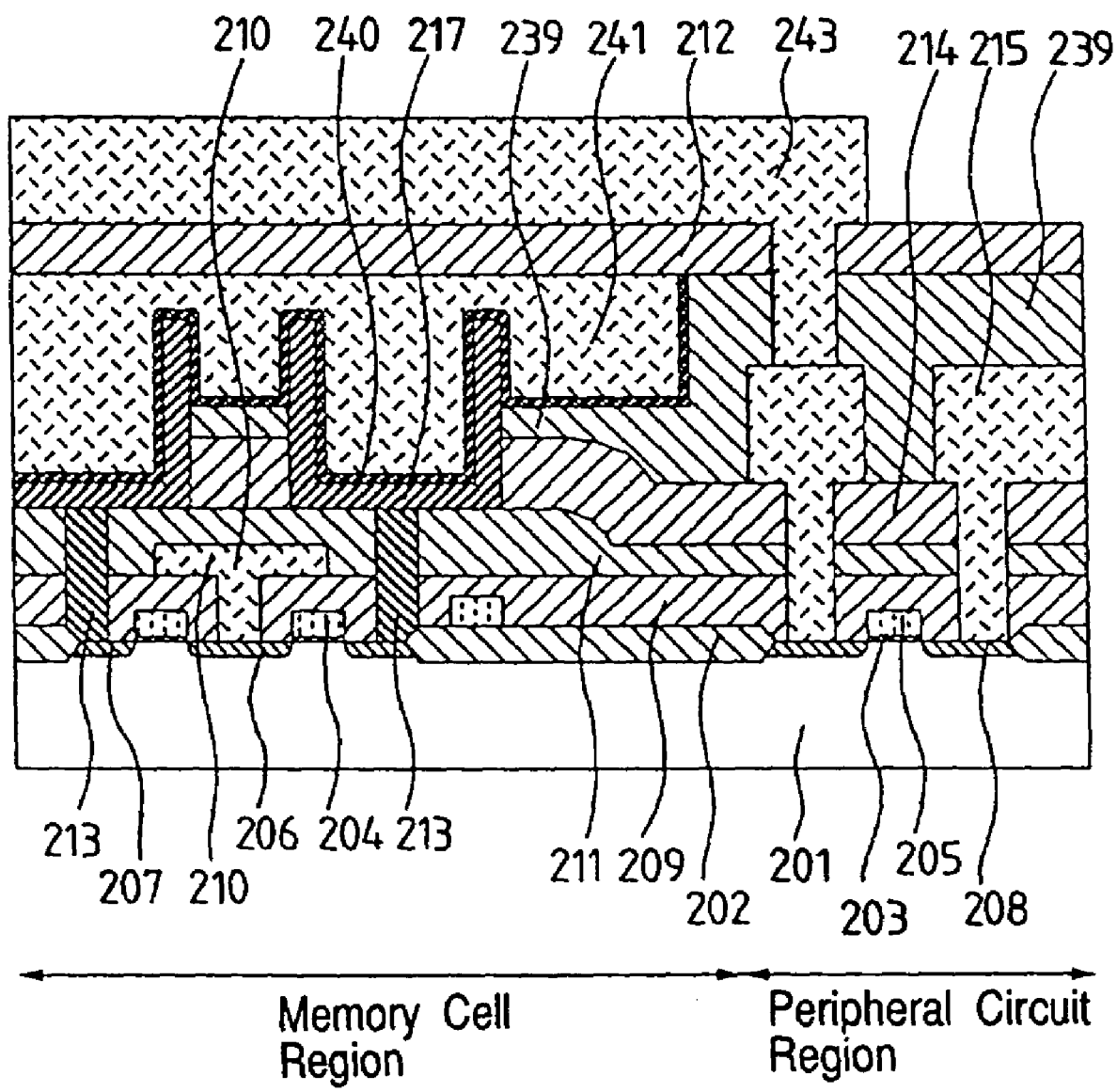
FIG. 90 is a sectional view showing a twelfth embodiment according to the present invention.
Figure 91:
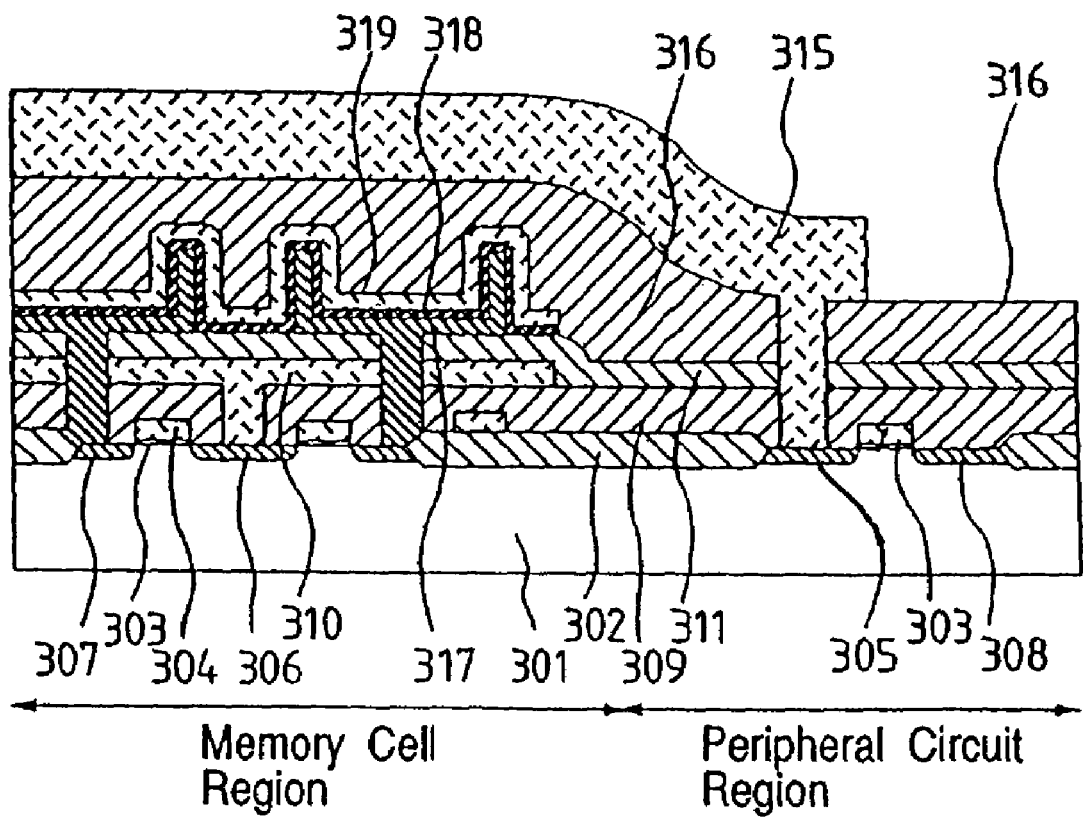
FIG. 91 is a sectional view showing a conventional semiconductor memory device.

FIG. 90 is a sectional view showing a DRAM equivalent to this embodiment. As shown in FIG. 90, the plate electrode 241 (neighboring capacitor dielectric film 240) of a crown-type capacitor covers any inner side and a part (the upper part) of the outer side of a storage electrode 217. A method of manufacturing a DRAM equivalent to this embodiment is characterized in that when silicon oxide films 214 and 216 in a memory cell array area are removed in the process shown in FIG. 85 in relation to the tenth embodiment, etching a silicon oxide film 219 (239 in FIG. 90) is stopped halfway and as shown in FIG. 90, a thinned silicon oxide film 239 is left outside the storage electrode 217. The other points of the manufacturing method are the same as in the tenth embodiment.

As an etching stopper film is not required when a silicon oxide film is etched to form a concave portion according to this embodiment, the silicon nitride film 212 shown in FIG. 76 in relation to the tenth embodiment under the silicon oxide film 214 is not required.

THIRTEENTH EMBODIMENT

FIG. 92 is a sectional view showing a DRAM equivalent to this embodiment. As the plate electrode 219 of a crown-type capacitor is extended onto a silicon oxide film 216 in this embodiment, it can be connected to wiring for supplying potential to the plate electrode 219 on the silicon oxide film 216. The plate electrode 219 is formed by patterning by photolithography and dry etching, however, any edge of a pattern at this time is positioned on the silicon oxide film 216. Any part of the plate electrode 219 is not required to be buried in the concave portion, a silicon oxide film 220 used for an interlayer dielectric film is buried in the concave portion in which the capacitor is formed and the surface is flattened.

According to this embodiment, the plate electrode 219 and wiring for supplying power can be connected in an arbitrary position, the degree of freedom of design can be increased and the area of a chip can be reduced.

In the-described embodiments, a film with a larger dielectric constant than that of silicon oxide is used for an interlayer dielectric film between metal wirings, however, a film with a smaller dielectric constant than that of a silicon oxide film may be also used. In the embodiments, the case provided with a crown-type and a trench-type capacitors is described, however, this embodiment can be also applied to a capacitor with stereoscopic structure such as a thick film capacitor in which a storage electrode is thickened and a capacitor dielectric film and a plate electrode are formed on the storage electrode and its side wall.

The embodiments are examples in which the present invention is applied to a DRAM, however, the present invention can be also applied to a static RAM provided with a capacitor in a memory cell, a static RAM in which a polycrystalline thin film transistor (TFT) is used for the load element of a memory cell and further, a memory using a ferroelectric substance for a capacitor dielectric film. The present invention can be also applied to a capacitor with large capacitance used for a switched capacitor, a path condenser and a regulator generally used in digital and analog circuits.

Further, the wiring layer of a logical circuit can be also formed in the position of an dielectric film on which a capacitor is formed by applying the present invention to an on-chip LSI wherein a memory and a logical circuit exist together. Further, according to the present invention, low-resistance metallic material such as copper can be used for the wiring layer of peripheral circuit formed in the position of a capacitor and a semiconductor memory device wherein high-speed operation is enabled can be obtained.

According to the present invention, any storage capacity can be also realized in principle by changing the depth of a trench. In addition, as the plane area of a portion in which a trench is formed can be increased differently from a conventional trench capacitor cell wherein a trench is formed on a substrate, the aspect ratio of the trench is not required to be increased and not only trench but a capacitor can be readily formed.

Further, as the storage electrode of a capacitor can be electrically connected to the diffused region of a MOS transistor via a plug for interconnection formed under the capacitor, one of the most serious problems of the conventional trench capacitor cell can be solved. As the aspect ratio of a trench is not large, an dielectric film except a silicon oxide film and a silicon nitride film can be also used for a capacitor dielectric film.

As a wiring layer is provided under a capacitor, the number of wirings which should be pulled up to the uppermost layer is reduced greatly, as a result, the design rule of wiring pulled up is extremely rough and the design rule of approximately 0.5 µm which is the rule of a 16-megabit memory can correspond to that of a memory in the gigabit range sufficiently.

Further, as an interlayer oxide film can be readily flattened, a minute pattern can be readily formed by lithography.

When a trench is deepened, the aspect ratio is increased, however, as a trench is formed over a substrate according to the present invention, the area of an area in which a trench is formed can be by far increased, compared with a conventional trench capacitor cell wherein a trench is formed on a substrate and the aspect ratio of the trench is by far smaller than that of a conventional one. The storage electrode of a capacitor can be automatically in contact with a diffused region electrically via a plug consisting of polycrystalline silicon and hereby, the serious problem of the conventional trench capacitor cell is solved.

As an dielectric film except a silicon oxide film and a silicon nitride film can be used for a capacitor dielectric film, a dielectric with a high dielectric constant can be used for a capacitor dielectric film and a trench capacitor with small aspect ratio though its capacity is large can be realized.

If a trench is formed over a substrate, distance required to pull up wiring to the uppermost layer is increased, however, according to the present invention, a wiring layer is provided under a capacitor and the number of wirings which are required to be pulled up to the uppermost layer is greatly reduced. As a result, the design rule of wiring pulled up is extremely rough and the dimension of approximately 0.5 µm which is the rule of a 16-megabit memory may be applied to a memory in the gigabit range. Therefore, wiring can be manufactured extremely readily.

Further, as the surface of each interlayer film can be readily flattened, a minute pattern can be readily formed by lithography and the present invention is extremely profitable to form a minute pattern the focal tolerance of which is small.

Further, step height between a memory cell array area and a peripheral circuit area is greatly reduced and as minute wiring can be formed in each area and a portion including both areas, a semiconductor integrated circuit the degree of integration of which is high with high resistance to a soft error and high reliability can be formed.

As there is no large step height between a memory cell area and a peripheral circuit area, minute wiring can be readily formed in each area and minute wiring connecting both areas can be readily formed.

Industrial Applicability

As above described, the present invention is suitable for DRAM's having very high integration density.

What is claimed is:
1. A semiconductor device, comprising:
a semiconductor substrate;
a plurality of dielectric films stacked on a main surface of the semiconductor substrate as stacked dielectric films, at least one of the plurality of dielectric films being a silicon nitride film;
a memory cell area in which a field-effect transistor provided with a diffusion region and a conductive type of which is reverse to that of the semiconductor substrate, a gate electrode, a gate insulating film, and a capacitor are formed; and a peripheral circuit area and a first wiring formed in the peripheral circuit area, wherein:
the capacitor is formed in the memory cell area, in a concave portion of a trench which is bored into more than two dielectric films of the plurality of dielectric films including the silicon nitride film, wherein the capacitor includes a first electrode, a capacitor dielectric film, and a second electrode, wherein the first electrode is formed in a crown shape and a bottom portion of the first electrode lies at a bottom of the trench, and wherein the capacitor dielectric film is formed on an inner surface of the first electrode, on an upper portion of an outer surface of the first electrode, and includes a portion formed on a portion of an upper surface of the silicon nitride film abutting the capacitor;

a plurality of second wirings located over the stacked dielectric films in the peripheral circuit area, and one of the second wirings is connected to the first wiring by a plurality of plugs, which plugs are connected by stacking thereof; and an upper face of the stacked dielectric films is extended from the peripheral circuit area to the memory cell area, and at least a portion of a thickness of the stacked dielectric films is in contact with a side face of the capacitor, wherein the upper surface of the stacked dielectric films extended from the memory cell area to peripheral circuit area is flat, and, wherein an upper surface of the silicon nitride film is located higher than an upper surface of the bottom portion of the first electrode.

2. A semiconductor memory device according to claim 1, wherein:

some of the stacked dielectric films are provided between the capacitor and the semiconductor substrate;

a first wiring layer located on one of the stacked dielectric films is separated from the capacitor; and a second wiring layer located on one of the stacked dielectric films is formed over the capacitor.

3. A semiconductor memory device according to claim 1, wherein the first wiring layer is selected from one of a polycrystalline silicon film containing high-concentration impurities; a stacked film of a polycrystalline silicon film and a silicide film; a stacked film of a tungsten film, a barrier metal film and a polycrystalline silicon film; and a stacked film of a tungsten film and a barrier metal film; a tungsten film; and a copper film.

4. A semiconductor memory device according to claim 1, wherein the capacitor dielectric film is selected from one of a stacked film of an oxide film and a nitride film; a stacked film of an oxide film and a tantalum pentoxide film; a stacked film of a nitride film and a tantalum pentoxide film; and a stacked film of an oxide film, a nitride film, and a tantalum pentoxide film; a BST film; and a PZT film.

5. A semiconductor memory device according to claim 1, wherein the second electrode is comprised of a polycrystalline silicon film containing high-concentration impurities or a refractory metal film.

6. A semiconductor memory device according to claim 1, wherein the first electrode is electrically connected to the diffusion region of the field effect transistor formed in the memory cell area, via a conductor formed through some of the stacked dielectric films provided between the capacitor and the semiconductor substrate.

7. A semiconductor memory device according to claim 2, wherein the first wiring layer is electrically connected to the second wiring layer, via a conductor formed through some of the stacked dielectric films.

8. A semiconductor memory device according to claim 1, wherein an upper face of one of the stacked dielectric films is extended into the memory cell area and is in contact with a side or bottom of the capacitor, and the upper face is in contact with a lower face of a wiring layer formed in the peripheral circuit area.

9. A semiconductor memory device according to claim 1, wherein:

the first electrode of the capacitor is provided in the concave portion; and the capacitor dielectric film and the second electrode are extended outside from the inner face of the first electrode.

10. A semiconductor memory device according to claim 1, wherein:

the first electrode of the capacitor is formed on an inner face of the concave portion and protruded upward from the inner face of the concave portion; and the capacitor dielectric film and the second electrode are extended outside a protruded portion of the first electrode from the inside of the first electrode.

11. A semiconductor memory device according to claim 2, wherein the second wiring layer is formed over the capacitor, via some of the stacked dielectric films.

* * * * *